(12) United States Patent
Yin et al.

(10) Patent No.: US 12,199,612 B2
(45) Date of Patent: Jan. 14, 2025

(54) FLIP-FLOP WITH TRANSISTORS HAVING DIFFERENT THRESHOLD VOLTAGES, SEMICONDUCTOR DEVICE INCLUDING SAME AND METHODS OF MANUFACTURING SAME

(71) Applicants: TAIWAN SEMICONDUCTOR MANUFACTURING COMPANY, LTD., Hsinchu (TW); TSMC NANJING COMPANY, LIMITED, Nanjing (CN)

(72) Inventors: Xing Chao Yin, Hsinchu (TW); Huaixin Xian, Hsinchu (TW); Hui-Zhong Zhuang, Hsinchu (TW); Yung-Chen Chien, Hsinchu (TW); Jerry Chang Jui Kao, Hsinchu (TW); Xiangdong Chen, Hsinchu (TW)

(73) Assignees: TAIWAN SEMICONDUCTOR MANUFACTURING COMPANY, LTD, Hsinchu (TW); TSMC NANJING COMPANY, LIMITED, Nanjing (CN)

( * ) Notice: Subject to any disclaimer, the term of this patent is extended or adjusted under 35 U.S.C. 154(b) by 0 days.

(21) Appl. No.: 17/858,844

(22) Filed: Jul. 6, 2022

(65) Prior Publication Data
US 2023/0421141 A1   Dec. 28, 2023

(30) Foreign Application Priority Data

Jun. 28, 2022   (CN) ........................ 202210744921.3

(51) Int. Cl.
*H03K 3/037*   (2006.01)
*H01L 21/8238*   (2006.01)
(Continued)

(52) U.S. Cl.
CPC ..... *H03K 3/037* (2013.01); *H01L 21/823807* (2013.01); *H01L 21/823814* (2013.01);
(Continued)

(58) Field of Classification Search
CPC .. H03K 3/037; H03K 17/6871; H03K 3/0372; H03K 3/02332; H03K 3/289;
(Continued)

(56) References Cited

U.S. PATENT DOCUMENTS

| | | | |
|---|---|---|---|
| 6,418,067 | B1 | 7/2002 | Watanabe et al. |
| 9,859,876 | B1 * | 1/2018 | Agarwal ............ H03K 3/35625 |
| 2022/0108989 | A1 | 4/2022 | Kang et al. |

FOREIGN PATENT DOCUMENTS

| | | |
|---|---|---|
| KR | 20220046035 | 4/2022 |
| WO | 9900846 | 1/1999 |

* cited by examiner

*Primary Examiner* — Jung Kim
(74) *Attorney, Agent, or Firm* — Hauptman Ham, LLP

(57) ABSTRACT

A semiconductor device includes: a cell region including active regions where components of transistors are formed; the cell region are arranged to function as a D flip-flop that includes a primary latch (having a first sleepy inverter and a first non-sleepy (NS) inverter), a secondary latch (having a second sleepy inverter and a second NS inverter), and a clock buffer (having third and fourth NS inverters). The transistors are grouped: a first group has a standard threshold voltage (Vt_std); a second group has a low threshold voltage (Vt_low); and an optional third group has a high threshold voltage (Vt_high). The transistors which comprise the first or second NS inverter have Vt_low. Alternatively, the transistors of the cell region are further arranged to function as a scan-insertion type of D flip-flop (SDFQ) that further includes a multiplexer; and the transistors of the multiplexer have Vt_low.

20 Claims, 41 Drawing Sheets

(51) Int. Cl.
*H01L 27/092* (2006.01)
*H03K 17/687* (2006.01)

(52) U.S. Cl.
CPC ............ *H01L 21/823828* (2013.01); *H01L 21/823871* (2013.01); *H01L 27/0924* (2013.01); *H03K 17/6871* (2013.01)

(58) Field of Classification Search
CPC .......... H03K 3/3562; H01L 21/823807; H01L 21/823814; H01L 21/823828; H01L 21/823871; H01L 27/0924
See application file for complete search history.

Table 2

| Row | FIG. | Scan Buffer 244, 344 | Clk Buff's NS inverter 248(5), 348(5) | Clk Buff's NS inverter 248(6), 348(6) | MUX 232, 332 | 1st Latch's NS Inverter 248(1), 348(1) | 1st Latch's Sleepy Inverter 250(1), 350(1) | Internal Buffer 241, 341 | 2nd Latch's NS Inverter 248(2), 348(2) | 2nd Latch's Sleepy Inverter 250(2), 350(2) | Output Buffer 242, 342 | Ratio: Vt_low vs. total | Ratio: Vt_std vs. total | Ratio: Vt_high vs. total |
|---|---|---|---|---|---|---|---|---|---|---|---|---|---|---|
| 1 | 2A, 3A(1) | Vt_std | Vt_low | Vt_low | Vt_std | Vt_std | Vt_std | Vt_std | Vt_std | Vt_std | Vt_std | 12.50% | 87.50% | 0.00% |
| 2 | 3B(1) | Vt_std | Vt_low | Vt_low | Vt_low | Vt_std | Vt_std | Vt_std | Vt_std | Vt_std | Vt_std | 43.75% | 56.25% | 0.00% |
| 3 | 3C | Vt_std | Vt_low | Vt_low | Vt_std | Vt_std | Vt_high | Vt_std | Vt_std | Vt_high | Vt_std | 12.50% | 62.50% | 25.00% |
| 4 | 3D(1) | Vt_std | Vt_low | Vt_low | Vt_low | Vt_std | Vt_high | Vt_std | Vt_std | Vt_high | Vt_std | 43.75% | 31.25% | 25.00% |
| 5 | 3E(1) | Vt_std | Vt_low | Vt_std | Vt_std | Vt_std | Vt_std | Vt_std | Vt_std | Vt_std | Vt_low | 12.50% | 87.50% | 0.00% |
| 6 | 3F(1) | Vt_std | Vt_low | Vt_std | Vt_low | Vt_std | Vt_std | Vt_std | Vt_std | Vt_std | Vt_low | 43.75% | 56.25% | 0.00% |
| 7 | 3G | Vt_std | Vt_low | Vt_std | Vt_std | Vt_std | Vt_high | Vt_std | Vt_std | Vt_high | Vt_low | 12.50% | 62.50% | 25.00% |
| 8 | 3H(1) | Vt_std | Vt_low | Vt_std | Vt_low | Vt_std | Vt_high | Vt_std | Vt_std | Vt_high | Vt_low | 43.75% | 31.25% | 25.00% |
| 9 | 3I(1) | Vt_std | Vt_std | Vt_low | Vt_std | Vt_std | Vt_std | Vt_std | Vt_std | Vt_std | Vt_low | 12.50% | 87.50% | 0.00% |
| 10 | 3J | Vt_std | Vt_std | Vt_low | Vt_low | Vt_std | Vt_std | Vt_std | Vt_std | Vt_std | Vt_low | 43.75% | 56.25% | 0.00% |
| 11 | 3K | Vt_std | Vt_std | Vt_low | Vt_std | Vt_std | Vt_high | Vt_std | Vt_std | Vt_high | Vt_low | 12.50% | 62.50% | 25.00% |
| 12 | 3L(1) | Vt_std | Vt_std | Vt_low | Vt_low | Vt_std | Vt_high | Vt_std | Vt_std | Vt_high | Vt_low | 43.75% | 31.25% | 25.00% |

Fig. 2F

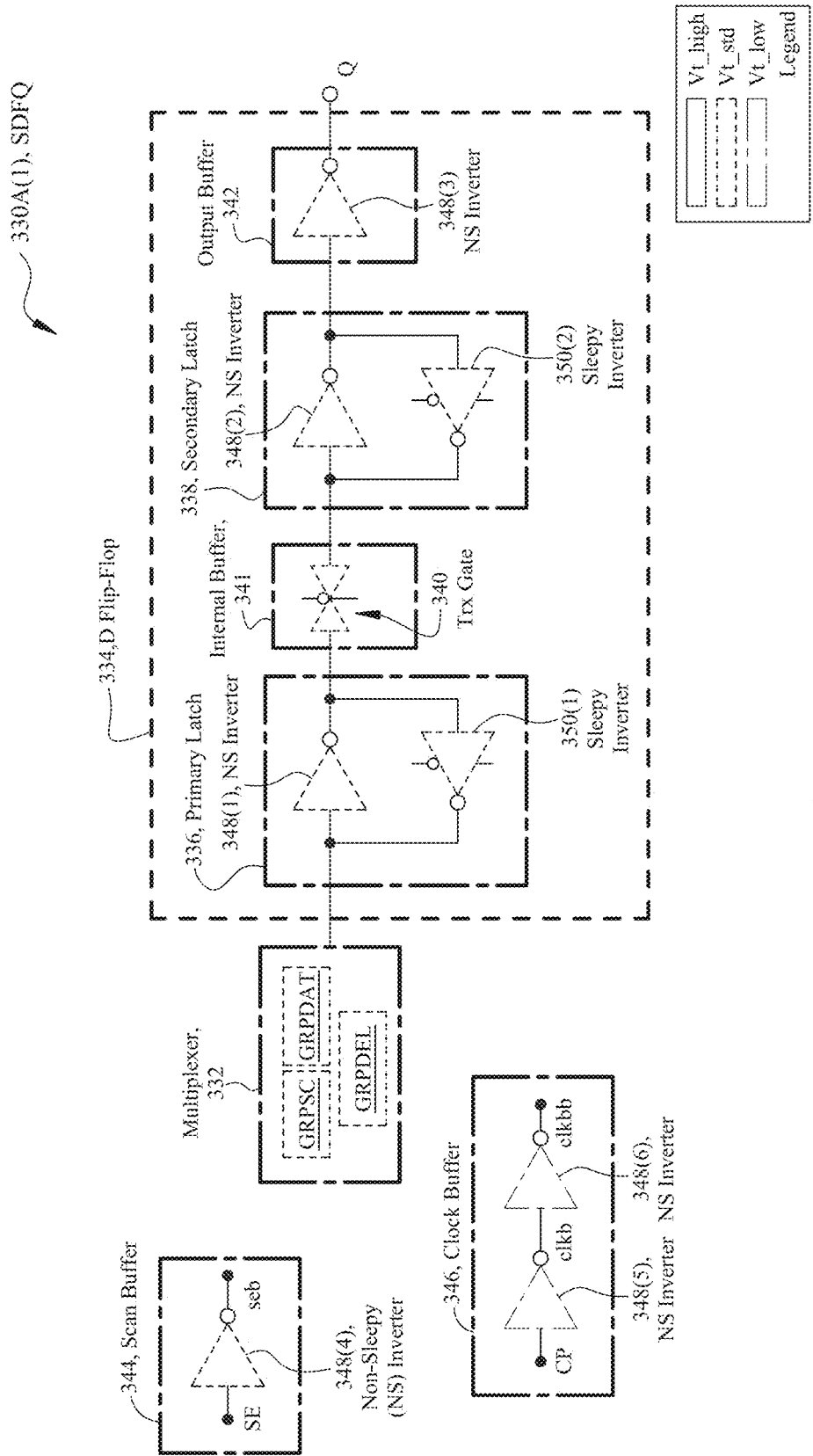
Fig. 3A(1)

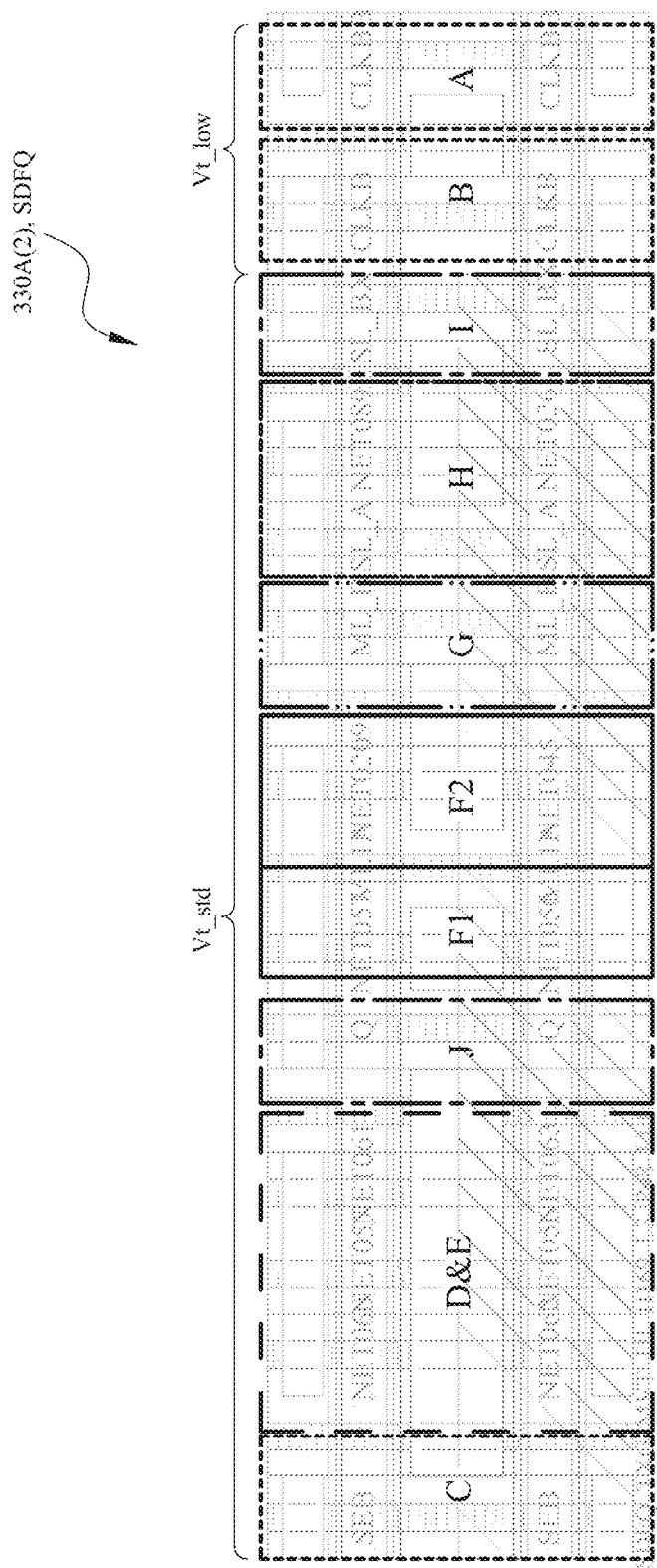
Fig. 3A(2)

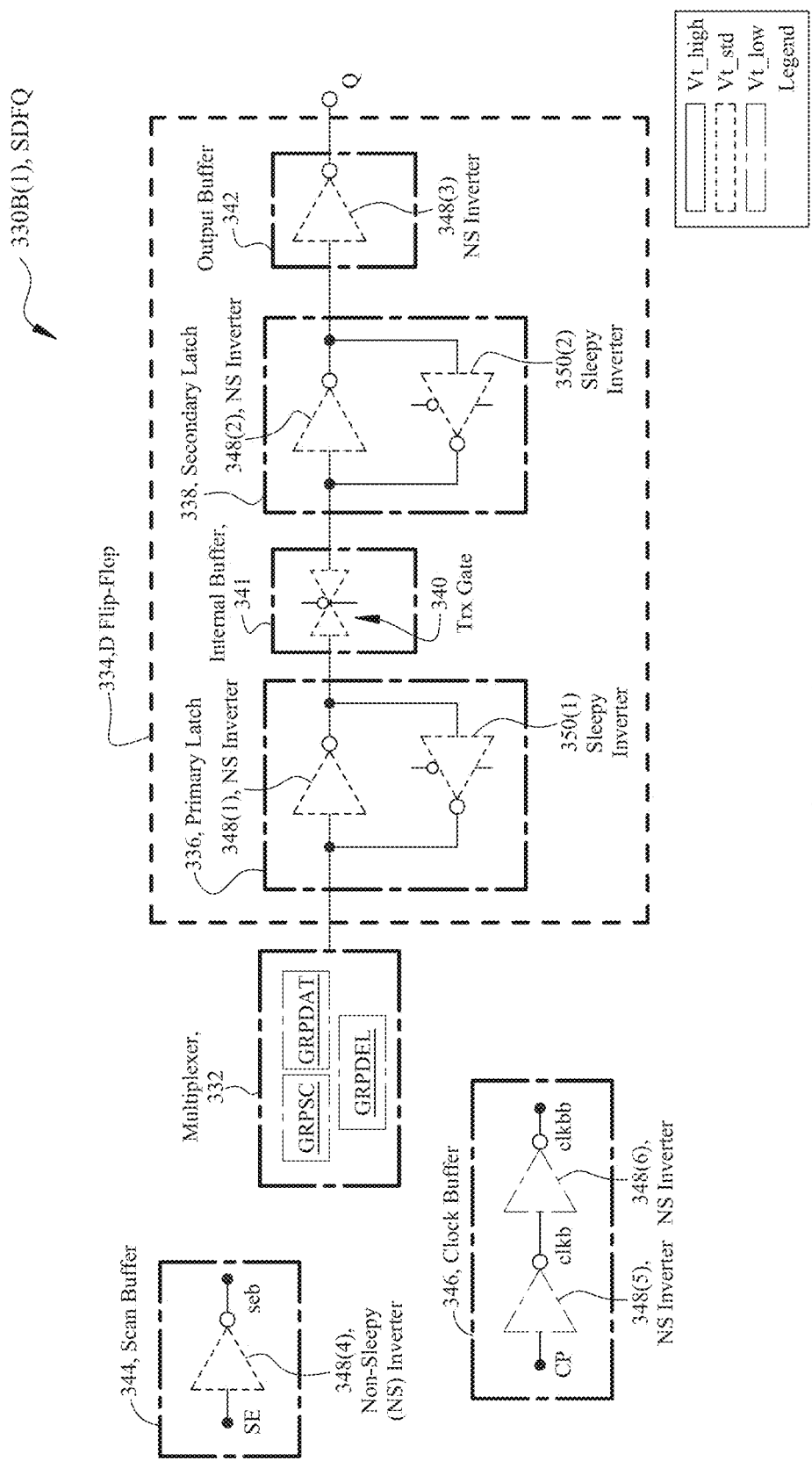
Fig. 3B(1)

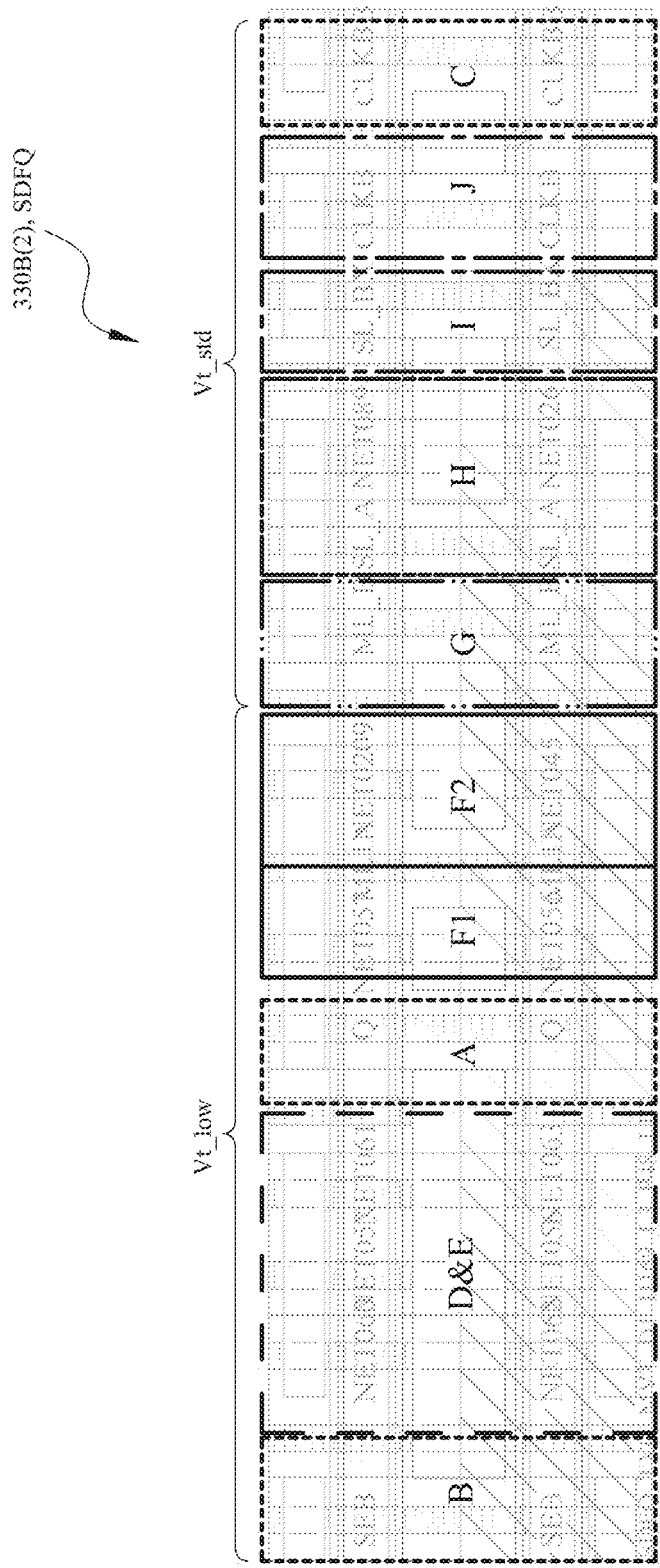
Fig. 3B(2)

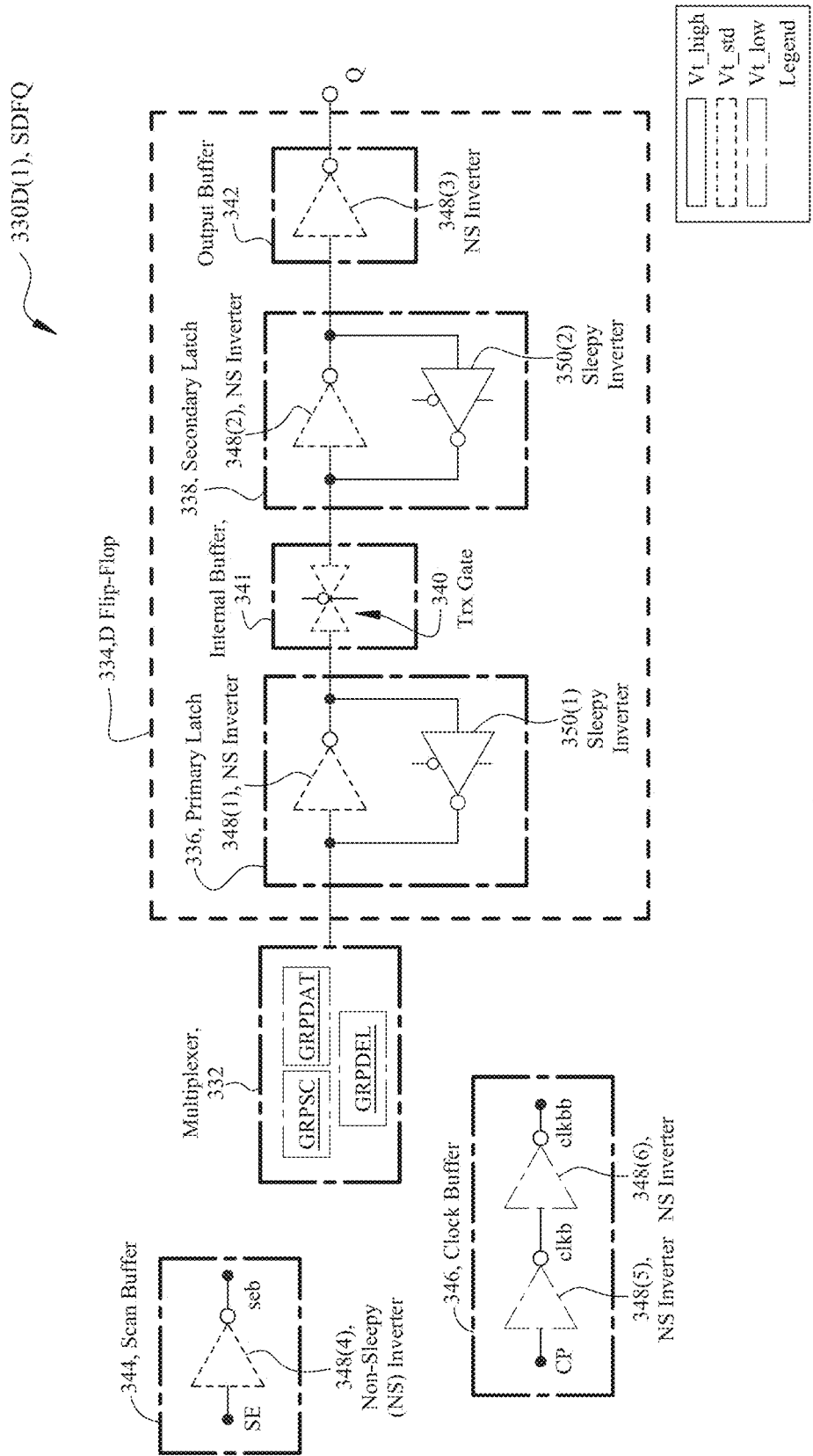
Fig. 3D(1)

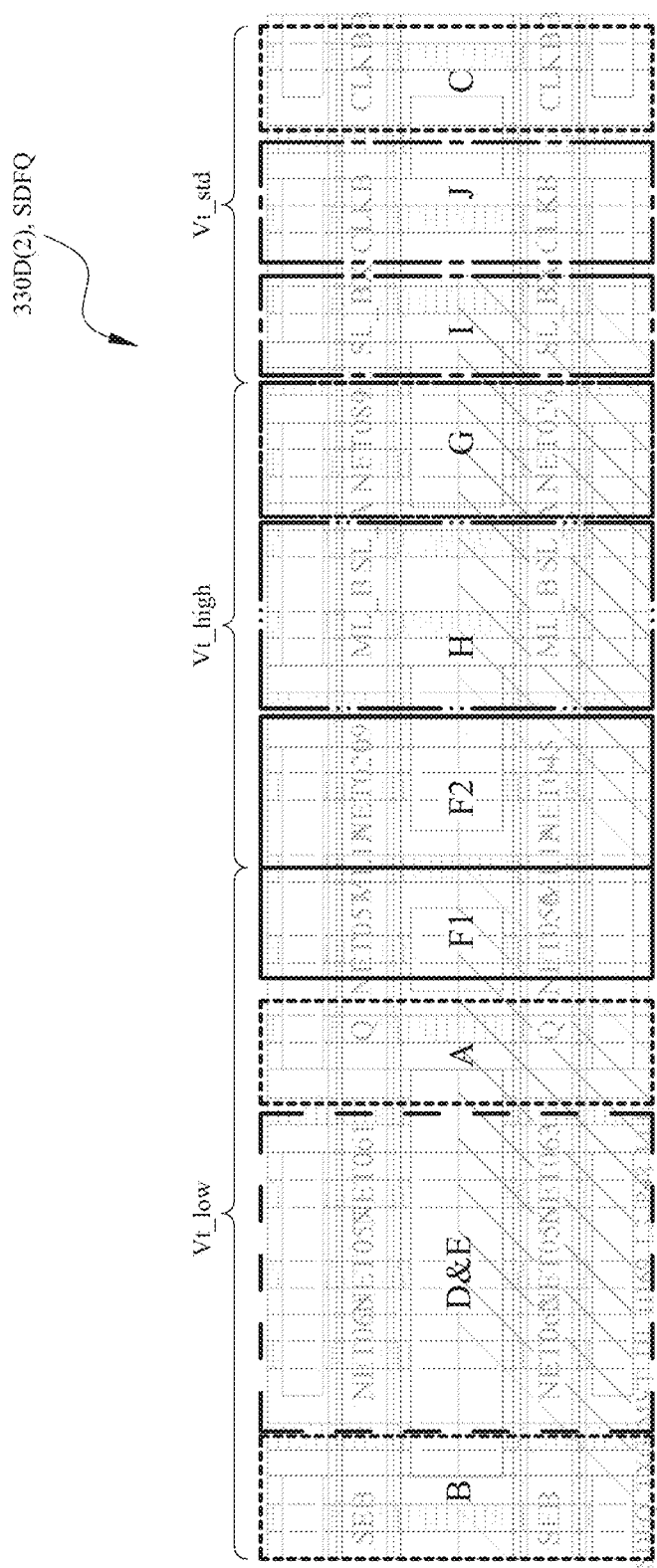
Fig. 3D(2)

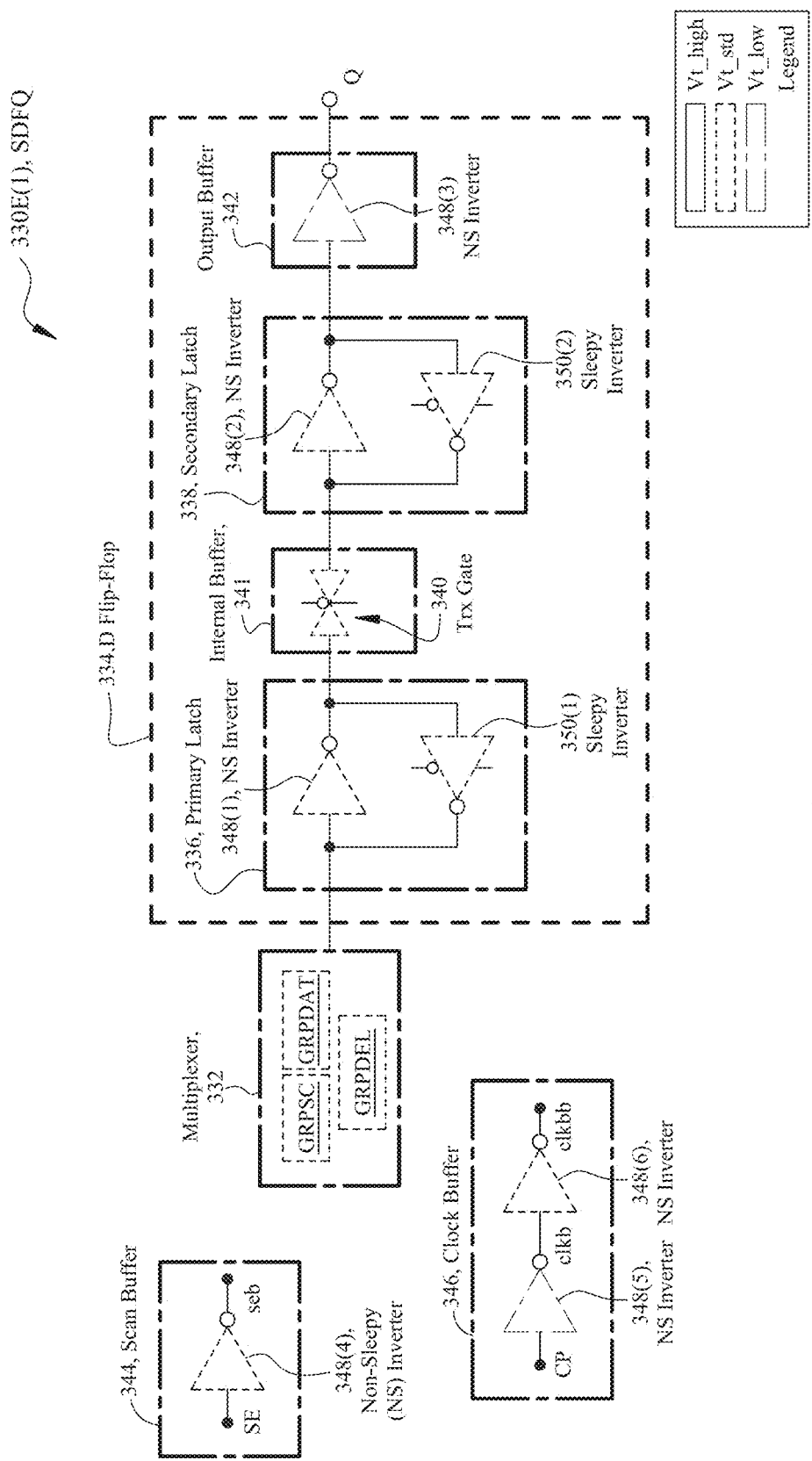
Fig. 3E(1)

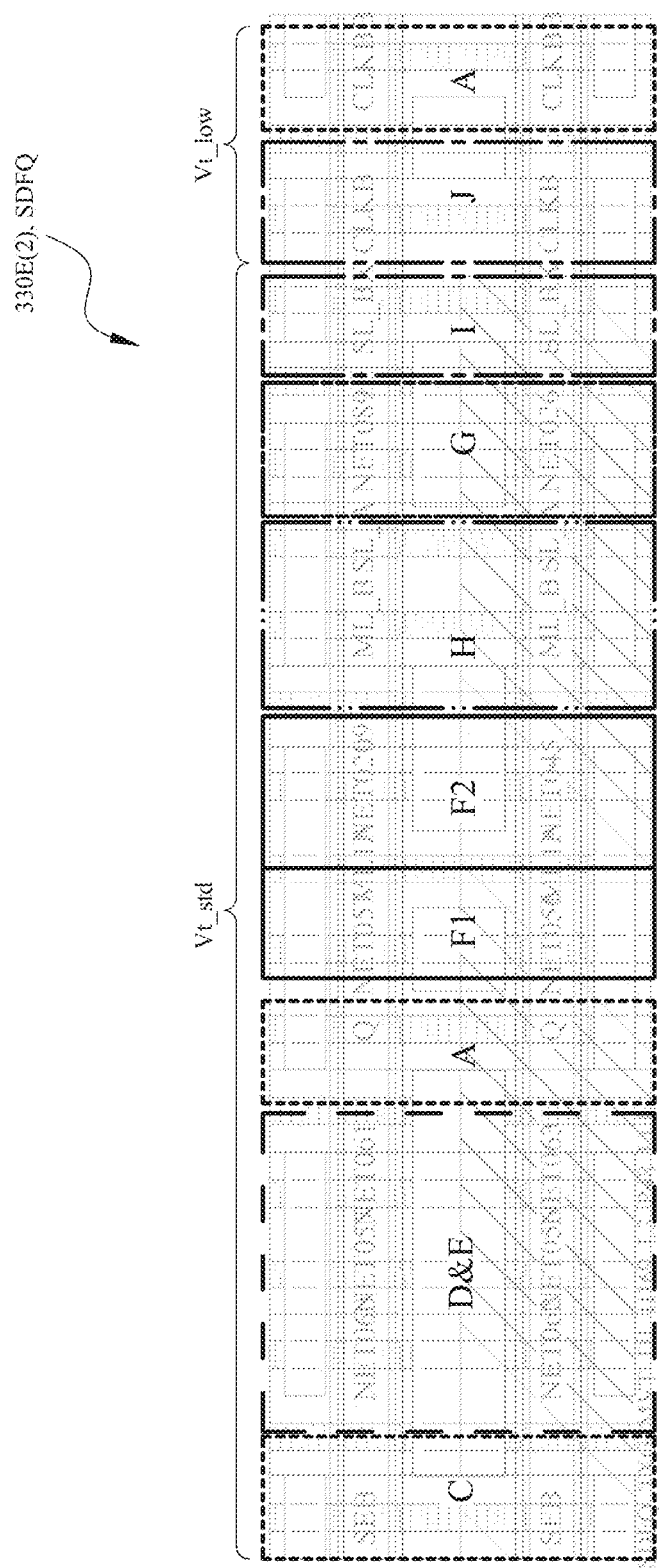
Fig. 3E(2)

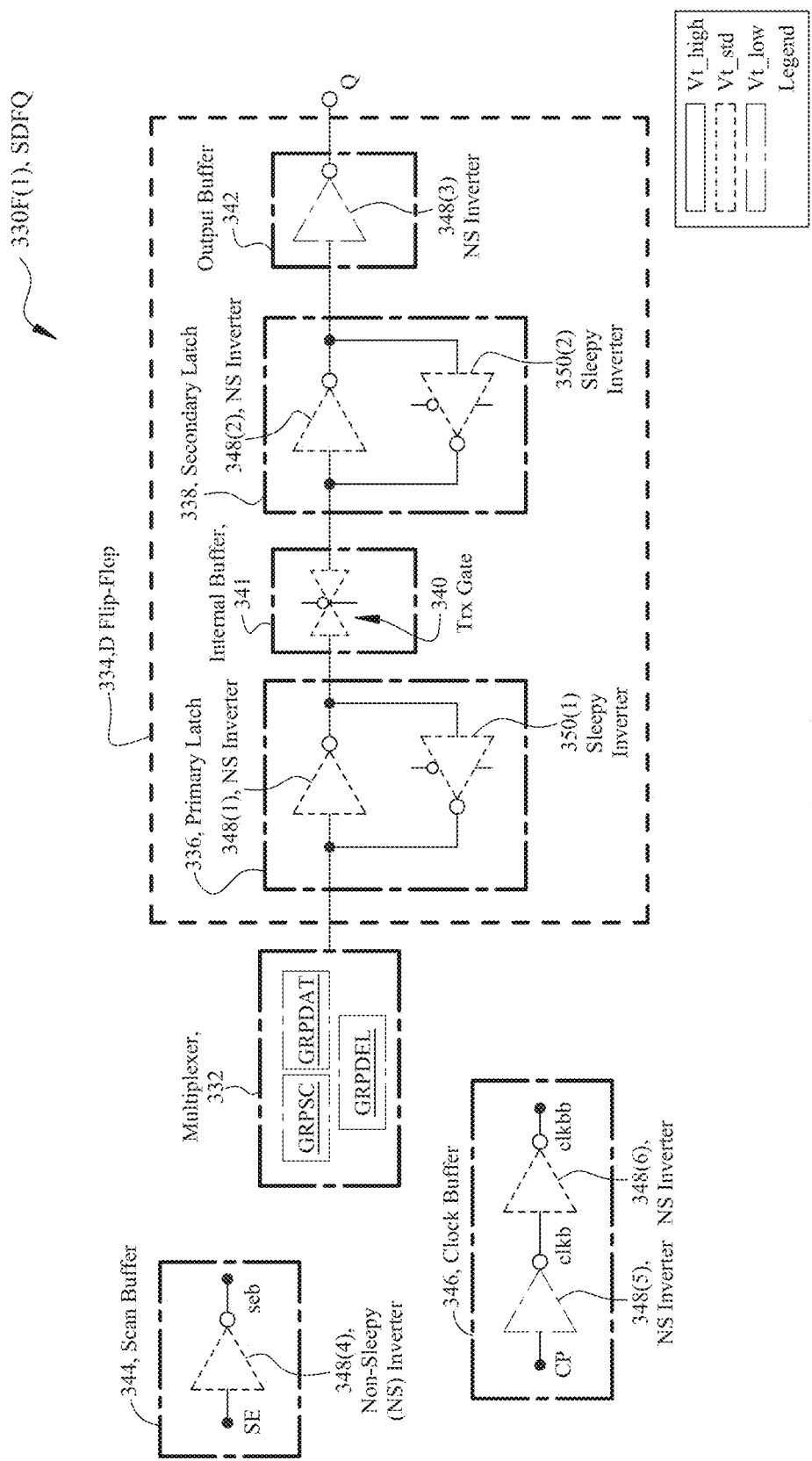
Fig. 3F(1)

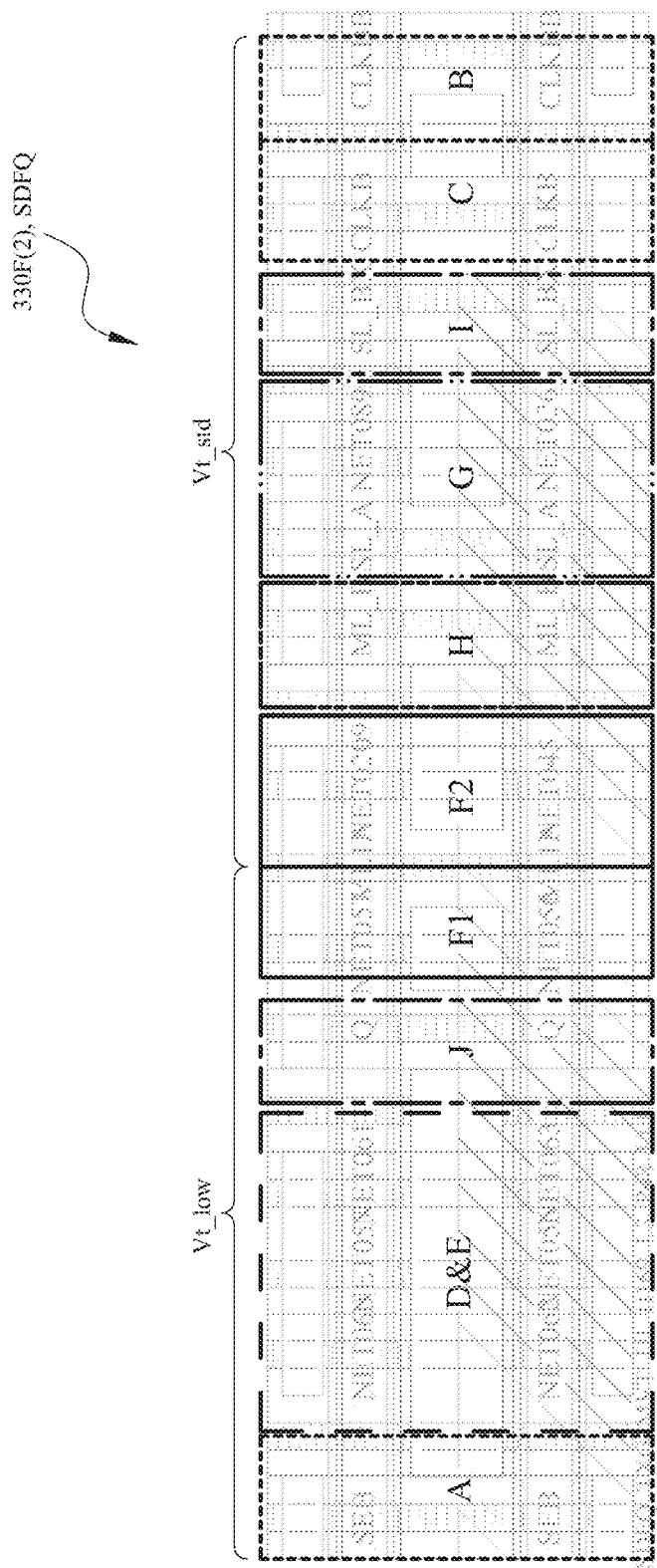
Fig. 3F(2)

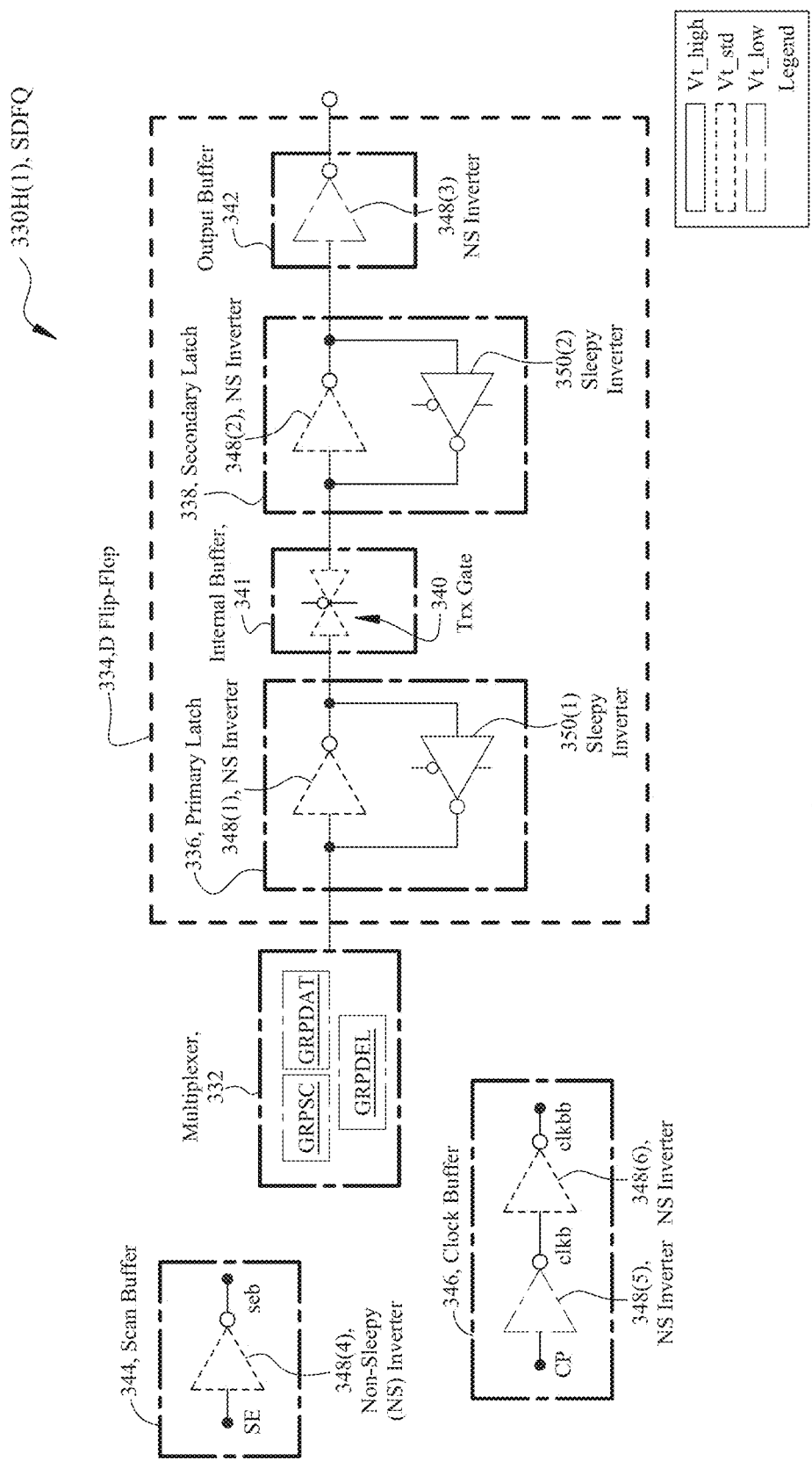
Fig. 3H(1)

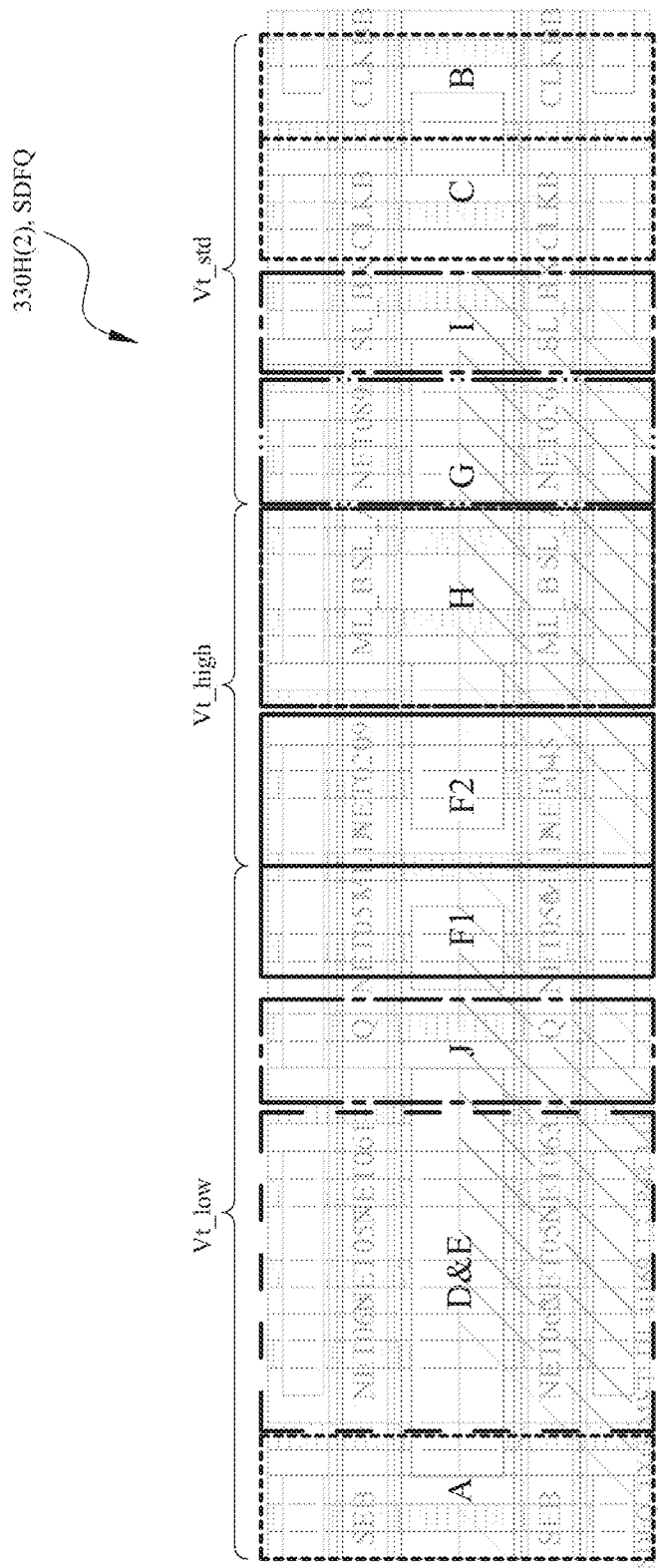
Fig. 3H(2)

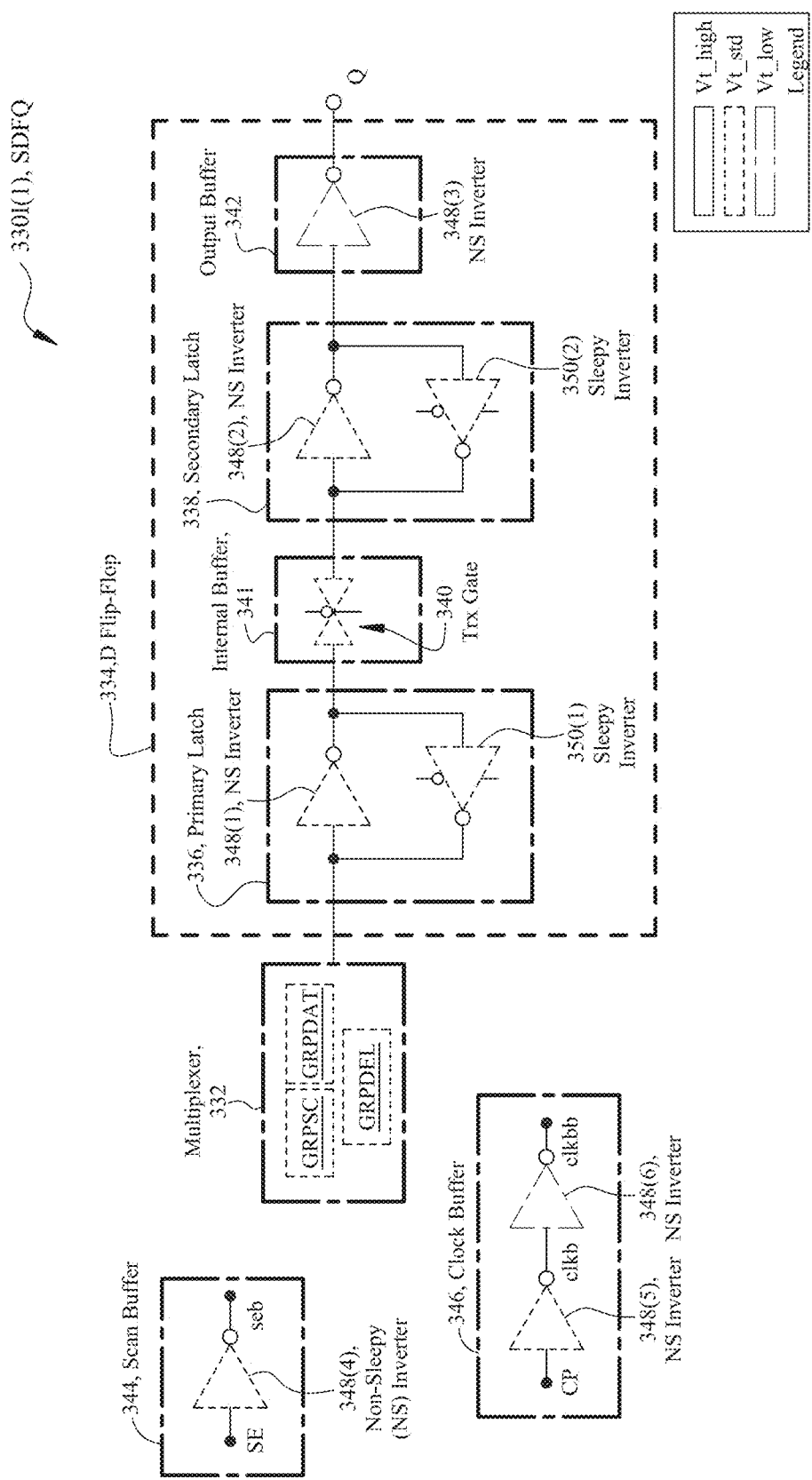
Fig. 3I(1)

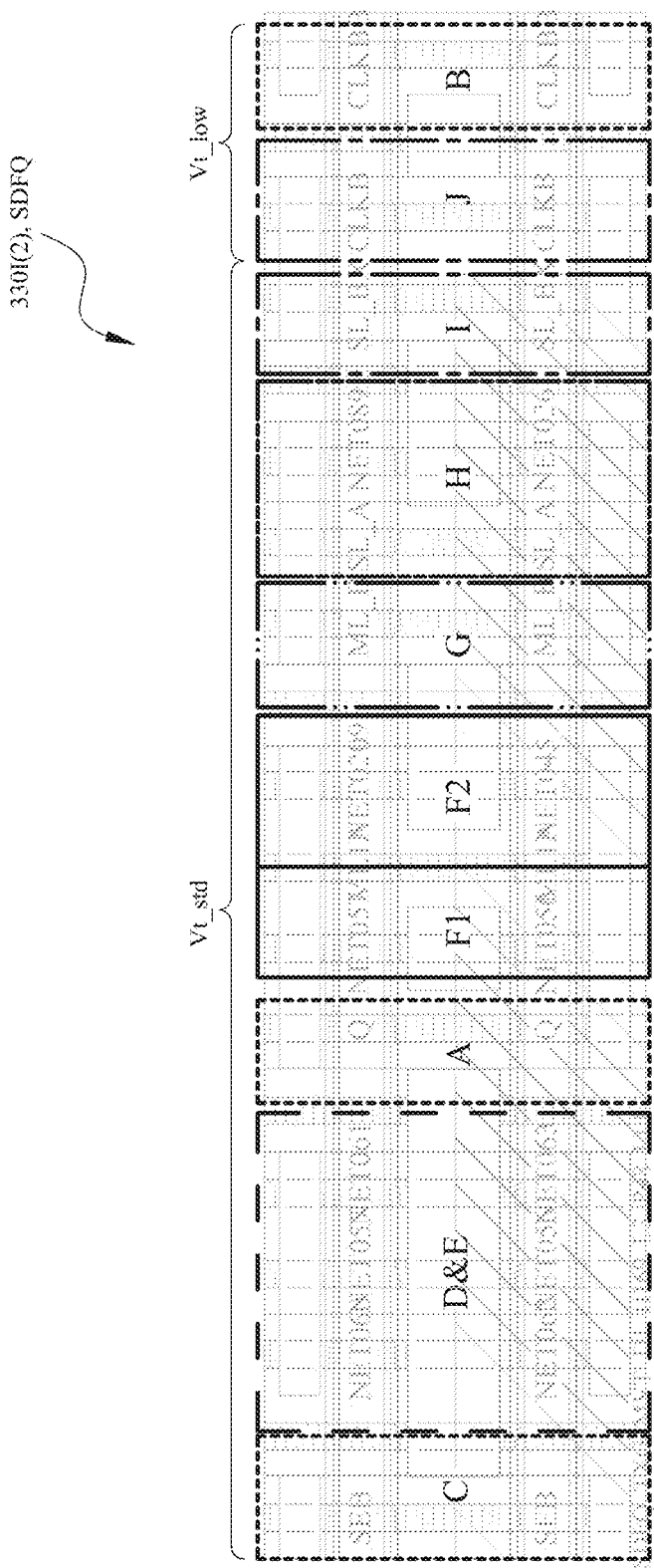
Fig. 3I(2)

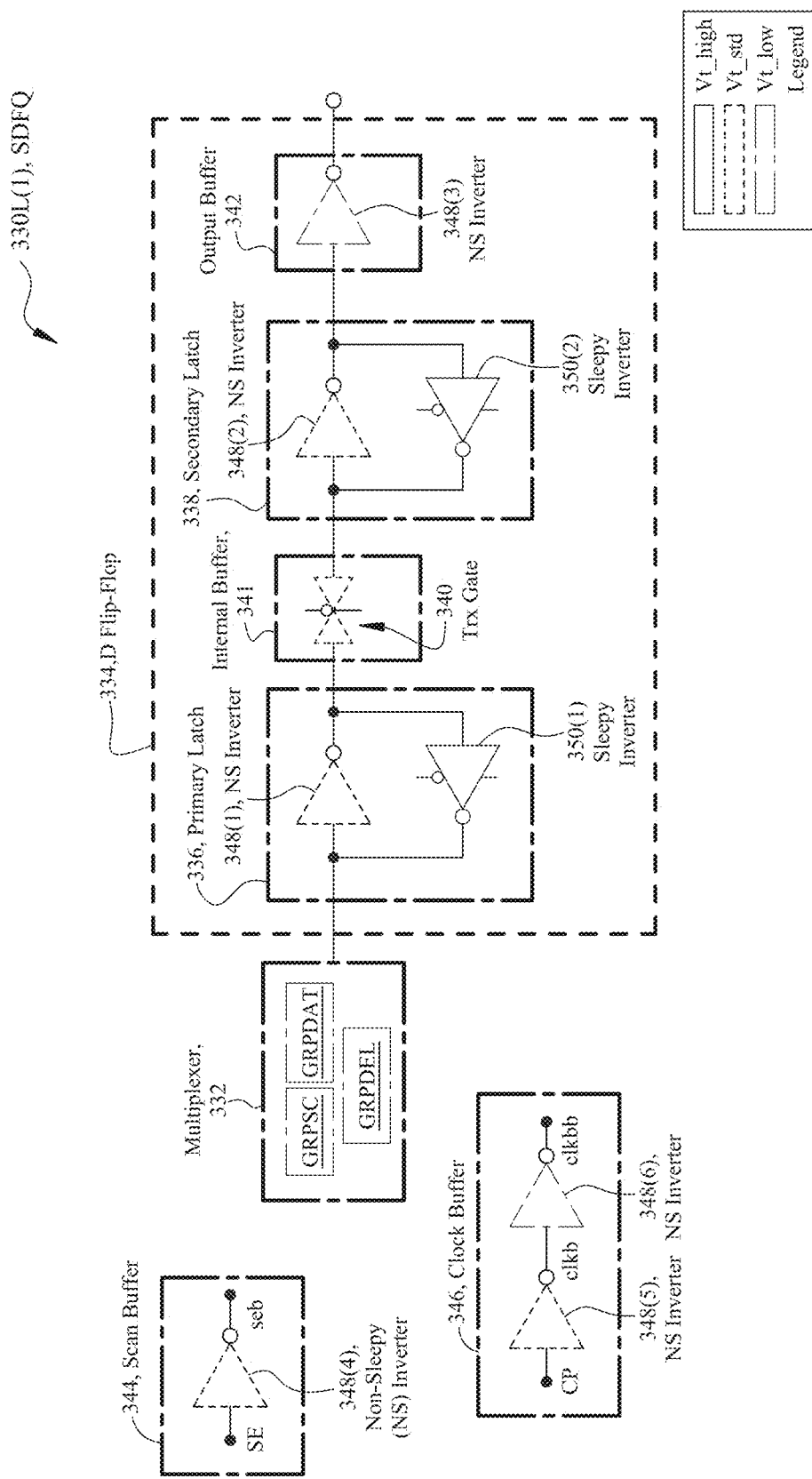
Fig. 3L(1)

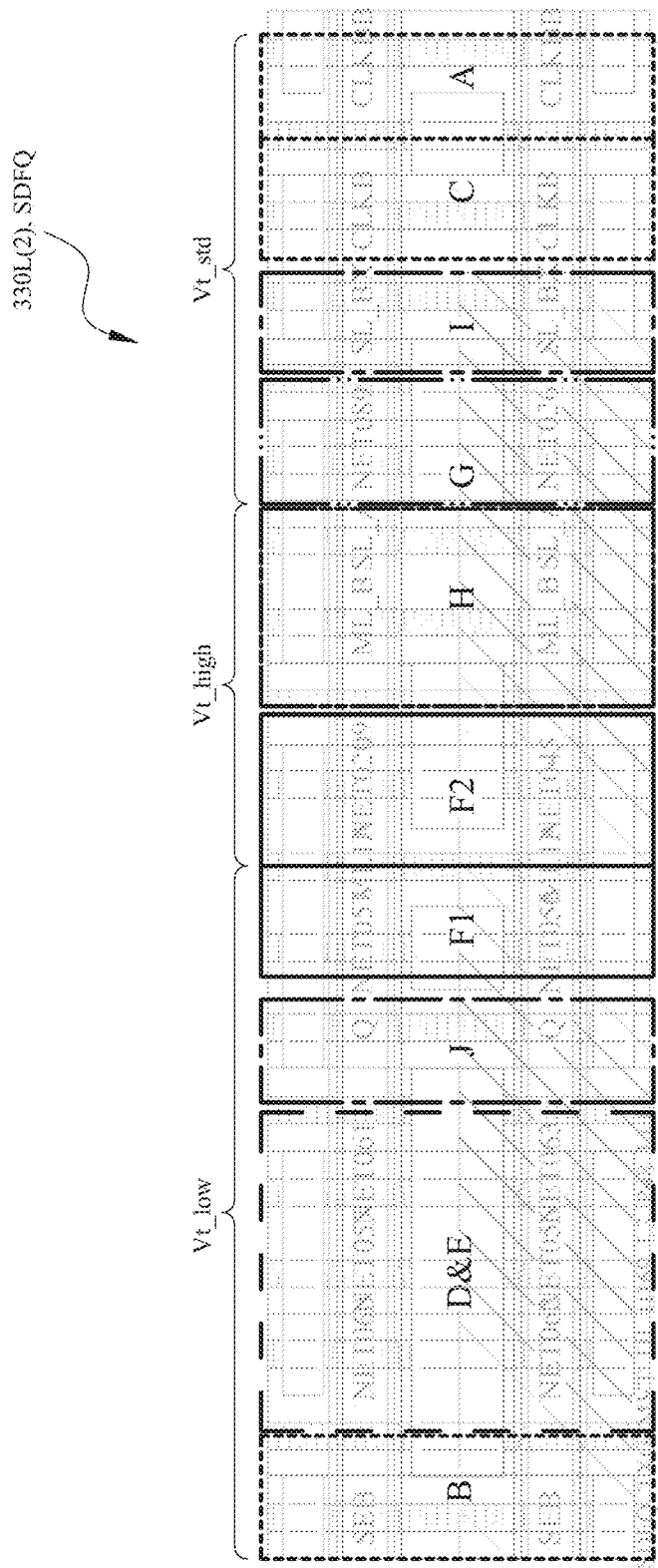
Fig. 3L(2)

| Row | FIG. | Scan Buffer 444 | Clk Buff's NS inverter 448(5) | Clk Buff's NS inverter 448(6) | MUX 432 | 1st Latch's NS Inverter 448(1) | 1st Latch's Sleepy Inverter 450(1) | Internal Buffer 441 | 2nd Latch's NS Inverter 448(2) | 2nd Latch's Sleepy Inverter 450(2) | Output Buffer 442 | Ratio: Vt_low vs. total | Ratio: Vt_std vs. total | Ratio: Vt_high vs. total |
|---|---|---|---|---|---|---|---|---|---|---|---|---|---|---|
| 1 | 4C | Vt_std | Vt_low | Vt_low | Vt_std | Vt_std | Vt_std | Vt_std | Vt_std | Vt_std | Vt_low | 14.29% | 85.71% | 0.00% |
| 2 | 4D(1) | Vt_std | Vt_low | Vt_low | Vt_low | Vt_std | Vt_std | Vt_std | Vt_std | Vt_std | Vt_low | 50.00% | 50.00% | 0.00% |
| 3 | 4E | Vt_std | Vt_low | Vt_low | Vt_std | Vt_std | Vt_high | Vt_std | Vt_std | Vt_high | Vt_low | 14.29% | 57.14% | 28.57% |
| 4 | 4F | Vt_std | Vt_low | Vt_low | Vt_low | Vt_std | Vt_high | Vt_std | Vt_std | Vt_high | Vt_low | 50.00% | 21.43% | 28.57% |

Table 4

Fig. 4B

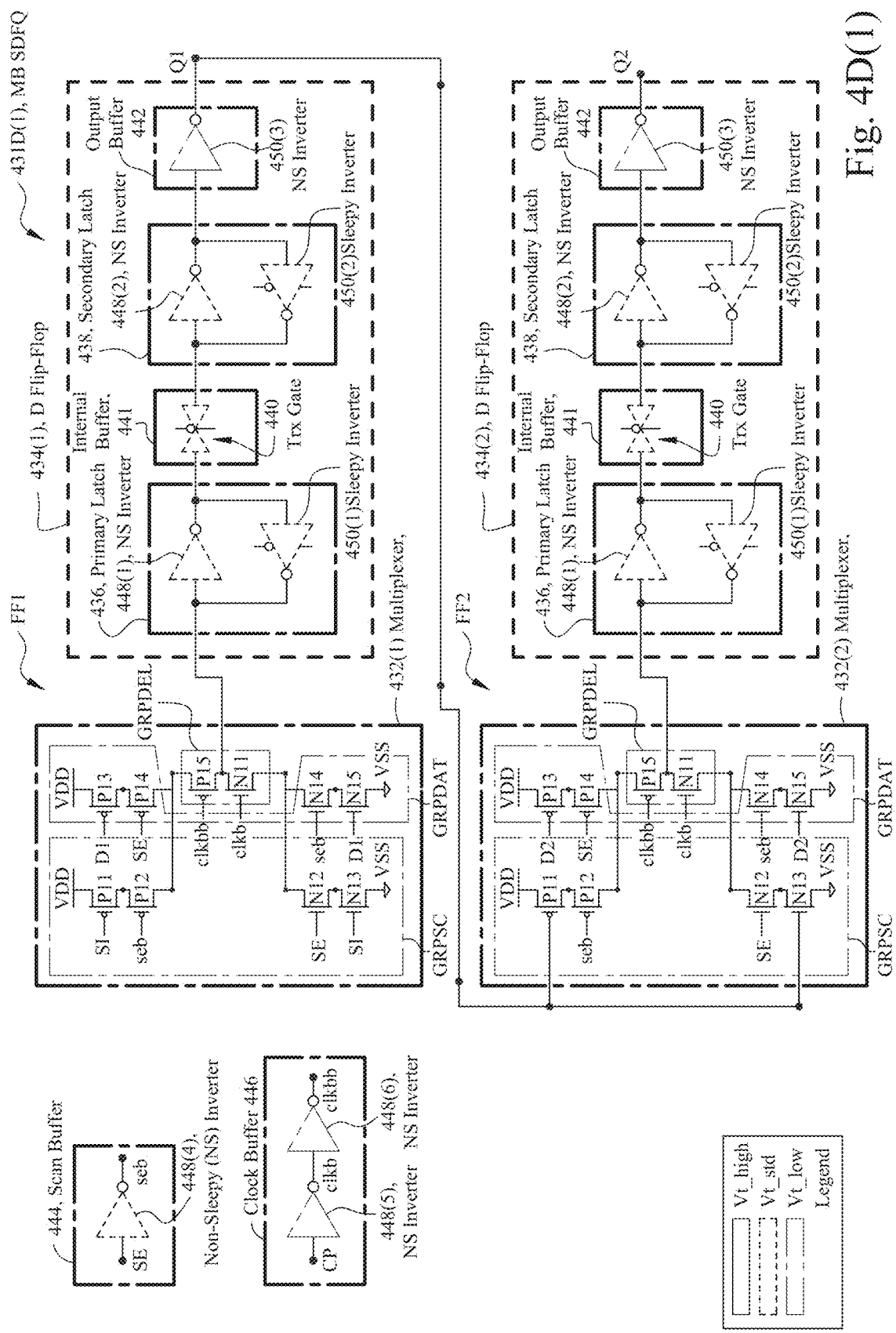
Fig. 4D(1)

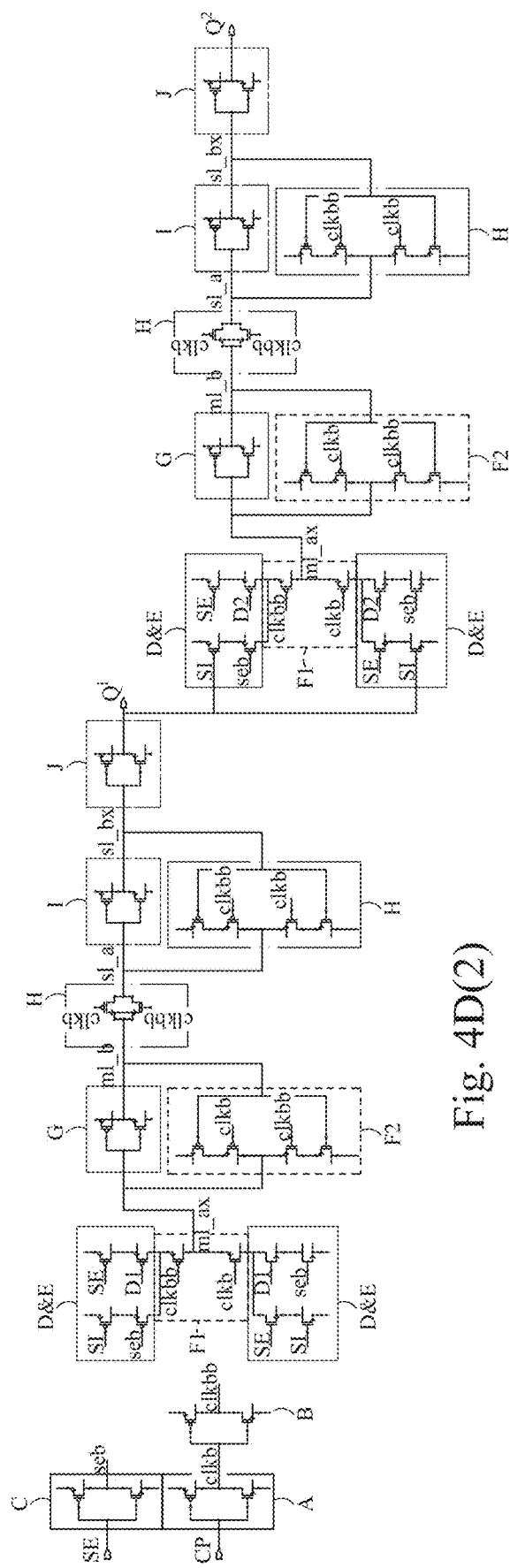
Fig. 4D(2)
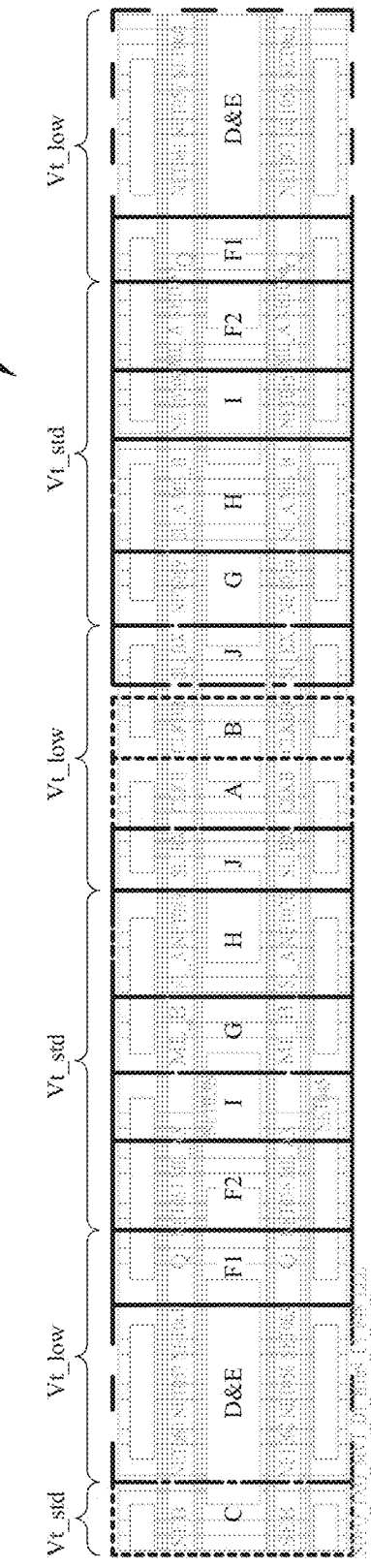
Fig. 4D(3)

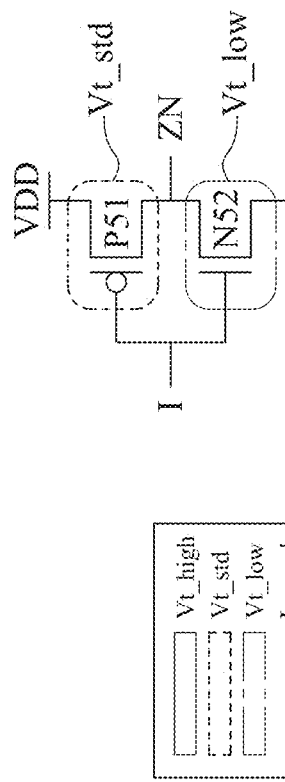
Fig. 5A(1)
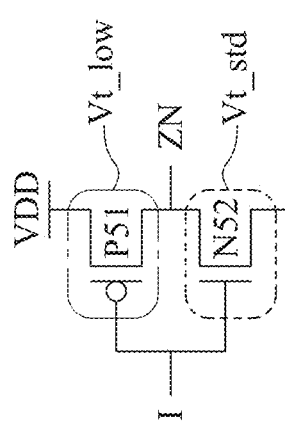
Fig. 5B(1)
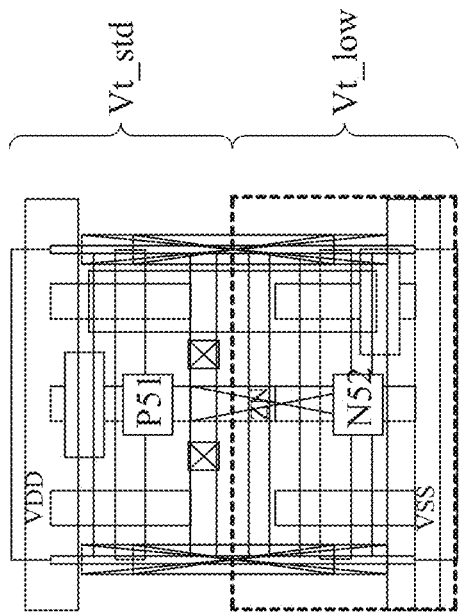
Fig. 5A(2)
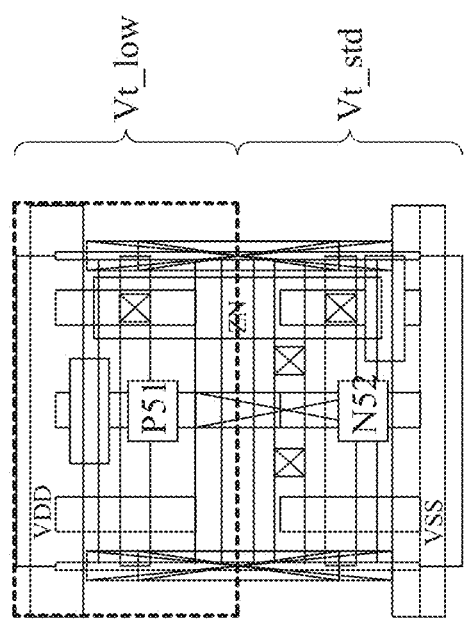
Fig. 5B(2)

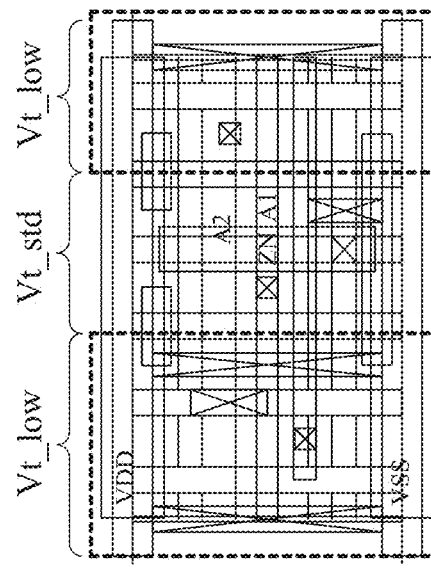
Fig. 5C(1)
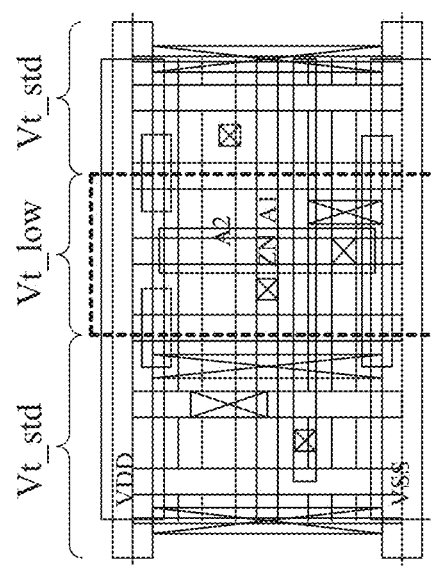
Fig. 5C(2)
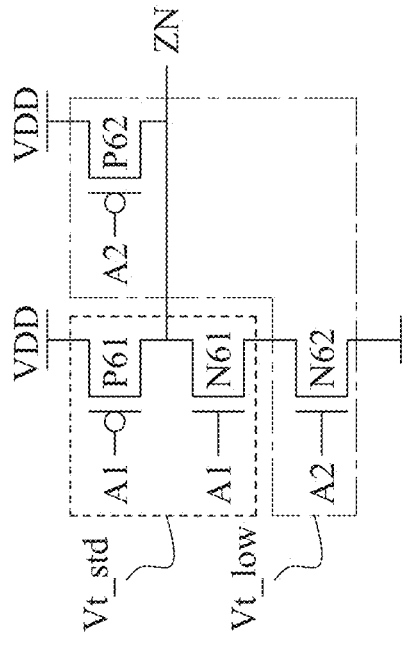
Fig. 5D(1)
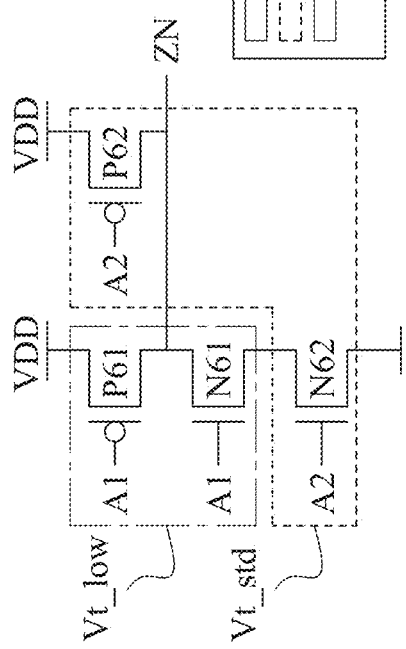
Fig. 5D(2)

FLIP-FLOP WITH TRANSISTORS HAVING DIFFERENT THRESHOLD VOLTAGES, SEMICONDUCTOR DEVICE INCLUDING SAME AND METHODS OF MANUFACTURING SAME

BACKGROUND

The integrated circuit (IC) industry produces a variety of analog and digital semiconductor devices to address issues in different areas. Developments in semiconductor process technology nodes have progressively reduced component sizes and tightened spacing resulting in progressively increased transistor density. ICs progressively become smaller.

Flip-flops (latches) are used as data storage elements. In some circumstances, a flip-flop stores a single bit (binary digit) of data. In some circumstances, a flip-flop (latch) is used for storage of a state and represents a basic storage element of sequential logic in electronics, e.g., shift registers.

One type of flip-flop is a delay (D) flip-flop (FF). A D FF is a digital electronic circuit that delays the change of state of its output signal (Q) until the next rising or falling edge of a clock timing input signal occurs. The D FF is a modified Set-Reset flip-flop with the addition of an inverter to prevent the S and R inputs from being at the same logic level.

A type of D FF is a scan-insertion D FF (SDFQ) which is used, e.g., to implement design for testing (DFT). An SDFQ is a D flip-flop that includes a multiplexer to controllably select between an input D during normal operation and a scan input during scan/test operation. Scan flip-flops, e.g., SDFQs, are used for device testing.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

FIG. 2F is a table, in accordance with some embodiments.

FIGS. 3A(2), 3B(2), 3D(2), 3E(2), 3F(2), 3H(2), 3I(2) and 3L(2) are layout diagrams, in accordance with some embodiments.

FIG. 4D(2) is a schematic circuit diagram, in accordance with some embodiments.

FIG. 4D(3) is a layout diagram, in accordance with some embodiments.

FIGS. 5A(2), 5B(2), 5C(2) and 5D(2) are corresponding layout diagrams, in accordance with some embodiments.

DETAILED DESCRIPTION

Figure 1B:
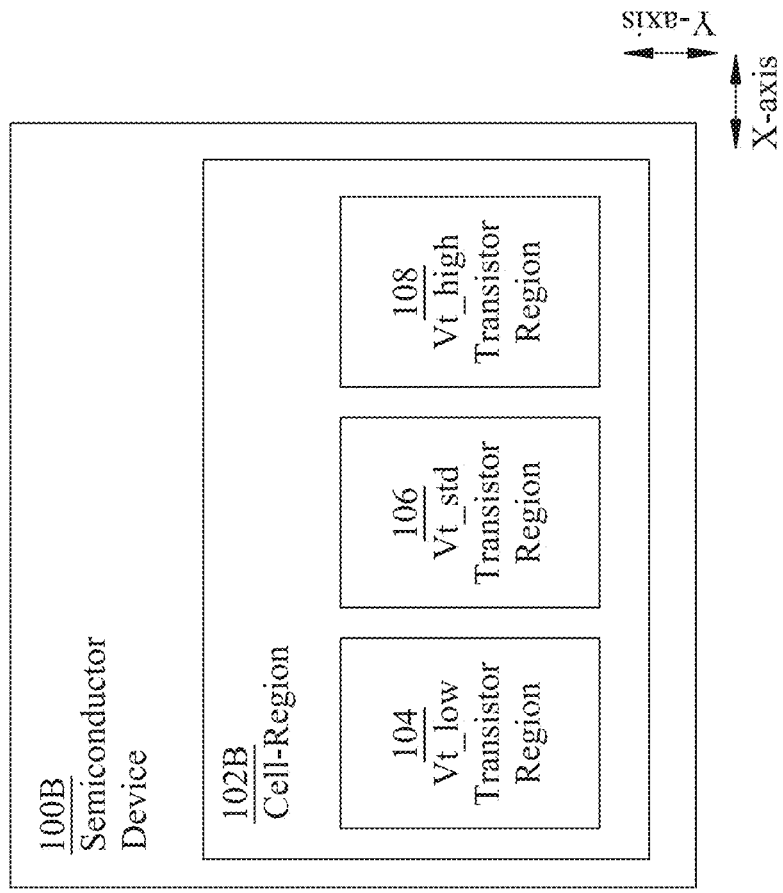
FIGS. 1A-1B are block diagrams of semiconductor devices, in accordance with some embodiments.

The following disclosure discloses many different embodiments, or examples, for implementing different features of the subject matter. Examples of components, materials, values, steps, operations, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows include embodiments in which the first and second features are formed in direct contact, and further include embodiments in which additional features are formed between the first and second features, such that the first and second features are in indirect contact. In addition, the present disclosure repeats reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, are used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus is otherwise oriented (rotated 90 degrees or at other orientations) and the spatially relative descriptors used herein are likewise interpreted accordingly. In some embodiments, the term standard cell structure refers to a standardized building block included in a library of various standard cell structures. In some embodiments, various standard cell structures are selected from a library thereof and are used as components in a layout diagram representing a circuit.

In some embodiments, a semiconductor device includes a cell region including active regions that extend in a first direction and have components of transistors formed therein. The transistors of the cell region are arranged to function as a D flip-flop that includes a primary latch, a secondary latch and a clock buffer. Each of the primary and secondary latches includes two types of inverters, namely a sleepy inverter and a non-sleepy (NS) inverter, the terms sleepy and non-sleepy are explained below. The primary latch includes a first sleepy inverter and a first non-sleepy (NS) inverter. The secondary latch includes a second sleepy inverter and a second NS inverter. The clock buffer includes third and fourth NS inverters. A first group of some but not all of the transistors has members which are configured with a standard threshold voltage (Vt_std members having threshold-voltage Vt_std). A second group of some but not all of the transistors has members which are configured with a low threshold voltage that is lower than the standard threshold voltage (Vt_low members having threshold-voltage Vt_low). Ones of the transistors which comprise at least one of the first NS inverter or the second NS inverter are Vt_low members of the second group. In some embodiments, the transistors of the cell region are further arranged to function as a scan-insertion type of D flip-flop (SDFQ) that includes the D flip-flop per se and a multiplexer, and ones of the transistors which comprise the multiplexer are Vt_low members of the second group.

A counterpart to the SDFQ according to another approach uses only transistors that have substantially the same threshold voltage, i.e., Vt_std. To avoid hold-slack violations, the other approach (1) adds additional transistors which adversely increases the area/footprint of SDFQ according to the other approach or (2) eliminates the counterpart of a fourth NS inverter of the clock buffer which adversely facilitates data-racing problems. By contrast, to avoid hold-slack violations, SDFQ embodiments of the present disclosure do not add additional transistors as is done by the SDFQ according to the other approach but instead are configured with transistors having a mix of threshold-voltages. In some SDFQ embodiments, some but not all of the transistors are configured with Vt_low and some but not all of the transistors are configured with Vt_std which helps to avoid an adverse increase in the area/footprint of the SDFQ embodiments. Also by contrast, to avoid hold-slack violations, SDFQ embodiments of the present disclosure, do not eliminate the fourth NS inverter of the clock buffer as is done by the SDFQ according to the other approach; instead SDFQ embodiments of the present disclosure retain the fourth NS inverter of the clock buffer and configure some but not all of the transistors with Vt_low and some but not all of the transistors with Vt_std which helps the SDFQ embodiments to avoid adversely facilitating data-racing problems.

Relevant terminology includes the following. When data input to a sequential logic circuit, e.g., an SDFQ, changes state, propagation delay refers to a finite amount of time needed by the logic gates to perform the operations on changed input data. A condition of valid operation is that the interval between clock pulses must be long enough so that all the logic gates have time to respond to the changes in the input data and have their corresponding outputs settle to stable logic values before the next clock pulse occurs. In general, when the condition is met, the circuit is stable and reliable.

Setup time is the minimum time that a signal must be stable before the clock rising edge. When the setup time is too brief, there is a risk that a logical state of the signal will be misinterpreted. More particularly, when the setup time is too brief, there is a risk that the signal will not settle into a first range of voltages which clearly represents a logical zero or a third range of voltages which clearly represents a logical one, but instead will remain in an intermediate second range of voltages which does not clearly represent either a logical zero or a logical one, resulting in the possibility of an incorrect interpretation of the logical state of the signal will be entered into a register, i.e., latched. Setup-slack is the difference in time between when the signal becomes valid and the setup time. In other words, when the setup-slack is positive, then the signal becomes valid sooner than required by the setup time. A setup-slack violation is a type of violation in which the setup-slack is negative such that the signal becomes valid after the point in time required by the setup time. In general, though a large positive setup-slack avoids signal-state misinterpretation, nevertheless a large positive setup-slack is undesirable because a significant portion of the large positive setup-slack represents delay that could be avoided. Accordingly, in general, the setup-slack is targeted for a near zero, positive number.

Hold time is the shortest time that a signal must be stable after the clock rising edge. When the hold time is not met, there is a risk that an incorrect interpretation of the logical state of the signal will be entered into a register, i.e., latched. Hold-slack is the difference in time between when the signal becomes valid and the hold time. In other words, when hold-slack is positive, then the signal remains valid longer than required by the hold time. A hold-slack violation is a type of slack violation in which the hold-slack is negative such that the signal remains valid too briefly, i.e., the signal remains valid for a shorter amount of time than is required by hold time. In general, though a large positive hold-slack avoids signal-state misinterpretation, nevertheless a large positive hold-slack is undesirable because a significant portion of the large positive hold-slack represents delay that could be avoided. Accordingly, in general, the hold-slack is targeted for a near zero, positive number.

Figure 1A:
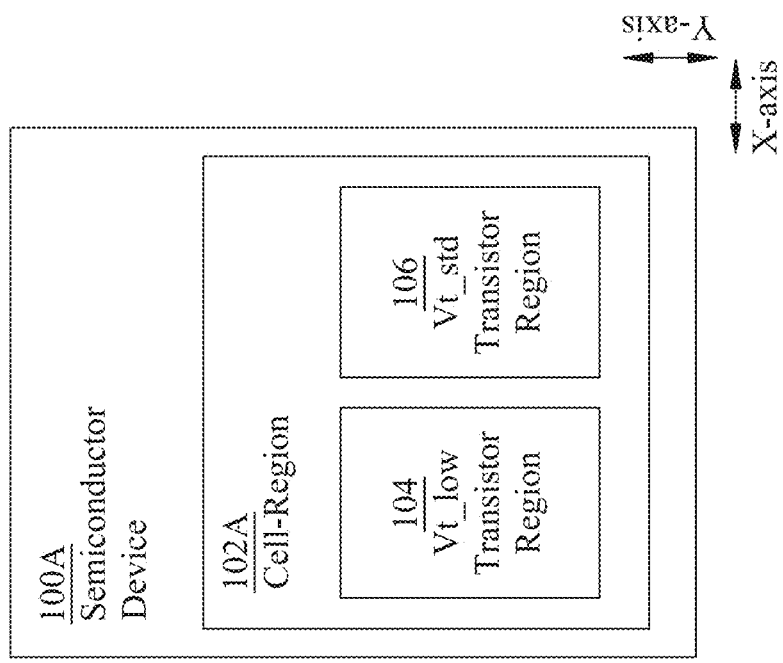

FIGS. 1A-1B are block diagrams of corresponding semiconductor devices 100A-100B, in accordance with some embodiments.

Semiconductor device 100A includes a cell region 102A. Cell region 102A includes a region 104 and a region 106, each of which includes transistors. The transistors in region 104 have substantially the same first threshold-voltage. The transistors in region 106 have substantially the same second threshold-voltage which is greater than the first threshold-voltage. In light of the first threshold-voltage being smaller than the second threshold voltage, the transistors in region 104 are described as having a low threshold-voltage (Vt_low) whereas the transistors in region 106 are referred to as having a standard threshold-voltage (Vt_std). Example semiconductor process techniques for fabricating transistors with differing threshold-voltages are discussed below. In general, values for Vt_low and Vt_std are determined by the design rules and scale of the corresponding semiconductor process technology node.

Semiconductor device 100B is similar to semiconductor device 100A except that cell region 102B of semiconductor device 100B additionally includes a region 108 as compared to cell region 102A of semiconductor device 100A. The transistors in region 108 have substantially the same third threshold-voltage which is greater than the second threshold-voltage of region 106. In light of the second threshold-voltage being smaller than the third threshold voltage, the transistors in region 108 are referred to as having a high threshold-voltage (Vt_high). Example semiconductor process techniques for fabricating transistors with differing threshold-voltages are discussed below. In general, values for Vt_low, Vt_std and Vt_high are determined by the design rules and scale of the corresponding semiconductor process technology node.

Figure 2A:
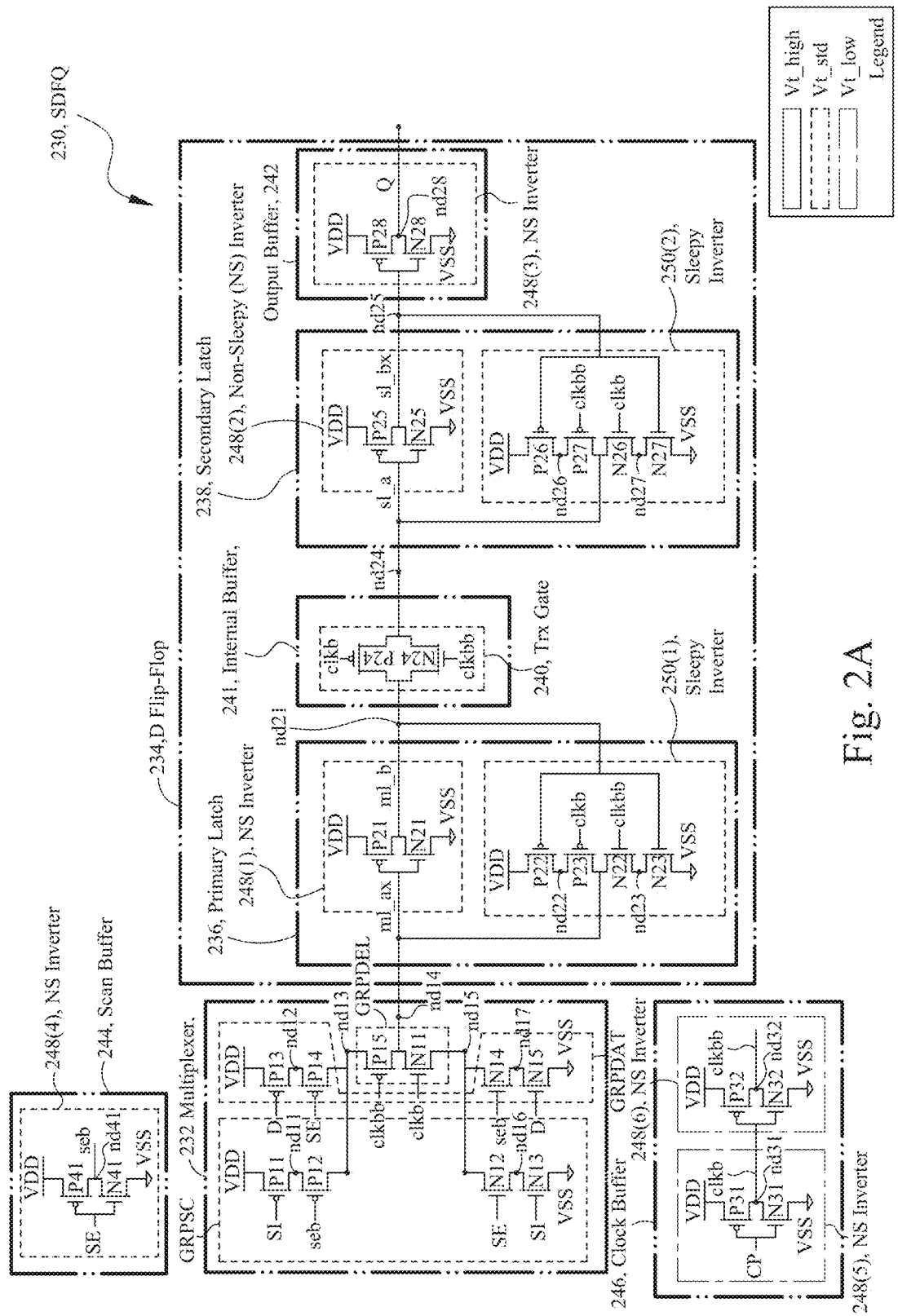
FIGS. 2A-2B are schematic circuit diagrams of a semiconductor device, in accordance with some embodiments.

FIG. 2A is a schematic circuit diagram, in accordance with some embodiments.

More particularly, FIG. 2A is a schematic circuit diagram of a scan-insertion D FF (SDFQ) 230. Amongst the transistors of SDFQ 230, there is a mix of threshold voltages, i.e., a majority of the transistors in SDFQ 230 have a standard threshold voltage (discussed below), though a minority of the transistors have a low threshold voltage (discussed below). The mix of differing threshold-voltage transistors in SDFQ 230 has benefits, e.g., with respect to avoiding a hold-slack violation (discussed below). SDFQ 230 is an example of cell region 102A of FIG. 1A. Before discussing the mix of differing threshold voltages, however, the schematic arrangement of the transistors is discussed.

SDFQ 230 is a transmission-gate-based design (discussed below). SDFQ 230 is an edge-triggered arrangement that is triggered on a rising edge (positive edge) of a clock signal. Variations of SDFQ 230 are triggered on the falling edge (negative edge) of the clock signal. Other variations of SDFQ 230 are double edge-triggered, i.e., are triggered by both the rising edge (positive edge) and falling edge (negative edge) of the clock signal.

SDFQ 230 includes a multiplexer 232, a D flip-flop 234, a scan buffer 244 and a clock buffer 246. SDFQ 230 includes field-effect transistors (FETs), and more particularly, positive-channel metal oxide semiconductor (PMOS) FETs (PFETs) and negative-channel metal oxide semiconductor (NMOS) FETs (NFETs). Some of the FETs of SDFQ 230 are arranged to function together as sleepy inverters (discussed below). Some of the FETs of SDFQ 230 are arranged to function together as non-sleepy (NS) inverters (discussed below).

In FIG. 2A, scan buffer 244 receives a Scan/Test Enable (SE) signal that selects between normal, i.e., non-scan/test, operation relative to data signal D or scan/test operation relative to a Scan Input (SI) signal. Scan buffer 244 includes a non-sleepy (NS) inverter 248(4), the latter including series-connected PFET P41 and NFET N41. An NS inverter, e.g., 248(4) is a counterpart to a sleepy inverter, e.g., 250(1) (discussed below). Hereinafter, an FET whose reference alphanumeric is prefixed with the uppercase letter P, e.g., P41, is a PFET, and an FET whose reference alphanumeric is prefixed with the uppercase letter N, e.g., N41, is an NFET.

In NS inverter 248(4), transistor P41 is connected between a node having a first reference voltage, e.g., VDD, and a node nd41. Transistor N41 is connected between node nd41 and a node having a second reference voltage, e.g., VSS. The gate terminals of each of transistors P41 and N41 are connected together and are configured to receive signal SE. Node nd41 has a signal seb which is the inversion of signal SE.

In FIG. 2A, clock buffer 246 includes a pair of NS inverters 248(5) and 248(6). NS inverter 248(5) includes series-connected transistors P31 and N31. Transistor P31 is connected between a node having voltage VDD and a node nd31. Transistor N31 is connected between node nd31 and a node having voltage VSS. The gate terminals of each of transistors P31 and N31 are connected together and are configured to receive a clock signal CP. Node nd31 represents an output node of NS inverter 248(5) and has a clock signal clkb which represents the inversion of clock signal CP.

In clock buffer 246, NS inverter 248(6) includes series-connected transistors P32 and N32. Transistor P32 is connected between a node having voltage VDD and a node nd32. Transistor N32 is connected between node nd32 and a node having voltage VSS. The gate terminals of each of transistors P32 and N32 are connected together and to node nd31, and thus are configured to receive clock signal clkb. Node nd32 represents an output node of NS inverter 248(6) and has a clock signal clkbb which represents the inversion of clock signal clkb.

In FIG. 2A, multiplexer 232 includes transistors P11-P15 and N11-N15. Transistor P11 is connected between a node having voltage VDD and a node nd11. The gate terminal of transistor P11 receives signal SI. Transistor P12 is connected between node nd11 and a node nd13. The gate terminal of transistor P12 receives signal seb. Transistor P13 is connected between a node having voltage VDD and a node nd12. The gate terminal of transistor P13 receives input signal D. Transistor P14 is connected between node nd12 and node nd13. The gate terminal of transistor P14 receives signal SE. Transistor P15 is connected between node nd13 and a node nd14, the latter having a signal m1_ax. The gate terminal of transistor P15 receives signal clkbb. Transistor N11 is connected between node nd14 and a node nd15. The gate terminal of transistor N11 receives signal clkb. Transistor N12 is connected between node nd15 and a node nd16. The gate terminal of transistor N12 receives signal SE. Transistor N13 is connected between node nd16 and a node having voltage VSS. The gate terminal of transistor N13 receives signal SI. Transistor N14 is connected between node nd15 and a node nd17. The gate terminal of transistor N14 receives signal seb. Transistor N15 is connected between node nd17 and a node having voltage VSS. The gate terminal of transistor N15 receives input signal D.

In multiplexer 232, transistors P13, P14, N14, N15 define a group of data transistors GRPDAT (data group GRPDAT) of multiplexer 232. Data group GRPDAT is used for selecting the data input signal D. Transistors P11, P12, N12, N13 define a group of scan transistors GRPSC (scan group GRPSC) of multiplexer 232. Scan group GRPSC is used for selecting the scan input signal SI. Transistors P15, N11 define a group of delay transistors GRPDEL (delay group GRPDEL) of multiplexer 232. Delay group GRPDEL is used for delaying the propagation of the selected input, namely either SI or D, through multiplexer 232.

In FIG. 2A, D flip-flop 234 includes a primary latch 236, an internal buffer 241, a secondary latch 238 and an output buffer 242.

Primary latch 236 includes an NS inverter 248(1) and a sleepy inverter 250(1). NS inverter 248(1) includes transistors P21 and N21. Transistor P21 is connected between a node having voltage VDD and a node nd21. Transistor N21 is located between node nd21 and a node having voltage VSS. The gate terminals of transistors P21 and N21 are connected together and to node nd14, and thus are configured to receive signal m1_ax. As such, signal m1_ax represents the input signal of D flip-flop 234. Node nd21 represents an output node of NS inverter 248(1) and has a signal m1_b which represents the inversion of signal m1_ax.

In primary latch 236, sleepy inverter 250(1) includes transistors P22-P23 and N22-N23. Transistor P22 is connected between a node having voltage VDD and a node nd22. Transistor P23 is connected between node nd22 and node nd14. The gate terminal of transistor P23 receives signal clkb. Transistor N22 is connected between node nd14 and a node nd23. The gate terminal of transistor N22 receives signal clkbb. In some embodiments, the gate terminal of transistor N22 receives signal CP instead of signal clkbb. Transistor N23 is connected between node nd23 and a node having voltage VSS. Sleepy inverter 250(1) can be put into a sleep mode of operation due to transistors P23 and N22. By contrast, NS inverter 248(1) lacks transistors corresponding to transistors P23 and N22 such that inverter 248(1) of primary latch 236 lacks a sleep mode of operation; accordingly, NS inverter 248(1) is described as a non-sleepy (NS) inverter. The gate terminals of transistors P22 and N23 are connected together and to node nd21. Accordingly, sleepy inverter 250(1) feeds-back an inverted version of signal m1_b (from node nd21) to node nd14.

In FIG. 2A, internal buffer 241 includes a transmission gate 240, the latter including transistors P24 and N24. Describing SDFQ 230 as a transmission-gate-based design is informed by the inclusion of transmission gate 240 in SDFQ 230. Transistors P24 and N24 are connected in parallel between node nd21 and a node nd24. The gate terminal of transistor P24 receives signal clkb. The gate terminal of transistor N24 receives signal clkbb. Nodes nd21 and nd24 correspondingly represent input and output nodes of transmission gate 240. Node nd24 has a signal s1_a.

In D flip-flop 234, secondary latch 238 includes an NS inverter 248(2) and a sleepy inverter 250(2). NS inverter 248(2) includes transistors P25 and N25. Transistor P25 is connected between a node having voltage VDD and a node nd25. Transistor N25 is connected between node nd25 and a node having voltage VSS. The gate terminals of transistors P25 and N25 are connected together and to node nd24, and thus are configured to receive signal s1_a. Node nd25 represents an output node of NS inverter 248(2) and has a signal s1_bx which represents the inversion of signal s1_a.

In secondary latch 238, sleepy inverter 250(2) includes transistors P26-P27 and N26-N27. Transistor P26 is connected between a node having voltage VDD and a node nd26. Transistor P27 is connected between node nd26 and node nd24. The gate terminal of transistor P27 receives signal clkbb. Transistor N26 is connected between node nd24 and a node nd27. Transistor N27 is connected between node nd27 and a node having voltage VSS. The gate terminal of transistor N26 receives signal clkb. Sleepy inverter 250(2) can be put into a sleep mode due to transistors P27 and N26. The gate terminals of transistors P26 and N27 are connected together and to node nd25. Accordingly, sleepy inverter 250(2) feeds-back an inverted version of signal s1_bx (from node nd25) to node nd24.

In D flip-flop 234, output buffer 242 includes an NS inverter 248(3), the latter including transistors P28 and N28. Transistor P28 is connected between a node having voltage VDD and a node nd28. Transistor N28 is connected between node nd28 and a node having voltage VSS. The gate terminals of transistors P28 and N28 are connected together and to node nd25, and thus are configured to receive signal s1_bx. Node nd28 represents an output node of NS inverter 248(3), and thus of D flip-flop 234. Furthermore, node nd28 also represents the output node of SDFQ 230. Node nd28 has signal Q which represents the inversion of signal s1_bx.

FIG. 2A assumes that SDFQ 230 is triggered on the rising edge (positive edge) of clock signal CP. Variations to make SDFQ 230 be triggered on the falling edge (negative edge) of a clock signal include, e.g., the following. Instead of receiving clock signal CP, the gate terminals of each of transistors P31 and N31 are configured to receive a clock signal CPN, where CPN is an inverted version of clock signal CP. Instead of receiving signal clkbb, the gate terminal of transistor P15 receives signal clkb. Instead of receiving signal clkb, the gate terminal of transistor N11 receives signal clkbb. Instead of receiving signal clkb, the gate terminal of transistor P23 receives signal clkbb. In some embodiments, the gate terminal of transistor P23 receives signal CPN instead of signal clkbb. Instead of receiving signal clkbb, the gate terminal of transistor N22 receives signal clkb. Instead of receiving signal clkb, the gate terminal of transistor P24 receives signal clkbb. Instead of receiving signal clkbb, the gate terminal of transistor N24 receives signal clkb. Instead of receiving signal clkbb, the gate terminal of transistor P27 receives signal clkb. Instead of receiving signal clkb, the gate terminal of transistor N26 receives signal clkbb.

In FIG. 2A, D flip-flop 234 is a transmission-gate-based design because internal buffer 241 thereof includes transmission gate 240. In some embodiments, D flip-flop 234 is a stack-gate-based design (not shown). More particularly, whereas internal buffer 241 of FIG. 2A includes transmission gate 240, a stack-gate-based version of D flip-flop 234 includes a version of internal buffer 241 which is stack-gate-based. In some embodiments, the stack-gate-based version of internal buffer 241 includes a sleepy inverter (not shown) in place of transmission gate 240, where a sleepy inverter is an example of a stack-gate-based device. Like transmission gate 240, the output of the alternative sleepy inverter is connected to node nd24. In contrast to transmission gate 240, the input of the alternative sleepy inverter in the stack-gate-based device is not connected to node nd21 but instead is connected to node nd14.

In FIG. 2A, the FETs of clock buffer 246 have Vt_low. The FETs of scan-buffer 244, multiplexer 232 and D flip-flop 234 have Vt_std. In terms of proportions relative to the total number of transistors in FIG. 2A, 12.50% of the transistors have Vt_low and 87.5% of the transistors have Vt_std. To show which transistors have Vt_low and which transistors have Vt_std, FIG. 2A, and similarly each of FIGS. 3A(1), 3B(1), 3C, 3D(1), 3E(1), 3F(1), 3G, 3H(1), 3I(1), 3J, 3K, 3L(1), 4C, 4D(1), 4E, 4F, 5A(1), 5B(1), 5C(1), 5D(1) and 5E-5F, uses different shape-fill techniques.

A counterpart to SDFQ 230 according to another approach uses only transistors that have substantially the same threshold voltage, i.e., Vt_std. To avoid hold-slack violations, the other approach (1) adds additional transistors which adversely increases the area/footprint of SDFQ according to the other approach or (2) eliminates the counterpart of NS inverter 248(3) which adversely facilitates data-racing problems. By contrast, to avoid hold-slack violations, SDFQ embodiments of the present disclosure, e.g., SDFQ 230, do not add additional transistors as is done by the SDFQ according to the other approach but instead are configured with transistors having a mix of threshold-voltages. In some SDFQ embodiments, e.g., SDFQ 230, some but not all of the transistors are configured with Vt_low and some but not all of the transistors are configured with Vt_std which helps to avoid an adverse increase in the area/footprint of the SDFQ embodiments. Also by contrast, to avoid hold-slack violations, SDFQ embodiments of the present disclosure, e.g., SDFQ 230, do not eliminate NS inverter 248(3) as is done by the SDFQ according to the other approach; instead SDFQ embodiments retain NS inverter 248(3) and configure some, e.g., a minority, of the transistors with Vt_low and some, e.g., a majority, of the transistors with Vt_std which helps the SDFQ embodiments to avoid adversely facilitating data-racing problems.

Regarding threshold voltages of transistors, various processes are employed during manufacture of a semiconductor device to produce regions whose transistors have differing threshold voltages. In some embodiments, during manufacturing of such a semiconductor device, a first doping process is performed in a first region of a substrate in which components of low-threshold-voltage (Vt_low) transistors will be formed. The first doping process results in the first region having a first dopant concentration. Then, a second doping process is performed on a second region of the substrate in which components of standard-threshold-voltage (Vt_std) transistors will be formed. The second doping process results in the second region having a second dopant concentration different than the first dopant concentration. In some embodiments, the second dopant concentration is greater than the first dopant concentration. In some embodiments, the second doping process is performed before the first doping process. The first and second dopant concentrations result in the transistors of the first and second regions having differing threshold voltages, i.e., having correspondingly a low threshold voltage and a standard threshold voltage. Ranges of values for the dopant concentrations are determined by the design rules and scale of the corresponding semiconductor process technology node.

In some embodiments, a third doping process is performed on a third region of the substrate in which components of high-threshold-voltage (Vt_high) transistors will be formed. The third doping process results in the third region having a third dopant concentration different than the first and second dopant concentrations. In some embodiments, the third dopant concentration is greater than the second dopant concentration. In some embodiments, the first, second and third doping processes are performed in a different order other than first before second and second before third. The first, second and third dopant concentrations result in the transistors of the first, second and third regions having differing threshold voltages, i.e., having correspondingly a low threshold voltage, a standard threshold voltage and a high threshold voltage.

In some embodiments, during manufacturing of a semiconductor device having transistors with differing threshold-voltages, a first type of gate is deposited over channel regions in a first region of a substrate in which Vt_low transistors will be formed. Then, a second type of gate is deposited over channel regions in a second region of the substrate in which Vt_std transistors will be formed. In some embodiments, the second type of gate is deposited before the first type of gate. The first and second types of gates correspondingly have different first and second work functions due to, e.g., different materials, and/or different thicknesses, and/or different numbers of layers, or the like. Because of the different first and second work functions correspondingly of the first and second types of gates, the transistors in the first and second regions have differing threshold voltages, i.e., have correspondingly a low threshold voltage and a standard threshold voltage. Ranges of values for parameters of the work functions of the different types of gates are determined by the design rules and scale of the corresponding semiconductor process technology node.

In some embodiments, a third type of gate is deposited over channel regions transistors in a third region of the substrate in which Vt_high transistors will be formed. As compared to the work functions of the first and second types of gates, the third type of gate has a different work function due to, e.g., different materials, and/or different thicknesses, and/or different numbers of layers, or the like. Because of the different first, second and third work functions correspondingly of the first, second and third types of gates, the transistors in the first, second and third regions have correspondingly differing threshold voltages, i.e., have correspondingly a low threshold voltage, a standard threshold voltage and a high threshold voltage. In some embodiments, the first, second and third types of gates are deposited in an order other than first before second and second before third.

Regarding a distribution of transistors having differing threshold voltages, in some embodiments having first and second regions, the first region has multiple areas amongst which the second region as a whole is interspersed. In some embodiments, the second region has multiple areas amongst which the first region as a whole is interspersed. In some embodiments, each of the first and second regions has corresponding multiple areas, and the multiple areas of the first region are interspersed among the multiple areas of the second region. In some embodiments having a third region in addition to the first and second regions, the third region has multiple areas amongst which: the first region as a whole is, or one or more areas thereof are, interspersed; and/or the second region as a whole is, or one or more areas thereof are, interspersed.

Figure 2B:
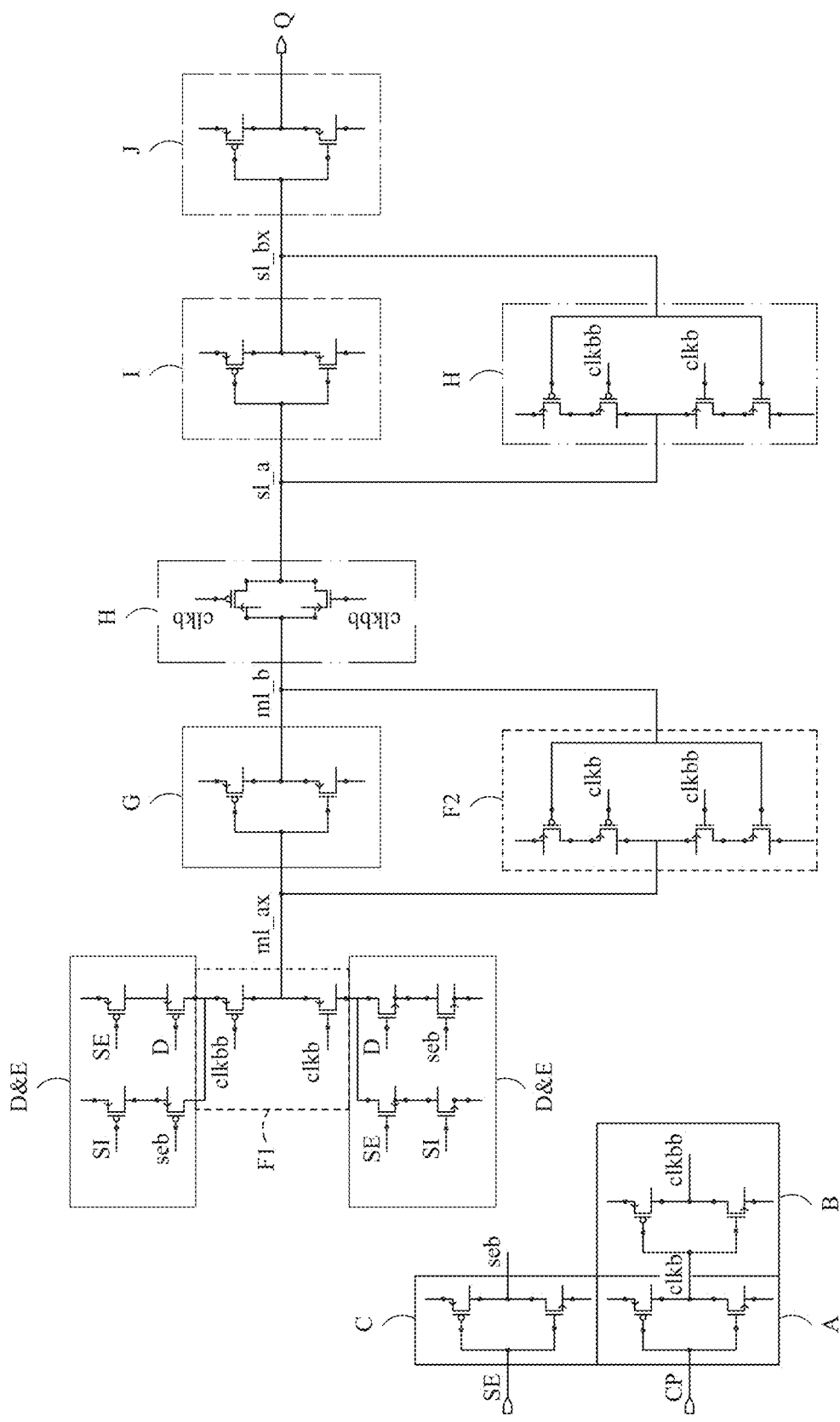

FIG. 2B is a schematic circuit diagram, in accordance with some embodiments.

FIG. 2B is a simplified version of FIG. 2A. FIG. 2B represents a legend for interpreting the layout diagrams of FIGS. 3A(2), 3B(2), 3D(2), 3E(2), 3F(2), 3H(2), 3I(2) and 3L(2), discussed below.

In FIG. 2B, the transistors of SDFQ 230 are correspondingly enclosed by boxes A, B, C, D & E, F1, F2, G, H, I and J. To show their locations in a layout diagram, boxes A, B, C, D & E, F1, F2, G, H, I and J are correspondingly superimposed on each of FIGS. 3A(2), 3B(2), 3D(2), 3E(2), 3F(2), 3H(2), 3I(2) and 3L(2).

In FIG. 2B, boxes A, B, C, D & E, F1, F2, G, H, I and J correspond to the components of SDFQ 230 of FIG. 2A as shown below in Table 1.

TABLE 1

| Component from FIG. 2A | Box |
| --- | --- |
| NS Inverter 248(5) of Clock Buffer 246 | A |
| NS Inverter 248(6) of Clock Buffer 246 | B |
| NS Inverter of 248(4) of Scan Buffer 244 | C |
| Transistors P11-P14 and N12-N15 of Scan Group GRPSC and Data Group GRPDAT of Multiplexer 232 | D & E |
| Transistors of delay group GRPDEL of Multiplexer 232 | F1 |
| Sleepy Inverter 250(1) of Primary Latch 236 | F2 |
| NS Inverter 248(1) of Primary Latch 236 | G |
| Transmission Gate 240 of Internal Buffer 241 and Sleepy Inverter 250(2) of Secondary Latch 238 | H |
| NS Inverter 248(2) of Secondary Latch 238 | I |
| NS Inverter 248(3) of Output Buffer 242 | J |

Figure 2C:
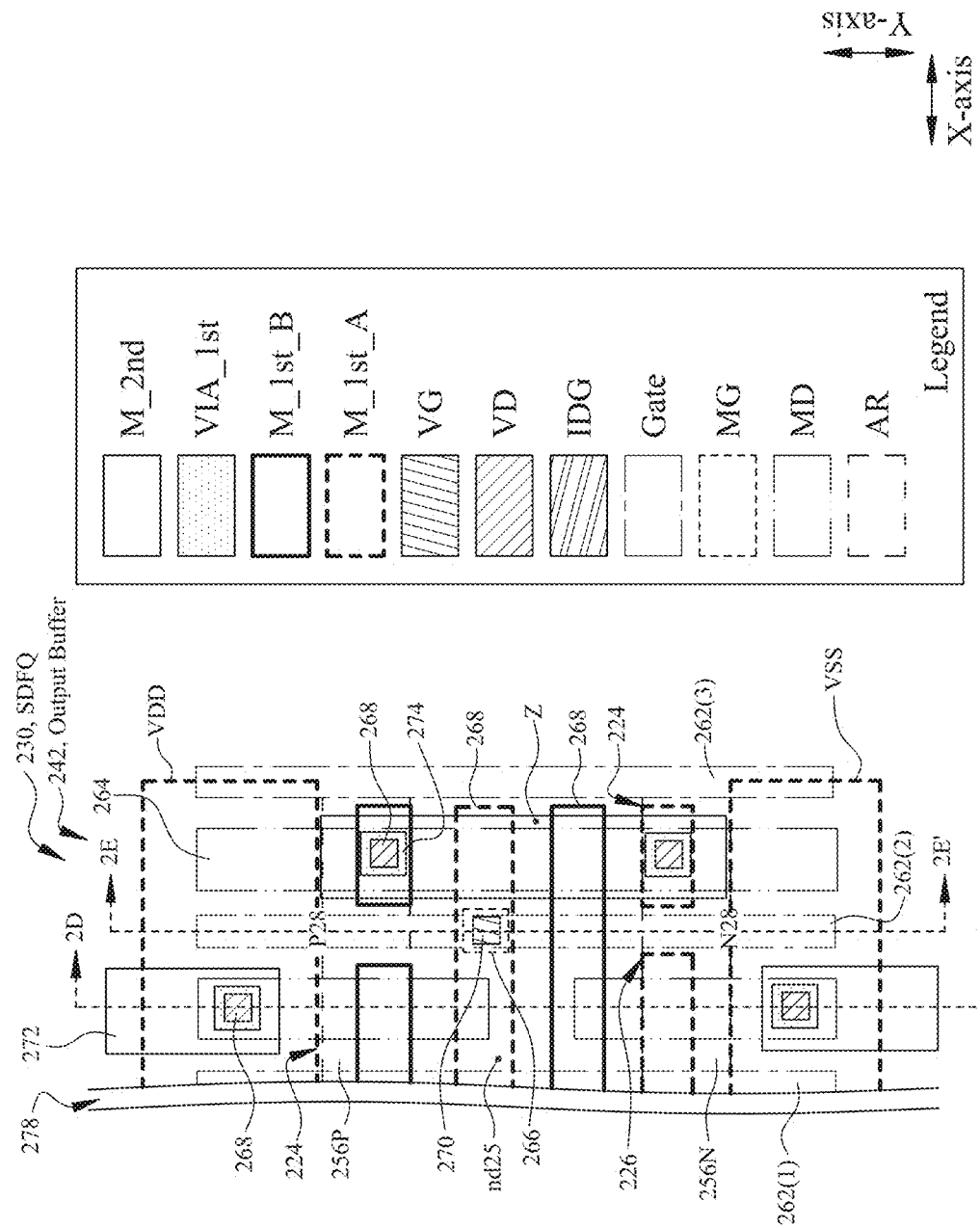
FIG. 2C is layout diagram, in accordance with some embodiments.

FIG. 2C is a layout diagram of output buffer 242 of SDFQ 230 of FIG. 2A, in accordance with some embodiments.

The layout diagram of FIG. 2C is part of a larger layout diagram, as indicated by break line 278. Examples of the larger layout diagrams include the layout diagrams of FIGS. 3A(2), 3B(2), 3D)(2), 3E(2), 3F(2), 3H(2), 3I(2) and 3L(2), discussed below, or the like.

In general, a layout diagram represents a semiconductor device. Shapes in the layout diagram represent corresponding components in the semiconductor device. The layout diagram per se is a top view. Shapes in the layout diagram are two-dimensional relative to, e.g., the X-axis and the Y-axis, whereas the semiconductor device being represented is three-dimensional. Typically, relative to the Z-axis, the semiconductor device is organized as a stack of layers in which are located corresponding structures, i.e., to which belong corresponding structures. Accordingly, each shape in the layout diagram represents, more particularly, a component in a corresponding layer of the corresponding semiconductor device. Typically, the layout diagram represents relative depth, i.e., positions along the Z-axis, of shapes and thus layers by superimposing a second shape on a first shape so that the second shape at least partially overlaps the first shape. Regarding some similarly sized contact structures which are stacked in a layout diagram along the Z-axis, e.g., VD and VIA_1st contact structures (discussed below), the stacking order along the Z-axis is reversed relative to the Z-axis stacking order in FIG. 2C as compared to corresponding contact structures in a corresponding semiconductor device (FIGS. 2D-2E), this being done in the layout diagram, e.g., FIG. 2C, for simplicity of illustration. For simplicity of discussion, i.e., as a discussion-expedient, some elements in layout diagram (e.g., FIG. 2C and the other layout diagrams disclosed herein) are referred to as if they are counterpart structures in a corresponding semiconductor device rather than patterns/shapes per se.

Layout diagrams vary in terms of the amount of detail represented. In some circumstances, selected layers of a layout diagram are combined/abstracted into a single layer, e.g., for purposes of simplification. Alternatively, and/or additionally, in some circumstances, not all layers of the corresponding semiconductor device are represented, i.e., selected layers of the layout diagram are omitted, e.g., for simplicity of illustration. FIG. 2C and the other layout diagrams disclosed herein are examples of layout diagrams in which selected layers have been omitted, e.g., interconnection & metallization layers over the M_2nd layer are omitted in FIG. 2B.

Locations of transistors P28 and N28 of output buffer 242 are shown in FIG. 2C. Output buffer 242 includes an active region (AR) 256P which is configured for PMOS technology and an AR 256N which is configured for NMOS technology. Each of ARs 256P and 256N has a long axis that extends in a first direction, e.g., the direction of the X-axis. Each of ARs 256P and 256N has a short axis that extends in a second direction perpendicular to the first axis, e.g., the second direction is the direction of the Y-axis. ARs 256P and 256N include doped first areas that represent source/drain (S/D) regions 224 of the ARs. S/D regions 224 represent first transistor-components. Second areas of ARs 256P and 256N which are between corresponding S/D regions 224 are channel regions 226 that represent second transistor-components.

In FIG. 2C and in other layout diagrams disclosed herein, relative to the Y-axis, a distance or size is alternately referred to as a height. Each of ARs 256P and 256N has a height. Relative to the Y-axis, ARs 256P and 256N are spaced apart by a gap. Sizes of the height and the gap are determined by corresponding design rules of the corresponding semiconductor process technology node.

In some embodiments, transistors P28 and N28 corresponding to ARs 256P and 256N are fin-type FETs (fin-FETs). In some embodiments, transistors P28 and N28 are gate-all-around-type FETs (GAAFETs), e.g., which use nanowire, nanosheets, or the like. In some embodiments, transistors P28 and N28 are complementary FETs (CFETs). In some embodiments, transistors P28 and N28 represent a transistor architecture other than fin-FET, GAAFET or CFET.

Selected ones of gate lines 262(1)-262(3) which are included in corresponding transistors represent third transistor-components. Long axes of gate lines 262(1)-262(3) extend parallel to the Y-axis. Among gate lines 262(1), 262(2) and 262(3), gate line 262(2) is over corresponding ones of channel regions 226. Metal-to-S/D (MD) contact structures 264 are over corresponding ones of S/D regions 224. MD contact structures 264 represent a first type of fourth transistor-components. In some embodiments, MG contact structures 266 represent a second type of fourth transistor-components. Metal-to-gate (MG) contact structures 266 are over corresponding ones of gate lines 262(1)-262(3). In some embodiments, a given S/D region is formed by doping a portion of an AR that is between corresponding instances of gate lines or that is adjacent to a corresponding instance of an IDG (not shown; discussed below) with an appropriate conductivity-type dopant.

Via-to-MD (VD) contact structures 268 represent connections between corresponding MD contact structures 264 and conductive segments in a first level of metallization (M_1st conductive segments) 272. Via-to-gate (VG) contact structures 270 represent connections between gate lines 262(1)-262(2) and M_1st conductive segments 272, and more specifically between MG contact structures 266 and M_1st conductive segments 272. M_1st conductive segments 272 are over corresponding gate lines 262(1)-262(3) and MD contact structures 264. A first one of M_1st conductive segments 272 is designated for VDD, and thus represents a VDD power rail. A second one of M_1st conductive segments 272 is designated for VSS, and thus represents a VSS power rail. Via structures in a first layer of interconnection (VIA_1st structures) 274 represent connections between corresponding M_1st conductive segments 272 and conductive segments in a second level of metallization (M_2nd conductive segments) 276. M_2nd conductive segments 276 are over corresponding M_1st conductive segments 272.

In some embodiments, depending upon the numbering convention of the corresponding process node by which such a semiconductor device is fabricated, the first (1st) layer of metallization M_1st is either metallization layer zero, M0, or metallization layer one, M1; and correspondingly the first layer of interconnection V_1st is either VIA0 or VIA1. In some embodiments, M0 is the first layer of metallization above a transistor layer. In some embodiments, the transistor layer includes components of transistors, e.g., ARs including S/D regions and channel regions therein, MD contact structures, VD contact structures, via-to-gate (VG) contact structures, gate structures, MG contact structures, or the like. In some embodiments, AR 256P is doped with a first conductivity-type dopant, and AR 256N are doped with a second conductivity-type dopant. In some embodiments that are configured according to complementary metal oxide semiconductor (CMOS) technology, the following is true: AR 256P is doped with a first conductivity-type dopant, e.g., a P-type dopant, such that the transistors corresponding to AR 256P are PFETs; AR 256N is doped with a second conductivity-type dopant, e.g., an N-type dopant, such that the transistors corresponding to AR 256N are NFETs; and AR 256P is formed in a corresponding N-well (255 in FIGS. 2D-2E).

In some embodiments, an instance of gate lines 262(1)-262(3) has been replaced by an insulating dummy gate (IDG) (not shown). An isolation dummy gate, such as that created from an isolation dummy gate pattern (not shown), is a dielectric structure that includes one or more dielectric materials and functions as an electrical isolation structure. Accordingly, an isolation dummy gate is not a structure that is electrically conductive and so does not function, e.g., as a gate electrode of an active transistor. In some embodiments, an isolation dummy gate is referred to as a dielectric gate structure. In some embodiments, an isolation dummy gate is an example of a structure included in CPODE layout scheme. In some embodiments, CPODE is an acronym for continuous poly on diffusion edge. In some embodiments, CPODE is an acronym for continuous poly on oxide definition edge. In some embodiments, an isolation dummy gate is based on a gate structure as a precursor. In some embodiments, an isolation dummy gate is formed by first forming a gate structure, e.g., a dummy gate structure, sacrificing/removing (e.g., etching) the gate structure to form a trench, (optionally) removing a portion of a substrate that previously had been under the gate structure to deepen the trench, and then filling the trench with one or more dielectric materials such that the physical dimensions of the resultant electrical isolation structure, i.e., the isolation dummy gate, are similar to the dimensions of the precursor which was sacrificed, namely the gate structure or the combination of the gate structure and the portion of the substrate.

Figure 2D:
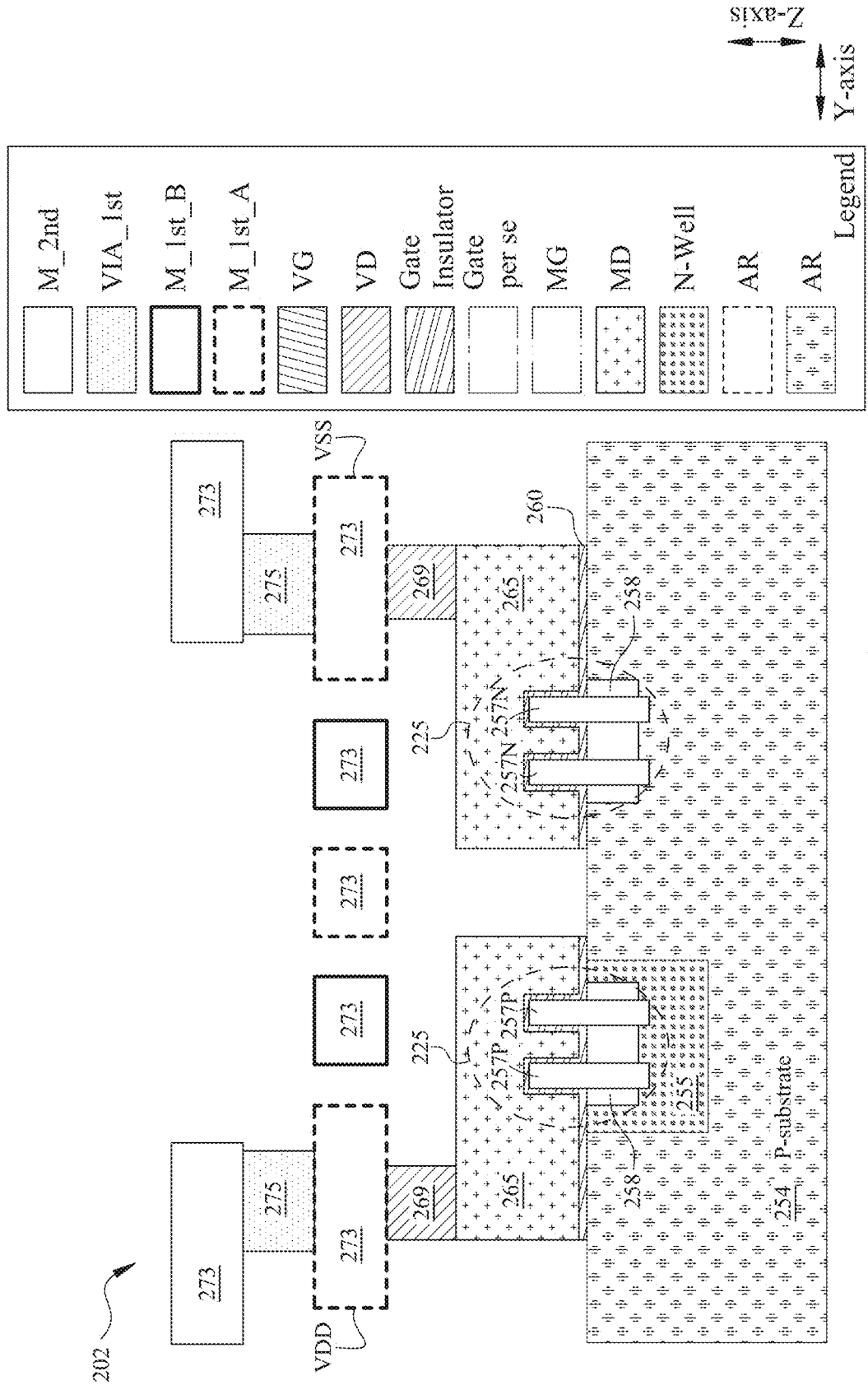
FIGS. 2D-2E are cross sectional views, in accordance with some embodiments.
Figure 2E:
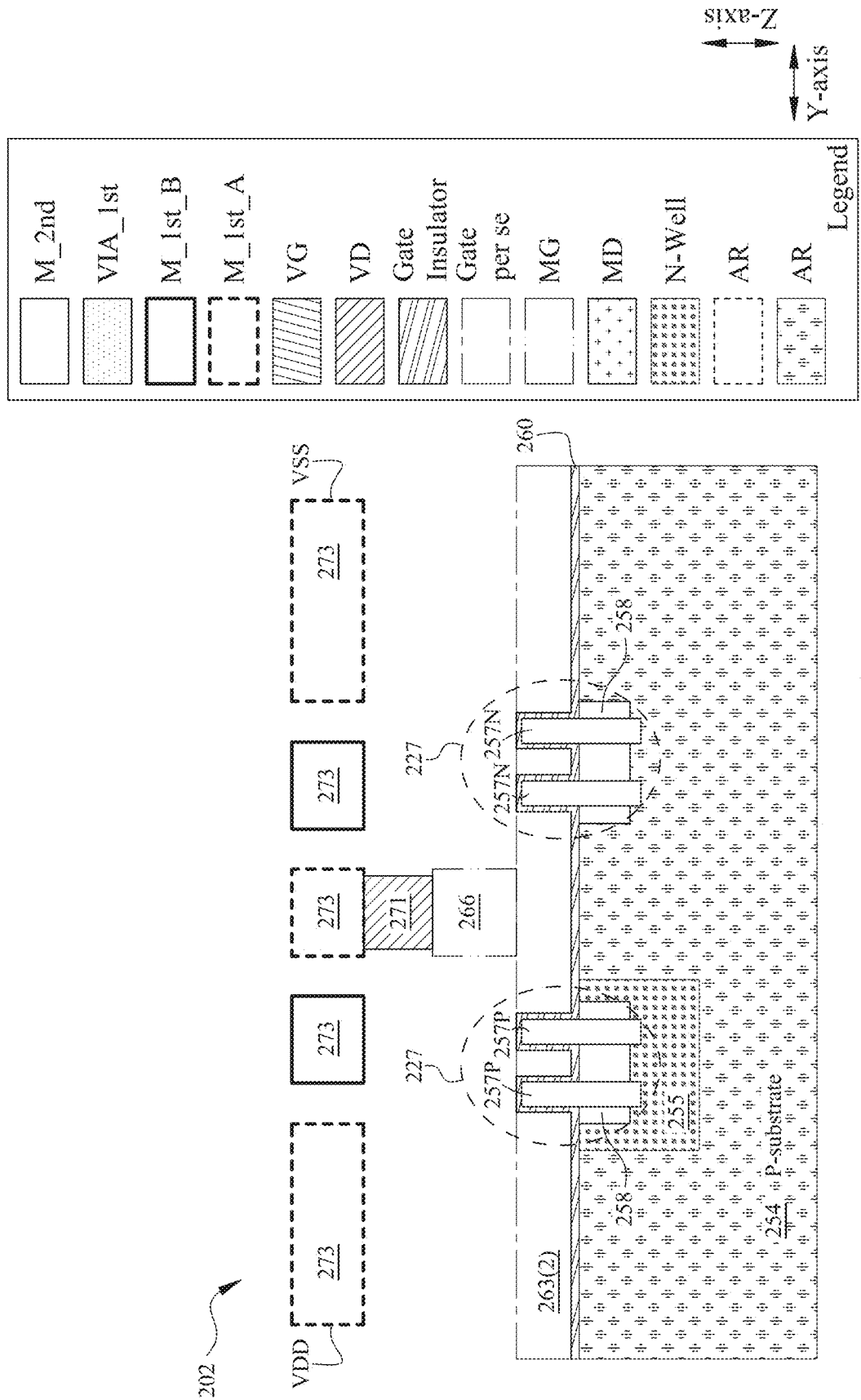

FIGS. 2D-2E are corresponding cross sectional views of a cell region that is included in a semiconductor device, in accordance with some embodiments.

In particular, FIGS. 2D-2E are cross sectional views of a cell region 202 of a semiconductor device based on cell region 102A or 102B of corresponding FIGS. 2A-2B. FIGS. 2D-2E assume a context of complementary metal oxide semiconductor (CMOS) technology in which cell region 202 includes N-well 255. FIGS. 2D-2E correspond to section lines 2D-2D' and 2E-2E' of FIG. 2C. For simplicity of illustration, FIGS. 2D-2E further assume a fin-FET architecture in which each AR is represented by two fins, i.e., AR 256P is represented by X instances of P-type fin 257P and AR 256N is represented by X instances of N-type fin 257N, where X=2. In other embodiments, X is a positive integer other than 3. In some embodiments, AR 256P has a different number of fins 257P as compared to the number of fins 257N of AR 256N.

Each of FIGS. 2D-2E includes: a P-type substrate 254; an N-well 255 in substrate 254; P-type fins 257P partially in N-well 255 relative to the Z-axis; N-type fins 257P partially in substrate 254 relative to the Z-axis; a first gate insulator 258 against fins 257P in N-well 255; and a second gate insulator 260 on fins 257P and 257N, first gate insulator 258, N-well 255 and P-substrate 254.

In FIG. 2D, cell region 202 further includes: MD contact structures 265 on second gate insulator 260; VD contact structures 269 in a VD/VG interconnection layer and on corresponding MD contact structures 265; M_1st conductive segments 273 in the M_1st layer and above the VD/VG interconnection layer, the VDD power rail instance of M_1st conductive segment 273 and the VSS power rail instance of M_1st conductive segment 273 being over corresponding instances of VD contact structure 269; VIA_1st structures 275 in a first interconnection layer and correspondingly over the VDD power rail instance of M_1st conductive segment 273 and the VSS power rail instance of M_1st conductive segment 273; and M_2nd conductive segments correspondingly over VIA_1st structures 275.

In FIG. 2E, cell region 202 further includes: gate line 263(2) on second gate insulator 260; MG contact structure 266 on gate line 263(2); VG contact structure 271 in the VD/VG interconnection layer and on MG contact structure 266; M_1st conductive segments 273 in the M_1st layer and above the VD/VG interconnection layer, a centrally located (relative to the Y-axis) instance of M_1st conductive segment 273 being over VG contact structure 271.

In some embodiments, the P-type substrate includes silicon, silicon germanium (SiGe), gallium arsenic, or other suitable semiconductor materials. The fins are formed in or over the P-type substrate, using one or more masks corresponding to one or more active regions in the layout diagrams described herein. The second gate insulating layer is deposited over the P-type substrate, among others. Example materials that comprise the second gate insulating layer include, but are not limited to, a high-k dielectric layer, an interfacial layer, and/or combinations thereof. In some embodiments, the second gate dielectric material layer is deposited over the P-type substrate by atomic layer deposition (ALD) or other suitable techniques. Example materials that comprise the gate lines include, but are not limited to, polysilicon, metal, Al, AlTi, Ti, TiN, TaN, Ta, TaC, TaSiN, W, WN, MoN, and/or other suitable conductive materials.

FIG. 2F is a Table 2, in accordance with some embodiments.

In FIG. 2F, Table 2 summarizes the mix of threshold-voltage transistors in SDFQ 230 of FIG. 2A and in the SDFQs of FIGS. 3A(1), 3B(1), 3C, 3D(1), 3E(1), 3F(1), 3G, 3H(1), 3I(1), 3J, 3K, 3L(1), 4C, 4D(1), 4E and 4F (discussed below).

For example, row 1 of Table 2 summarizes the mix of different threshold-voltage transistors in SDFQ 230 of FIG. 2A. In SDFQ 230, the FETs of NS inverters 248(5) and 248(6) of clock buffer 246 have Vt_low. The FETs of scan-buffer 244, multiplexer 232, NS inverter 248(1) and sleepy inverter 250(1) of primary latch 236, internal buffer 241, NS inverter 248(2) and sleepy inverter 250(2) of secondary latch 238, and output buffer 242 have Vt_std. By contrast, a minority of the FETs have the low threshold-voltage (Vt_low), i.e., FIG. 3A(1) is block diagram of an SDFQ 330A(1), in accordance with some embodiments.

SDFQ 330A(1) also is a block diagram equivalent of the schematic circuit diagram of FIG. 2A. That is, SDFQ 330A(1) of FIG. 3A(1) is the block diagram equivalent of SDFQ 230 of FIG. 2A. SDFQ 330A(1) is an example of cell region 102A of FIG. 1A. Hence, row 1 of Table 2 summarizes the mix of threshold-voltage transistors in SDFQ 330A(1) of FIG. 3A(1) as well as in SDFQ 230 of FIG. 2A. The other approach's counterpart to SDFQ 230 of FIG. 2A is also a counterpart to SDFQ 330A(1) of FIG. 3A(1). Accordingly, SDFQ 330A(1) is an improvement over the other approach's counterpart at least for reasons that SDFQ 230 is an improvement of the other approach's counterpart. In terms of proportions relative to the total number of transistors in FIG. 2A, 12.50% of the FETs have Vt_low and 87.50% of the FETs have Vt_std.

FIG. 3A(2) is a layout diagram 330A(2), in accordance with some embodiments.

More particularly, layout diagram 330A(2) is a representation of the block diagram of SDFQ 330A(1) of FIG. 3A(1).

In layout diagram 330A(2), boxes A, B, C, D & E, F1, F2, G, H, I and J correspond to the components of SDFQ 330A(1) of FIG. 3A(1) as shown below in the mapping of Table 3.

TABLE 3

| Component from FIG. 3A(1) | Box |
|---|---|
| NS Inverter 348(5) of Clock Buffer 346 | A |
| NS Inverter 348(6) of Clock Buffer 346 | B |
| NS Inverter of 348(4) of Scan Buffer 344 | C |
| Transistors P11-P14 and N12-N15 of Scan Group GRPSC and Data Group GRPDAT of Multiplexer 332 | D & E |
| Transistors of delay group GRPDEL of Multiplexer 332 | F1 |
| Sleepy Inverter 350(1) of Primary Latch 336 | F2 |
| NS Inverter 348(1) of Primary Latch 336 | G |
| Transmission Gate 340 of Internal Buffer 341 and Sleepy Inverter 350(2) of Secondary Latch 338 | H |
| NS Inverter 348(2) of Secondary Latch 338 | I |
| NS Inverter 348(3) of Output Buffer 342 | J |

It is noted that the mapping of Table 3 not only applies to the layout diagram of FIG. 3A(2), but also to the layout diagrams of 3B(2), 3I D(2), 3E(2), 3F(2), 3H(2), 3I(2) and 3L(2).

In FIG. 3A(2), the transistors in boxes B and A have Vt_low. The transistors in boxes C, D & E, J, F1, F2, G, H and I have Vt_std.

FIG. 3B(1) is block diagram of an SDFQ 330B(1), in accordance with some embodiments.

SDFQ 330B(1) is similar to SDFQ 330A(1) of FIG. 3A(1) except that the mix of different threshold-voltage transistors in SDFQ 330B(1) is different than in SDFQ 330A(1). FIG. 3B(1) also is a block diagram equivalent of the schematic circuit diagram of FIG. 2A except that FIG. 3B(1) has a different distribution of threshold-voltage transistors than FIG. 2A. SDFQ 330B(1) is an example of cell region 102A of FIG. 1A.

In SDFQ 330B(1) of FIG. 3B(1), a minority of the FETs, i.e., the FETs of NS inverters 348(5) and 348(6) of clock buffer 346 and the FETs of multiplexer 332 have Vt_low. By contrast, a majority of the FETs, i.e., the FETs of scan-buffer 344, NS inverter 348(1) and sleepy inverter 350(1) of primary latch 336, internal buffer 341, NS inverter 348(2) and sleepy inverter 350(2) of secondary latch 338, and output buffer 342 have Vt_std. In terms of proportions relative to the total number of transistors in FIG. 3B(1), 43.75% of the FETs have Vt_low and 56.25% of the FETs have Vt_std. Row 2 of Table 2 summarizes the mix of threshold-voltage transistors in SDFQ 330B(1) of FIG. 3B(1).

The other approach's counterpart to SDFQ 330A(1) of FIG. 3A(1) is also a counterpart to SDFQ 330B(1) of FIG. 3B(1). Accordingly, SDFQ 330B(1) is an improvement over the other approach's counterpart at least for reasons that SDFQ 330A(1) is an improvement of the other approach's counterpart.

FIG. 3B(2) is a layout diagram 330B(2), in accordance with some embodiments.

More particularly, layout diagram 330B(2) is a representation of the block diagram of SDFQ 330B(1) of FIG. 3B(1).

In FIG. 3B(2), the transistors in boxes B, D & E, A, F1 and F2 have Vt_low. The transistors in boxes G, H, I, J and C have Vt_std. Again, correspondences between boxes A, B, C, D & E, F1, F2, G, H, I and J in the layout diagram of FIG. 3B(2) and the components of SDFQ 330B(1) of FIG. 3B(1) are shown above in the mapping of Table 3.

Figure 3C:
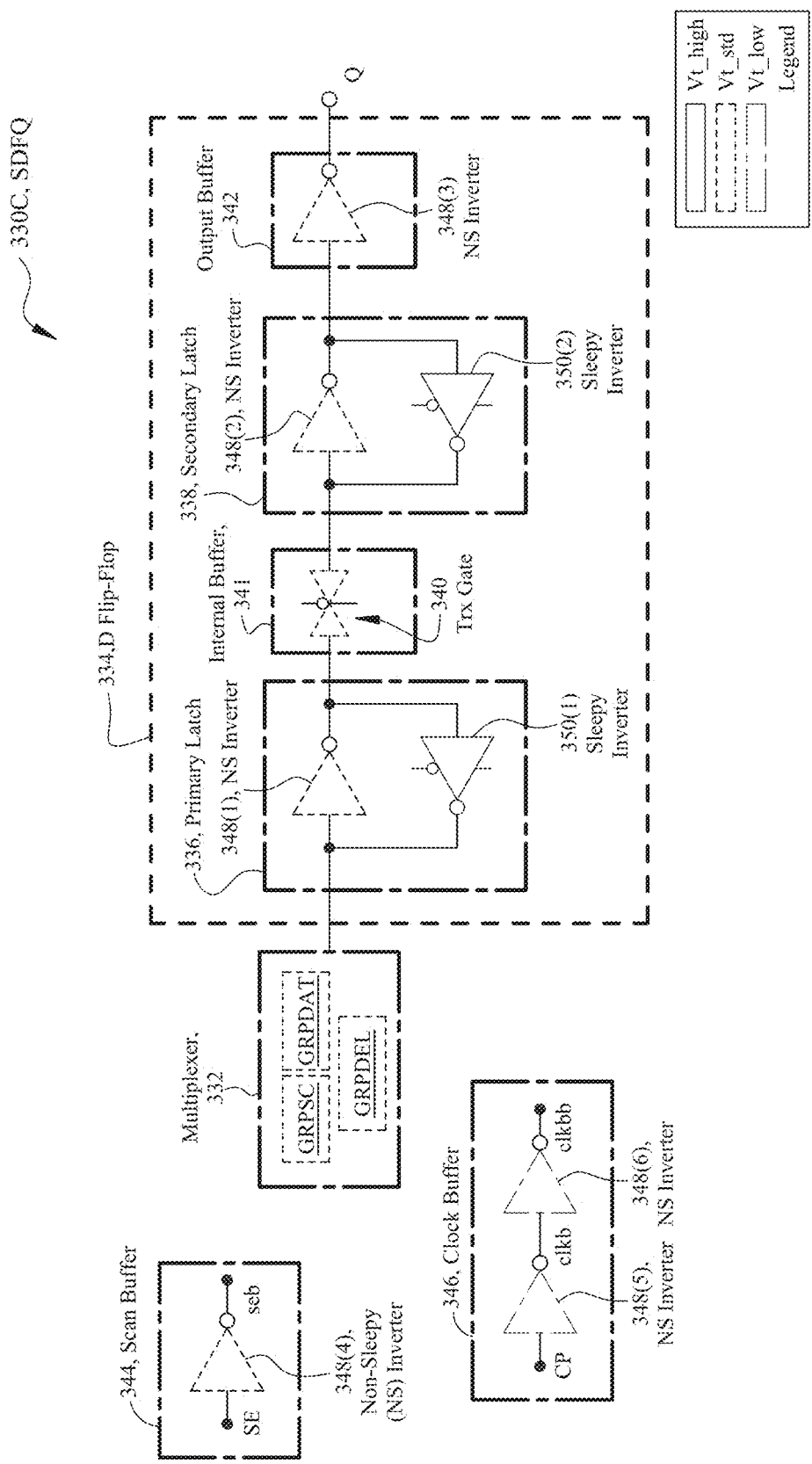
FIGS. 3A(1), 3B(1), 3C, 3D(1), 3E(1), 3F(1), 3G, 3H(1), 3I(1), 3J, 3K and 3L(1) are block diagrams, in accordance with some embodiments.

FIG. 3C is block diagram of an SDFQ 330C, in accordance with some embodiments.

SDFQ 330C is similar to SDFQ 330A(1) of FIG. 3A(1) except that the mix of different threshold-voltage transistors in SDFQ 330C is different than in SDFQ 330A(1). FIG. 3C also is a block diagram equivalent of the schematic circuit diagram of FIG. 2A except that FIG. 3C has a different distribution of threshold-voltage transistors than FIG. 2A.

In SDFQ 330C of FIG. 3C, in addition to some but not all of the FETs being configured with Vt_low and some but not all of the FETs being configured with Vt_std, some but not all of the FETs are configured with Vt_high. SDFQ 330C is an example of cell region 102B of FIG. 1B. More particularly, the FETs of NS inverters 348(5) and 348(6) of clock buffer 346 have Vt_low. The FETs of scan-buffer 344, multiplexer 332, NS inverter 348(1) of primary latch 336, internal buffer 341, NS inverter 348(2) of secondary latch 338, and output buffer 342 have Vt_std. The FETs of sleepy inverter 350(1) of primary latch 336 and sleepy inverter 350(2) of secondary latch 338 have Vt_high.

In terms of proportions relative to the total number of transistors, 12.50% of the FETs have Vt_low, 62.50% of the FETs have Vt_std and 25.00% of the FETs have Vt_high. Row 3 of Table 2 summarizes the mix of threshold-voltage transistors in SDFQ 330C of FIG. 3C.

The other approach's counterpart to SDFQ 330A(1) of FIG. 3A(1) is also a counterpart to SDFQ 330C of FIG. 3C. Accordingly, SDFQ 330C is an improvement over the other approach's counterpart at least for reasons that SDFQ 330A(1) is an improvement of the other approach's counterpart.

FIG. 3D(1) is a block diagram of an SDFQ 330D(1), in accordance with some embodiments.

SDFQ 330D(1) is similar to SDFQ 330A(1) of FIG. 3A(1) except that the mix of different threshold-voltage transistors in SDFQ 330D(1) is different than in SDFQ 330A(1). FIG. 3D(1) also is a block diagram equivalent of the schematic circuit diagram of FIG. 2A except that FIG. 3D(1) has a different distribution of threshold-voltage transistors than FIG. 2A.

In SDFQ 330D(1) of FIG. 3D(1), in addition to some but not all of the FETs being configured with Vt_low and some but not all of the FETs being configured with Vt_std, some but not all of the FETs are configured with Vt_high. SDFQ 330D(1) is an example of cell region 102B of FIG. 1B. More particularly, the FETs of NS inverters 348(5) and 348(6) of clock buffer 346 and the FETs of multiplexer 332 have Vt_low. The FETs of scan-buffer 344, NS inverter 348(1) of primary latch 336, internal buffer 341, NS inverter 348(2) of secondary latch 338, and output buffer 342 have Vt_std. The FETs of sleepy inverter 350(1) of primary latch 336 and sleepy inverter 350(2) of secondary latch 338 have Vt_high.

In terms of proportions relative to the total number of transistors, 43.75% of the FETs have Vt_low, 31.25% of the FETs have Vt_std and 25.00% of the FETs have Vt_high. Row 4 of Table 2 summarizes the mix of threshold-voltage transistors in SDFQ 330D(1) of FIG. 3D(1).

The other approach's counterpart to SDFQ 330A(1) of FIG. 3A(1) is also a counterpart to SDFQ 330D(1) of FIG. 3D(1). Accordingly, SDFQ 330D(1) is an improvement over the other approach's counterpart at least for reasons that SDFQ 330A(1) is an improvement of the other approach's counterpart.

FIG. 3D(2) is a layout diagram 330D(2), in accordance with some embodiments.

More particularly, layout diagram 330D(2) is a representation of the block diagram of SDFQ 330D(1) of FIG. 3D(1).

In FIG. 3D(2), the transistors in boxes B, D & E, A and F1 have Vt_low. The transistors in boxes I, J and C have Vt_std. The transistors in boxes F2, H and G have Vt_high. Again, correspondences between boxes A, B, C, D & E, F1, F2, G, H, I and J in the layout diagram of FIG. 3D(2) and the components of SDFQ 330D(1) of FIG. 3D(1) are shown above in the mapping of Table 3.

FIG. 3E(1) is block diagram of an SDFQ 330E(1), in accordance with some embodiments.

SDFQ 330E(1) is similar to SDFQ 330A(1) of FIG. 3A(1) except that the mix of different threshold-voltage transistors in SDFQ 330E(1) is different than in SDFQ 330A(1). FIG. 3E(1) also is a block diagram equivalent of the schematic circuit diagram of FIG. 2A except that FIG. 3E(1) has a different distribution of threshold-voltage transistors than FIG. 2A. SDFQ 330E(1) is an example of cell region 102A of FIG. 1A.

In SDFQ 330E(1) of FIG. 3E(1), the FETs of NS inverter 348(5) of clock buffer 346 and the FETs of output buffer 342 have Vt_low. The FETs of scan-buffer 344, NS inverter 348(6) of clock buffer 346, multiplexer 332, NS inverter 348(1) and sleepy inverter 350(1) of primary latch 336, internal buffer 341, and NS inverter 348(2) and sleepy inverter 350(2) of secondary latch 338 have Vt_std. In terms of proportions relative to the total number of transistors, 12.50% of the FETs have Vt_low and 87.5% of the FETs have Vt_std. Row 5 of Table 2 summarizes the mix of threshold-voltage transistors in SDFQ 330E(1) of FIG. 3E(1).

The other approach's counterpart to SDFQ 330A(1) of FIG. 3A(1) is also a counterpart to SDFQ 330E(1) of FIG. 3E(1). Accordingly, SDFQ 330E(1) is an improvement over the other approach's counterpart at least for reasons that SDFQ 330A(1) is an improvement of the other approach's counterpart.

FIG. 3E(2) is a layout diagram 330E(2), in accordance with some embodiments.

More particularly, layout diagram 330E(2) is a representation of the block diagram of SDFQ 330E(1) of FIG. 3E(1).

In FIG. 3E(2), the transistors in boxes J and A have Vt_low. The transistors in boxes C, D &E, A, F1, F2, H, G and I have Vt_std. Again, correspondences between boxes A, B, C, D & E, F1, F2, G, H, I and J in the layout diagram of FIG. 3E(2) and the components of SDFQ 330E(1) of FIG. 3E(1) are shown above in the mapping of Table 3.

FIG. 3F(1) is block diagram of an SDFQ 330F(1), in accordance with some embodiments.

SDFQ 330F(1) is similar to SDFQ 330A(1) of FIG. 3A(1) except that the mix of different threshold-voltage transistors in SDFQ 330F(1) is different than in SDFQ 330A(1). FIG. 3F(1) also is a block diagram equivalent of the schematic circuit diagram of FIG. 2A except that FIG. 3F(1) has a different distribution of threshold-voltage transistors than FIG. 2A. SDFQ 330F(1) is an example of cell region 102A of FIG. 1A.

In SDFQ 330F(1) of FIG. 3F(1), the FETs of NS inverter 348(5) of clock buffer 346 and the FETs of multiplexer 332 and output buffer 342 have Vt_low. The FETs of scan-buffer 344, NS inverter 348(6) of clock buffer 346, NS inverter 348(1) and sleepy inverter 350(1) of primary latch 336, internal buffer 341, and NS inverter 348(2) and sleepy inverter 350(2) of secondary latch 338 have Vt_std. In terms of proportions relative to the total number of transistors, 43.75% of the FETs have Vt_low and 56.25% of the FETs have Vt_std. Row 6 of Table 2 summarizes the mix of threshold-voltage transistors in SDFQ 330F(1) of FIG. 3F(1).

The other approach's counterpart to SDFQ 330A(1) of FIG. 3A(1) is also a counterpart to SDFQ 330F(1) of FIG. 3F(1). Accordingly, SDFQ 330F(1) is an improvement over the other approach's counterpart at least for reasons that SDFQ 330A(1) is an improvement of the other approach's counterpart.

FIG. 3F(2) is a layout diagram 330F(2), in accordance with some embodiments.

More particularly, layout diagram 330F(2) is a representation of the block diagram of SDFQ 330F(1) of FIG. 3F(1).

In FIG. 3F(2), the transistors in boxes A, D & E, J and F1 have Vt_low. The transistors in boxes F2, H, G, I, C and B have Vt_std. Again, correspondences between boxes A, B, C, D & E, F1, F2, G, H, I and J in the layout diagram of FIG. 3F(2) and the components of SDFQ 330F(1) of FIG. 3F(1) are shown above in the mapping of Table 3.

Figure 3G:
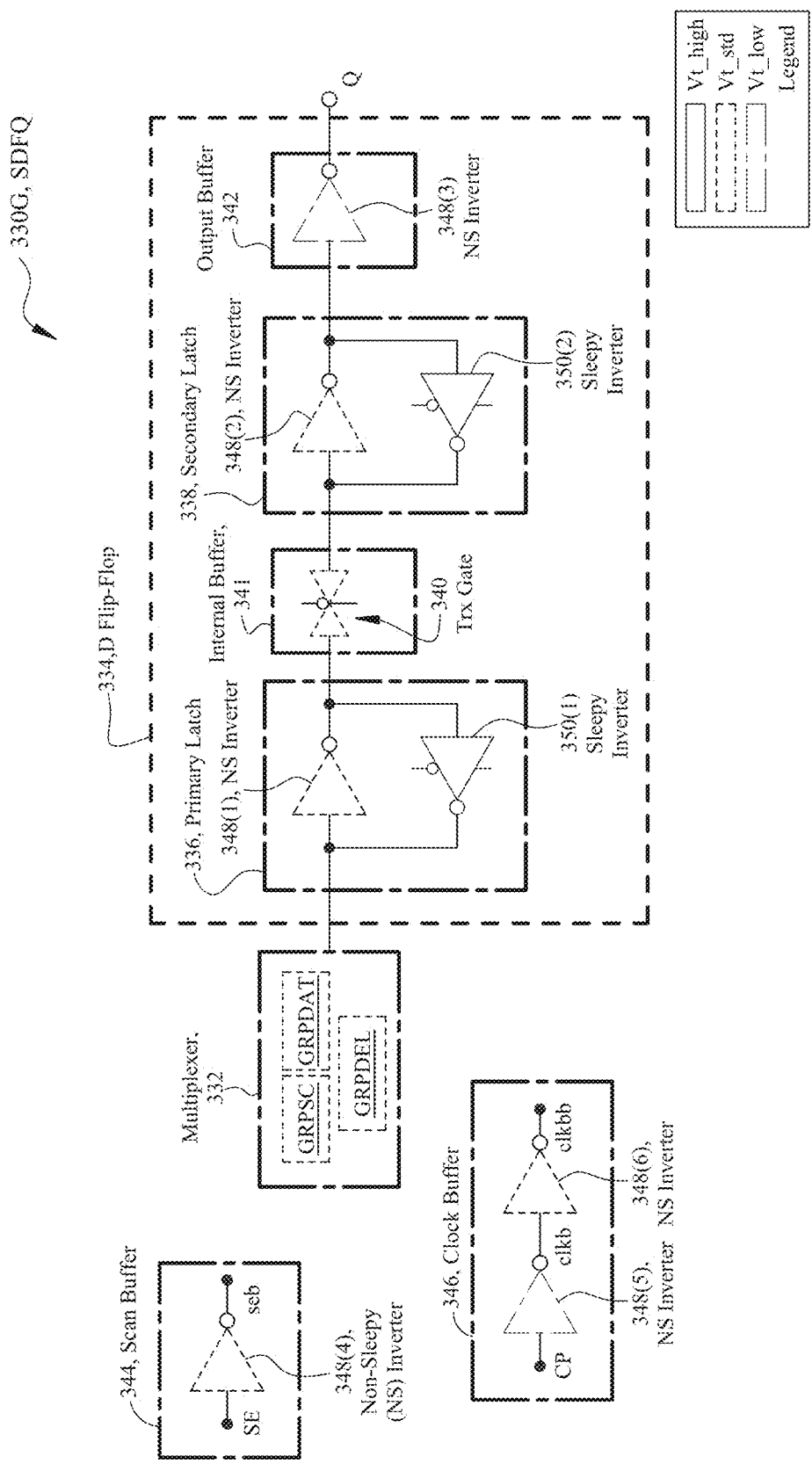

FIG. 3G is block diagram of an SDFQ 330G, in accordance with some embodiments.

SDFQ 330G is similar to SDFQ 330A(1) of FIG. 3A(1) except that the mix of different threshold-voltage transistors in SDFQ 330G is different than in SDFQ 330A(1). FIG. 3G also is a block diagram equivalent of the schematic circuit diagram of FIG. 2A except that FIG. 3G has a different distribution of threshold-voltage transistors than FIG. 2A.

In SDFQ 330G of FIG. 3G, in addition to some but not all of the FETs being configured with Vt_low and some but not all of the FETs being configured with Vt_std, some but not all of the FETs are configured with Vt_high. SDFQ 330G is an example of cell region 102B of FIG. 1B. More particularly, the FETs of NS inverter 348(5) of clock buffer 346 and the FETs of output buffer 342 have Vt_low. The FETs of scan-buffer 344, NS inverter 348(6) of clock buffer 346, multiplexer 332, NS inverter 348(1) of primary latch 336, internal buffer 341, and NS inverter 348(2) of secondary latch 338 have Vt_std. The FETs of sleepy inverter 350(1) of primary latch 336 and sleepy inverter 350(2) of secondary latch 338 have Vt_high. In terms of proportions relative to the total number of transistors, 12.50% of the FETs have Vt_low, 62.5% of the FETs have Vt_std and 25.00% have Vt_high. Row 7 of Table 2 summarizes the mix of threshold-voltage transistors in SDFQ 330G of FIG. 3G.

The other approach's counterpart to SDFQ 330A(1) of FIG. 3A(1) is also a counterpart to SDFQ 330G of FIG. 3G. Accordingly, SDFQ 330G is an improvement over the other approach's counterpart at least for reasons that SDFQ 330A(1) is an improvement of the other approach's counterpart.

FIG. 3H(1) is block diagram of an SDFQ 330H(1), in accordance with some embodiments.

SDFQ 330H(1) is similar to SDFQ 330A(1) of FIG. 3A(1) except that the mix of different threshold-voltage transistors in SDFQ 330H(1) is different than in SDFQ 330A(1). FIG. 3H(1) also is a block diagram equivalent of the schematic circuit diagram of FIG. 2A except that FIG. 3H(1) has a different distribution of threshold-voltage transistors than FIG. 2A.

In SDFQ 330H(1) of FIG. 3H(1), in addition to some but not all of the FETs being configured with Vt_low and some but not all of the FETs being configured with Vt_std, some but not all of the FETs are configured with Vt_high. SDFQ 330H(1) is an example of cell region 102B of FIG. 1B. More particularly, the FETs of NS inverter 348(5) of clock buffer 346 and the FETs of multiplexer 332 and output buffer 342 have Vt_low. The FETs of scan-buffer 344, NS inverter 348(6) of clock buffer 346, NS inverter 348(1) of primary latch 336, internal buffer 341, and NS inverter 348(2) of secondary latch 338 have Vt_std. The FETs of sleepy inverter 350(1) of primary latch 336 and sleepy inverter 350(2) of secondary latch 338 have Vt_high. In terms of proportions relative to the total number of transistors, 43.75% of the FETs have Vt_low, 31.25% of the FETs have Vt_std and 25.00% have Vt_high. Row 8 of Table 2 summarizes the mix of threshold-voltage transistors in SDFQ 330H(1) of FIG. 3H(1).

The other approach's counterpart to SDFQ 330A(1) of FIG. 3A(1) is also a counterpart to SDFQ 330H(1) of FIG. 3H(1). Accordingly, SDFQ 330H(1) is an improvement over the other approach's counterpart at least for reasons that SDFQ 330A(1) is an improvement of the other approach's counterpart.

FIG. 3H(2) is a layout diagram 330H(2), in accordance with some embodiments.

More particularly, layout diagram 330H(2) is a representation of the block diagram of SDFQ 330H(1) of FIG. 3H(1).

In FIG. 3H(2), the transistors in boxes A, D & E, J and F1 have Vt_low. The transistors in boxes G, I, C and B have Vt_std. The transistors in boxes F2 and H have Vt_high. Again, correspondences between boxes A, B, C, D & E, F1, F2, H(1), H, I and J in the layout diagram of FIG. 3H(2) and the components of SDFQ 330H(1) of FIG. 3H(1) are shown above in the mapping of Table 3.

FIG. 3I(1) is block diagram of an SDFQ 330I(1), in accordance with some embodiments.

SDFQ 330I(1) is similar to SDFQ 330A(1) of FIG. 3A(1) except that the mix of different threshold-voltage transistors in SDFQ 330I(1) is different than in SDFQ 330A(1). FIG. 3I(1) also is a block diagram equivalent of the schematic circuit diagram of FIG. 2A except that FIG. 3I(1) has a different distribution of threshold-voltage transistors than FIG. 2A. SDFQ 330I(1) is an example of cell region 102A of FIG. 1A.

In SDFQ 330I(1) of FIG. 3I(1), the FETs of NS inverter 348(6) of clock buffer 346 and the FETs of output buffer 342 have Vt_low. The FETs of scan-buffer 344, NS inverter 348(5) of clock buffer 346, multiplexer 332, NS inverter 348(1) and sleepy inverter 350(1) of primary latch 336, internal buffer 341, and NS inverter 348(2) and sleepy inverter 350(2) of secondary latch 338 have Vt_std. In terms of proportions relative to the total number of transistors, 12.5% of the FETs have Vt_low and 87.5% of the FETs have Vt_std. Row 9 of Table 2 summarizes the mix of threshold-voltage transistors in SDFQ 330I(1) of FIG. 3I(1).

The other approach's counterpart to SDFQ 330A(1) of FIG. 3A(1) is also a counterpart to SDFQ 330I(1) of FIG. 3I(1). Accordingly, SDFQ 330I(1) is an improvement over the other approach's counterpart at least for reasons that SDFQ 330A(1) is an improvement of the other approach's counterpart.

FIG. 3I(2) is a layout diagram 330I(2), in accordance with some embodiments.

More particularly, layout diagram 330I(2) is a representation of the block diagram of SDFQ 330I(1) of FIG. 3I(1).

In FIG. 3I(2), the transistors in boxes J and B have Vt_low. The transistors in boxes C, D & E, A, F1, F2, G, H and I have Vt_std. Again, correspondences between boxes A, B, C, D & E, F1, F2, G, H, I and J in the layout diagram of FIG. 3I(2) and the components of SDFQ 330I(1) of FIG. 3I(1) are shown above in the mapping of Table 3.

Figure 3J:
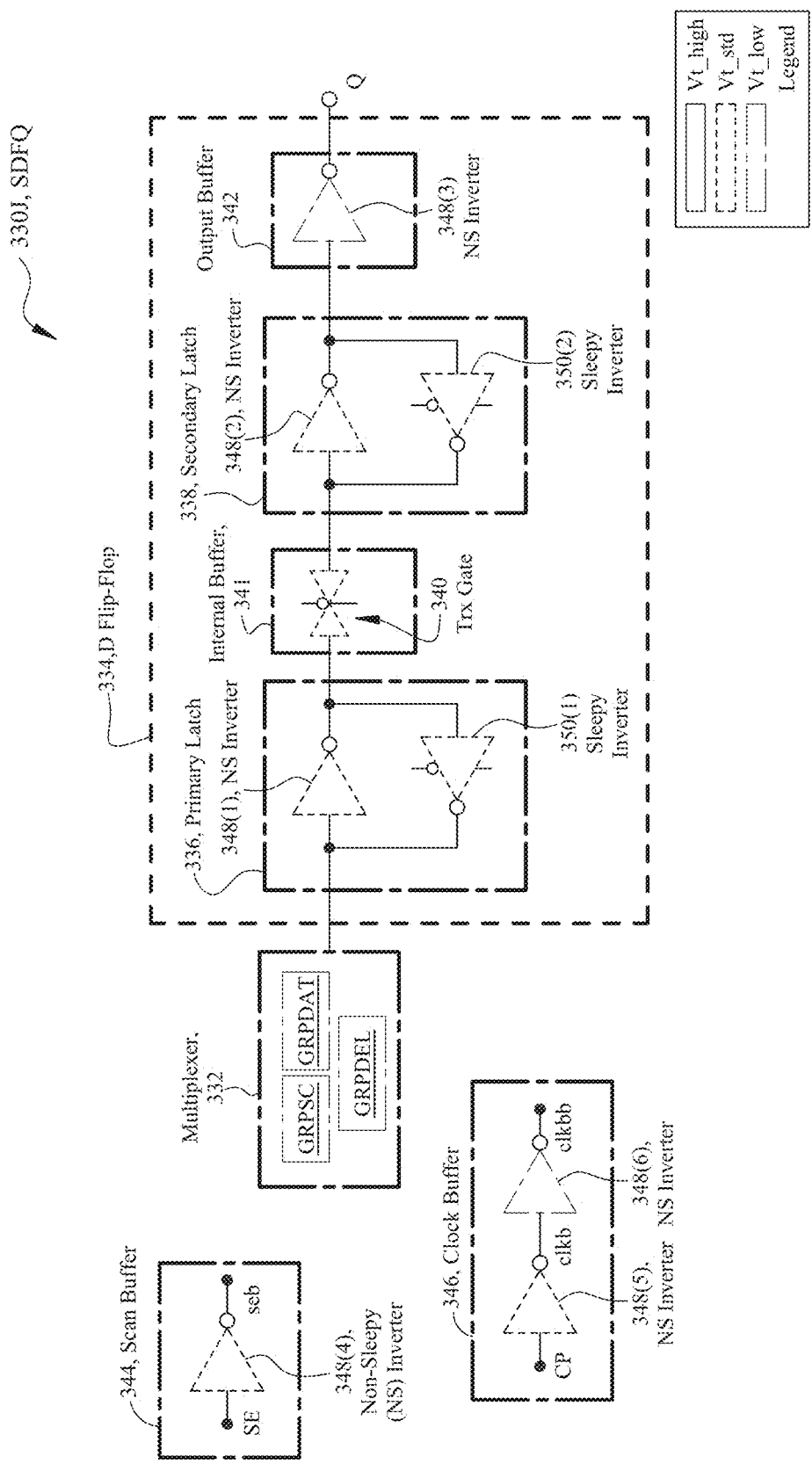

FIG. 3J is block diagram of an SDFQ 330J, in accordance with some embodiments.

SDFQ 330J is similar to SDFQ 330A(1) of FIG. 3A(1) except that the mix of different threshold-voltage transistors in SDFQ 330J is different than in SDFQ 330A(1). FIG. 3J also is a block diagram equivalent of the schematic circuit diagram of FIG. 2A except that FIG. 3J has a different distribution of threshold-voltage transistors than FIG. 2A. SDFQ 330J is an example of cell region 102A of FIG. 1A.

In SDFQ 330J of FIG. 3J, the FETs of NS inverter 348(6) of clock buffer 346 and the FETs of multiplexer 332 and output buffer 342 have Vt_low. The FETs of scan-buffer 344, NS inverter 348(5) of clock buffer 346, NS inverter 348(1) and sleepy inverter 350(1) of primary latch 336, internal buffer 341, and NS inverter 348(2) and sleepy inverter 350(2) of secondary latch 338 have Vt_std. In terms of proportions relative to the total number of transistors, 43.75% of the FETs have Vt_low and 56.25% of the FETs have Vt_std. Row 10 of Table 2 summarizes the mix of threshold-voltage transistors in SDFQ 330J of FIG. 3J.

The other approach's counterpart to SDFQ 330A(1) of FIG. 3A(1) is also a counterpart to SDFQ 330J of FIG. 3J. Accordingly, SDFQ 330J is an improvement over the other approach's counterpart at least for reasons that SDFQ 330A(1) is an improvement of the other approach's counterpart.

Figure 3K:
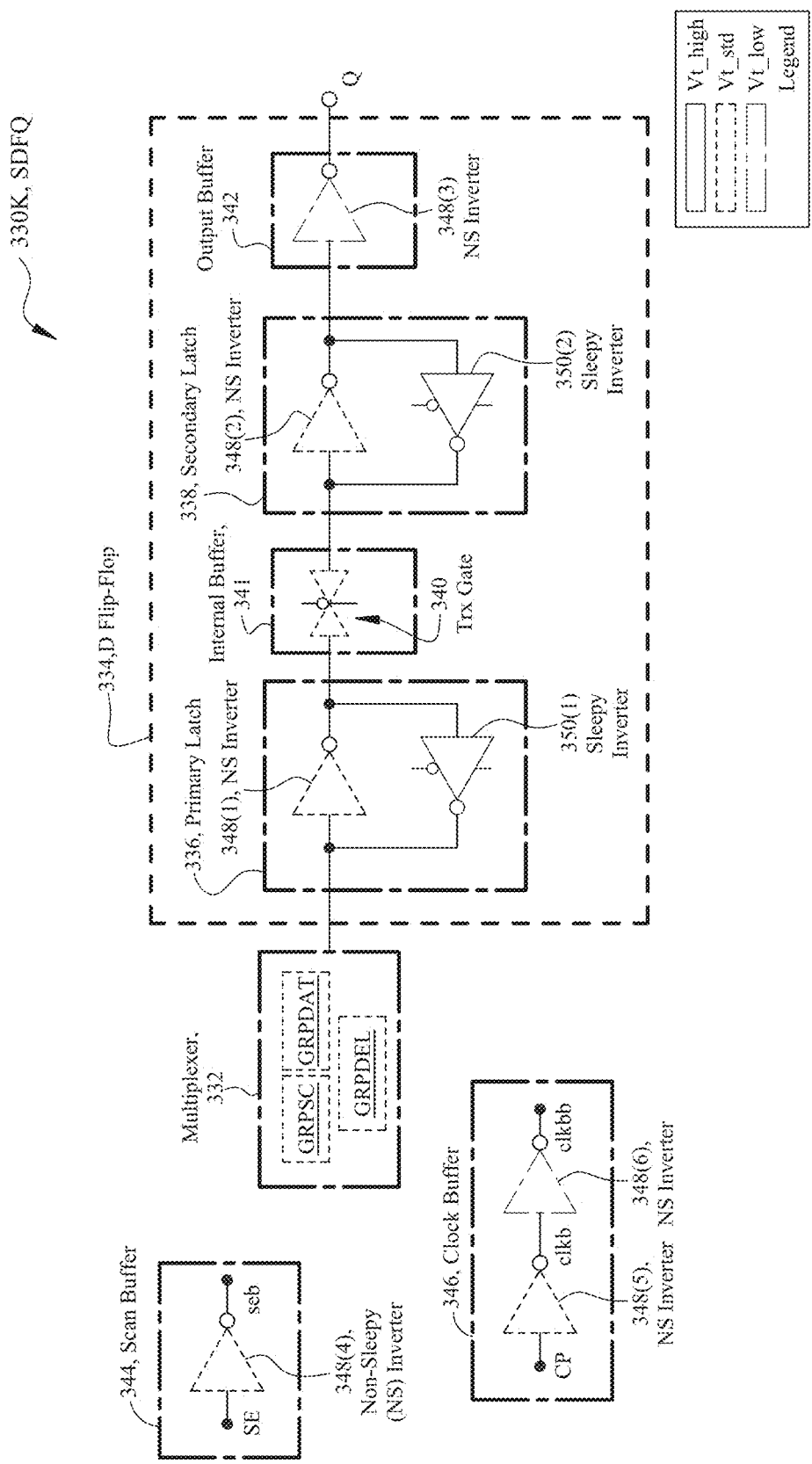

FIG. 3K is block diagram of an SDFQ 330K, in accordance with some embodiments.

SDFQ 330K is similar to SDFQ 330A(1) of FIG. 3A(1) except that the mix of different threshold-voltage transistors in SDFQ 330K is different than in SDFQ 330A(1). FIG. 3K also is a block diagram equivalent of the schematic circuit diagram of FIG. 2A except that FIG. 3K has a different distribution of threshold-voltage transistors than FIG. 2A.

In SDFQ 330K of FIG. 3K, in addition to some but not all of the FETs being configured with Vt_low and some but not all of the FETs being configured with Vt_std, some but not all of the FETs are configured with Vt_high. SDFQ 330K is an example of cell region 102B of FIG. 1B. More particularly, the FETs of NS inverter 348(6) of clock buffer 346 and the FETs of output buffer 342 have Vt_low. The FETs of scan-buffer 344, multiplexer 332, NS inverter 348(6) of clock buffer 346, NS inverter 348(1) of primary latch 336, internal buffer 341, and NS inverter 348(2) of secondary latch 338 have Vt_std. The FETs of sleepy inverter 350(1) of primary latch 336 and sleepy inverter 350(2) of secondary latch 338 have Vt_high. In terms of proportions relative to the total number of transistors, 12.50% of the FETs have Vt_low, 62.5% of the FETs have Vt_std and 25.00% have Vt_high. Row 11 of Table 2 summarizes the mix of threshold-voltage transistors in SDFQ 330K of FIG. 3K.

The other approach's counterpart to SDFQ 330A(1) of FIG. 3A(1) is also a counterpart to SDFQ 330K of FIG. 3K. Accordingly, SDFQ 330K is an improvement over the other approach's counterpart at least for reasons that SDFQ 330A(1) is an improvement of the other approach's counterpart.

FIG. 3L(1) is block diagram of an SDFQ 330L(1), in accordance with some embodiments.

SDFQ 330L(1) is similar to SDFQ 330A(1) of FIG. 3A(1) except that the mix of different threshold-voltage transistors in SDFQ 330L(1) is different than in SDFQ 330A(1). FIG. 3L(1) also is a block diagram equivalent of the schematic circuit diagram of FIG. 2A except that FIG. 3L(1) has a different distribution of threshold-voltage transistors than FIG. 2A.

In SDFQ 330L(1) of FIG. 3L(1), in addition to some but not all of the FETs being configured with Vt_low and some but not all of the FETs being configured with Vt_std, some but not all of the FETs are configured with Vt_high. SDFQ 330L(1) is an example of cell region 102B of FIG. 1B. More particularly, the FETs of NS inverter 348(6) of clock buffer 346 and the FETs of multiplexer 332 and output buffer 342 have Vt_low. The FETs of scan-buffer 344, NS inverter 348(5) of clock buffer 346, NS inverter 348(1) of primary latch 336, internal buffer 341, and NS inverter 348(2) of secondary latch 338 have Vt_std. The FETs of sleepy inverter 350(1) of primary latch 336 and sleepy inverter 350(2) of secondary latch 338 have Vt_high. In terms of proportions relative to the total number of transistors, 43.75% of the FETs have Vt_low, 31.25% of the FETs have Vt_std and 25.00% have Vt_high. Row 12 of Table 2 summarizes the mix of threshold-voltage transistors in SDFQ 330L(1) of FIG. 3L(1).

The other approach's counterpart to SDFQ 330A(1) of FIG. 3A(1) is also a counterpart to SDFQ 330L(1) of FIG. 3L(1). Accordingly, SDFQ 330L(1) is an improvement over the other approach's counterpart at least for reasons that SDFQ 330A(1) is an improvement of the other approach's counterpart.

FIG. 3L(2) is a layout diagram 330L(2), in accordance with some embodiments.

More particularly, layout diagram 330L(2) is a representation of the block diagram of SDFQ 330L(1) of FIG. 3L(1).

In FIG. 3L(2), the transistors in boxes B, D & E, J and F1 have Vt_low. The transistors in boxes G, I, C and A have Vt_std. The transistors in boxes F2 and H have Vt_high. Again, correspondences between boxes A, B, C, D & E, F1, F2, L(1), H, I and J in the layout diagram of FIG. 3L(2) and the components of SDFQ 330L(1) of FIG. 3L(1) are shown above in the mapping of Table 3.

In general, each of the SDFQs of FIGS. 2A-2B, 3A(1)-(2), 3B(1)-(2), 3C, 3D(1)-(2), 3E(1)-(2), 3F(1)-(2), 3G, 3H(1)-(2), 3I(1)-(2), 3J, 3K and 3L(1)-(2): uses transistors having a mix of threshold-voltages; and is a single bit SDFQ. The use of transistors having a mix of threshold-voltages is also applicable to multibit SDFQs (FIGS. 4A-4C, 4D(1)-4D(3) and 4E-4F).

Figure 4A:
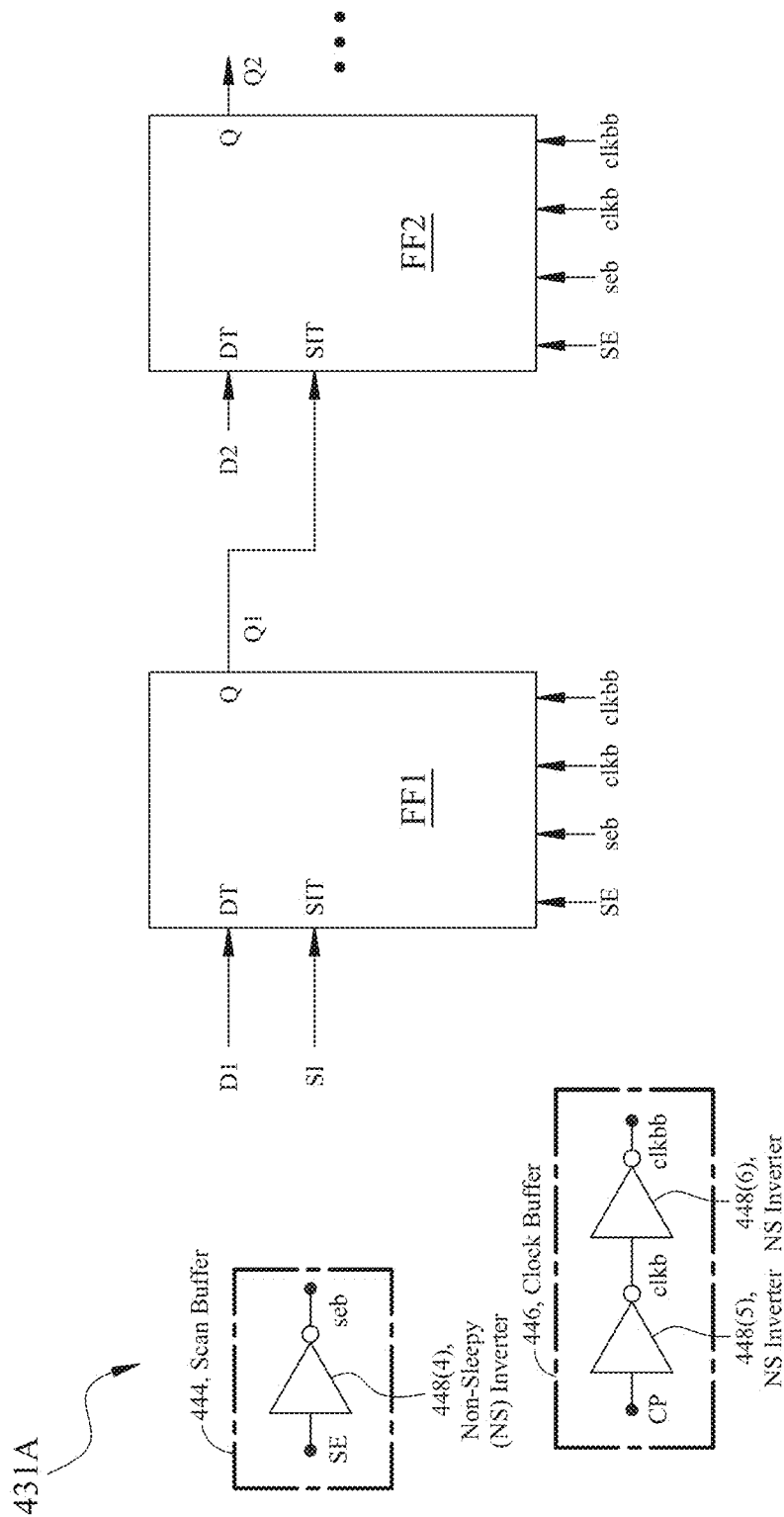
FIGS. 4A, 4C, 4D(1) and 4E-4F are block diagrams, in accordance with some embodiments.

FIG. 4A is a block diagram of a multibit flip-flop device 431A, in accordance with some embodiments.

In some embodiments of multibit flip-flop device 431A, e.g., FIGS. 4C, 4D(1)-4D(3), some but not all of the transistors are configured with Vt_low and some but not all of the transistors are configured with Vt_std, as discussed below. In such embodiments, multibit flip-flop device 431A is an example of cell region 102A of FIG. 1A. In some embodiments of multibit flip-flop device 431A, e.g., FIGS. 4E-4F, some but not all of the transistors are configured with Vt_low, some but not all of the transistors are configured with Vt_std, and some but not all of the transistors are configured with Vt_high, as discussed below. In such embodiments, multibit flip-flop device 431A is an example of cell region 102B of FIG. 1B.

In FIG. 4A, multibit flip-flop device 431A includes a flip-flop FF1 and a flip-flop FF2. Each of flip-flops FF1 and FF2 is an SDFQ. Each of flip-flops FF1 and FF2 is an example of SDFQs 230 of FIGS. 2A and 330A(1) of FIG. 3A(1) with two exceptions. The first exception is that flip-flops FF1 and FF2 share scan buffer 444 and clock buffer 446 instead of each of flip-flips FF1 and FF2 having its own instance of scan buffer 444 and its own instance of clock buffer 446. The second exception is that the mix of different threshold-voltage transistors in each of flip-flops FF1 and FF2 is different than the mix of different threshold-voltage transistors in SDFQs 230 of FIGS. 2A and 330A(1) of FIG. 3A(1).

Each of flip-flops FF1 and FF2 includes a data terminal DT and a scan input terminal SIT. Data input signals D1 and D2 are received by flip-flops FF1 and FF2 correspondingly at data terminal DT. A scan input signal SI is received by flip-flop FF1 at scan input terminal SIT. Flip-flops FF1 and FF2 are connected in series. Output bit value Q1 of flip-flop FF1 is received by FF2 at scan input terminal SIT. Each of flip-flops FF1 and FF2 also includes terminals to receive scan enable signals SE and seb and terminals to receive clock signals clkb and clkbb.

The operation of flip-flops FF1 and FF2 is coordinated by clock signal CP. During normal, i.e., non-scan/test, operation, the scan enable signal SE is in a deactivated state so that signals on scan input terminals SIT are not selected but rather data signals D1 and D2 are selected correspondingly by flip-flops FF1 and FF2. During an oscillation of clock signal CP (assuming proper functioning of flip-flops FF1 and FF2): the bit value of data input signal D1 at data terminal DT of flip-flop FF1 is transferred from data terminal DT of flip-flop FF1 to output terminal Q of flip-flop FF1 as output bit value Q1; and the bit value of data input signal D2 at data terminal DT of flip-flop FF2 is transferred from data terminal DT of flip-flop FF2 to output terminal Q of flip-flop FF2 as output bit value Q2.

However, during scan/test operation, scan enable signal SE is in an activated state so that: data signal D1 and D2 are ignored correspondingly by flip-flops FF1 and FF2; scan input signal SI is selected by flip-flop FF1; and the output bit value Q1 is selected by flip-flop FF2. During a first oscillation of clock signal CP (assuming proper functioning of flip-flop FF1), the bit value of scan input signal SI at scan input terminal SIT of flip-flop FF1 is transferred from scan input terminal SIT of flip-flop FF1 to output terminal Q of flip-flop FF1 as output bit value Q1. During a second oscillation of clock signal CP (assuming proper functioning of flip-flop FF2), output bit value Q1 of flip-flop FF1 is transferred to output terminal Q of flip-flop FF2. By the end of the second clock cycle (assuming proper functioning of flip-flops FF1 and FF2), output bit value Q2 of flip-flop FF2 corresponds to scan input signal SI.

FIG. 4B is a Table 4, in accordance with some embodiments.

In FIG. 4B, Table 4 summarizes the mix of threshold-voltage transistors in the multibit SDFQs of FIGS. 4C, 4D(1), 4E and 4F (discussed below).

Figure 4C:
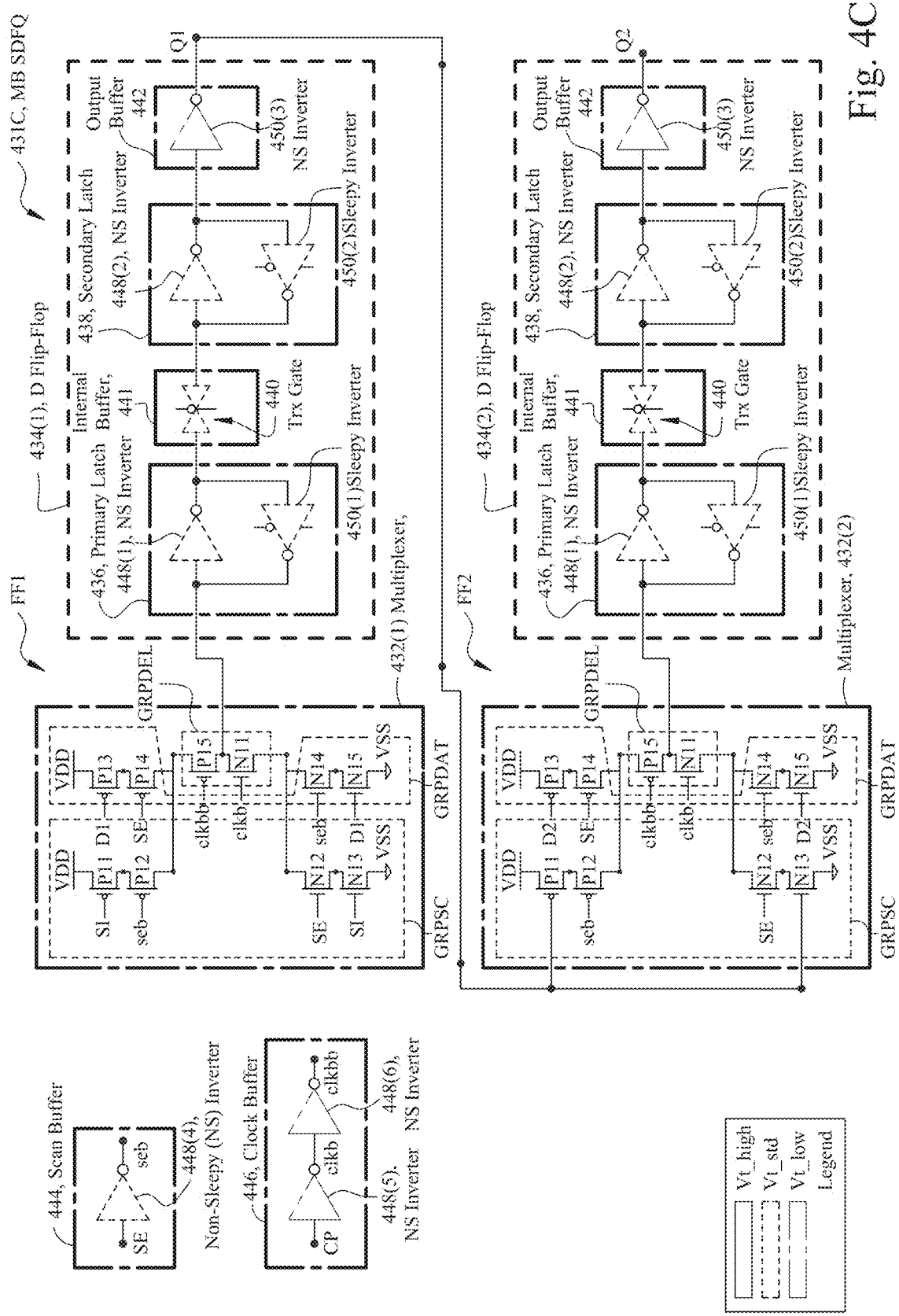

FIG. 4C is a schematic circuit diagram of a multibit SDFQ 431C, in accordance with some embodiments.

In FIG. 4C, multibit (MB) SDFQ 431C includes scan buffer 444 (which itself includes NS inverter 448(4)), clock buffer 446 and flip-flops FF1 and FF2. FF1 includes multiplexer 432(1) and D flip-flop 434(1). FF2 includes multiplexer 432(2) and D flip-flop 434(2). Output Q1 of FF1 is connected to the gate terminals of transistors P11 and N13 of scan group GRPSC of multiplexer 432(2) of FF2. MB SDFQ 431C is an example of cell region 102A of FIG. 1A. Each of D flip-flops 434(1) and 434(2) includes: primary latch 436 which itself includes NS inverter 448(1) and sleepy inverter 450(1); internal buffer 441 which itself includes transmission gate 440; secondary latch 438 which itself includes NS inverter 448(2) and sleepy inverter 450(2); and output buffer 442 which itself includes NS inverter 450(3).

In MB SDFQ 431C of FIG. 4C, the FETs of NS inverters 448(5) and 448(6) of clock buffer 446 and the FETs of output buffers 422 of D flip-flops 434(1)-434(2) have Vt_low. The other FETs in MB SDFQ 431C have Vt_std. In terms of proportions relative to the total number of transistors, =14.29% of the FETs have Vt_low and =85.71% of the FETs have Vt_std. Row 1 of Table 4 summarizes the mix of threshold-voltage transistors in MB SDFQ 431C of FIG. 4C.

FIG. 4D(1) is a schematic circuit diagram of an MB SDFQ 431D(1), in accordance with some embodiments.

MB SDFQ 431D(1) is similar to MB SDFQ 431C of FIG. 4C except that the mix of different threshold-voltage transistors in MB SDFQ 431D(1) is different than in MB SDFQ 431C. MB SDFQ 431D(1) is an example of cell region 102A of FIG. 1A.

In MB SDFQ 431D(1) of FIG. 4D(1), the FETs of NS inverters 448(5) and 448(6) of clock buffer 446, the FETs of multiplexers 432(1)-432(2) and the FETs of output buffers 442 of D flip-flops 434(1)-434(2) have Vt_low. The other FETs in MB SDFQ 431D(1) have Vt_std. In terms of proportions relative to the total number of transistors, 50% of the FETs have Vt_low and 50% of the FETs have Vt_std. Row 2 of Table 4 summarizes the mix of threshold-voltage transistors in MB SDFQ 431D(1) of FIG. 4D(1).

FIG. 4D(2) is a schematic circuit diagram, in accordance with some embodiments.

FIG. 4D(2) is a simplified version of FIG. 4D(1). FIG. 4D(2) represents a legend for interpreting the layout diagram of FIG. 4D(3), discussed below.

In FIG. 4D(2), the transistors of MB SDFQ 431D(1) are correspondingly enclosed by boxes A, B, C, D & E, F1, F2, G, H, I and J. To show their locations in a layout diagram, boxes A, B, C, D & E, F1, F2, G, H, I and J are correspondingly superimposed on FIG. 4D(3).

FIG. 4D(3) is a layout diagram 431D(3), in accordance with some embodiments.

More particularly, layout diagram 431D(3) is a representation of the schematic circuit diagram of MB SDFQ 431D (1) of FIG. 4D(1). In FIG. 4D(3), the transistors in boxes D & E, F1, J, A and B have Vt_low. The transistors in boxes C, F2, I, G, and H have Vt_std.

Figure 4E:
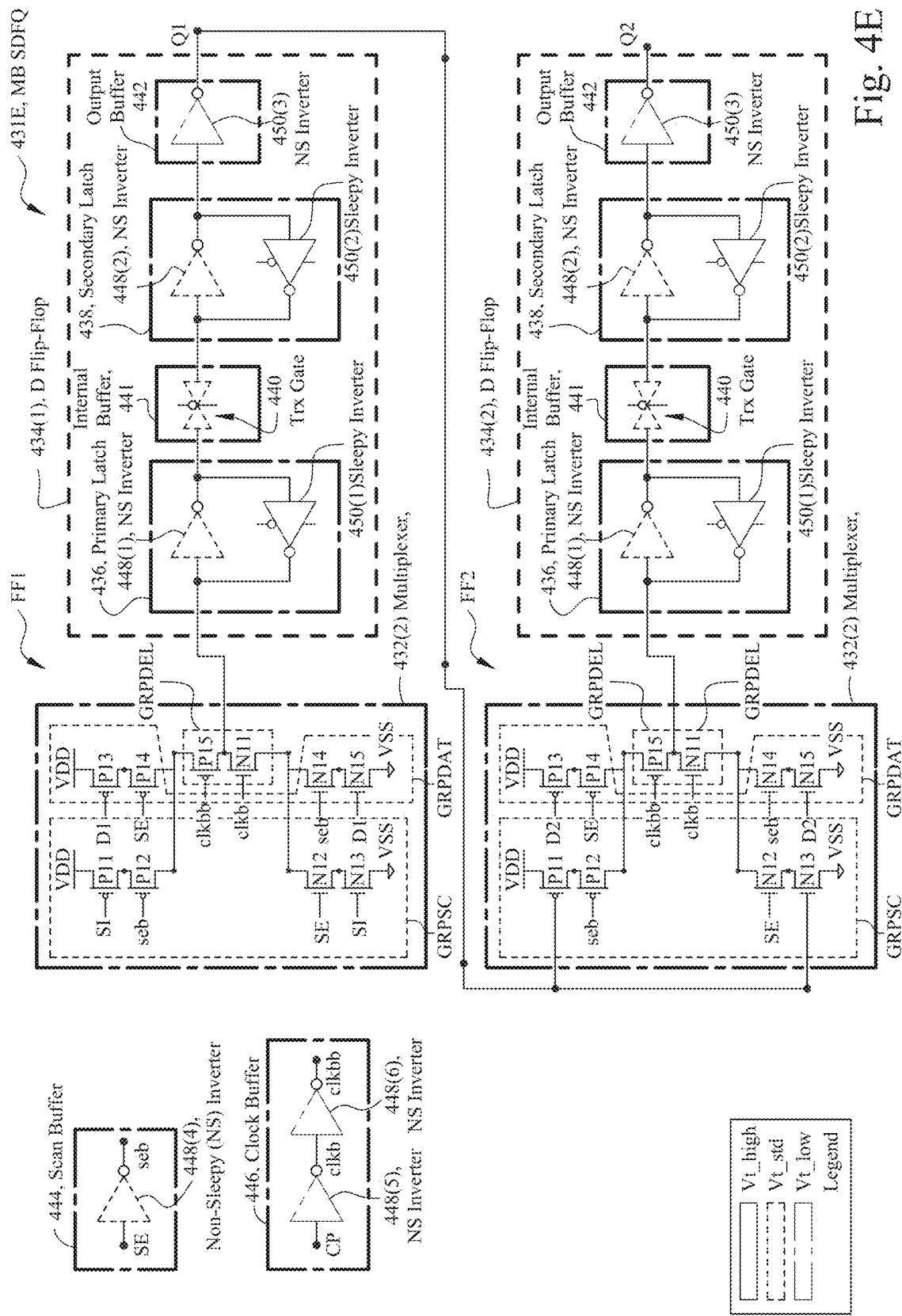
FIG. 4B is a table, in accordance with some embodiments.

FIG. 4E is a schematic circuit diagram of an MB SDFQ 431E, in accordance with some embodiments.

MB SDFQ 431E is similar to MB SDFQ 431C of FIG. 4C except that the mix of different threshold-voltage transistors in MB SDFQ 431E is different than in MB SDFQ 431C. MB SDFQ 431E is an example of cell region 102B of FIG. 1B.

In MB SDFQ 431E of FIG. 4E, the FETs of NS inverters 448(5) and 448(6) of clock buffer 446, and the FETs of output buffers 442 of D flip-flops 434(1)-434(2) have Vt_low. The FETs of sleepy inverters 450(1) of primary latches 436 of each of D flip-flops 434(1)-434(2) and the FETs of sleepy inverters 450(2) of secondary latches 438 of each of D flip-flops 434(1)-434(2) have Vt_high. The other FETs in MB SDFQ 431E have Vt_std. In terms of proportions relative to the total number of transistors, ≈14.29% of the FETs have Vt_low, ≈57.14% of the FETs have Vt_std, and ≈28.57% of the FETs have Vt_high. Row 3 of Table 4 summarizes the mix of threshold-voltage transistors in MB SDFQ 431E of FIG. 4E.

Figure 4F:
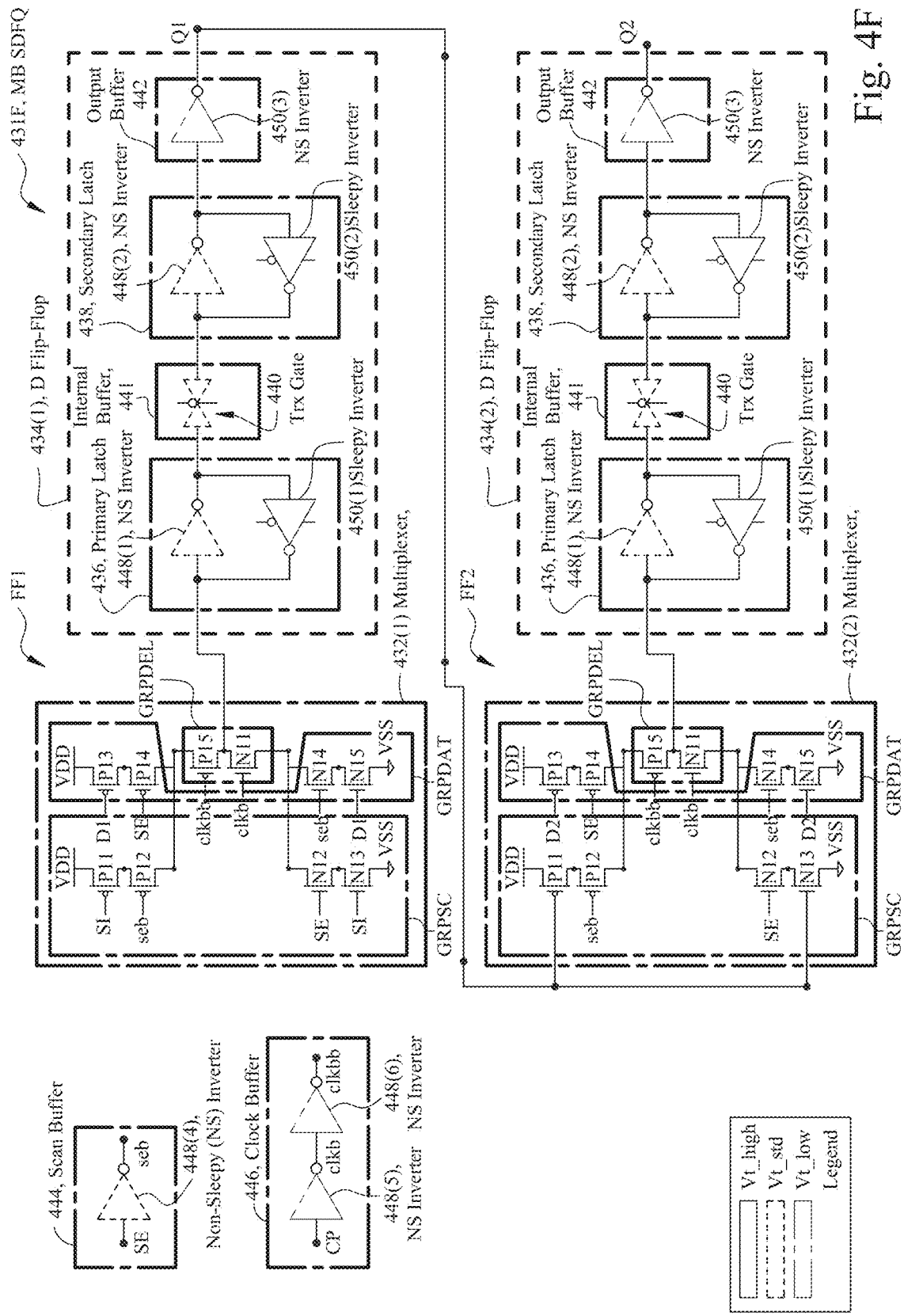

FIG. 4F is a schematic circuit diagram of an MB SDFQ 431F, in accordance with some embodiments.

MB SDFQ 431F is similar to MB SDFQ 431C of FIG. 4C except that the mix of different threshold-voltage transistors in MB SDFQ 431F is different than in MB SDFQ 431C. MB SDFQ 431F is an example of cell region 102B of FIG. 1B.

In MB SDFQ 431F of FIG. 4F, the FETs of NS inverters 448(5) and 448(6) of clock buffer 446, the FETs of multiplexers 432(1)-432(2) and the FETs of output buffers 442 of D flip-flops 434(1)-434(2) have Vt_low. The FETs of sleepy inverters 448(1) of primary latches 436 of each of D flip-flops 434(1)-434(2) and the FETs of sleepy inverters 448(2) of secondary latches 438 of each of D flip-flops 434(1)-434(2) have Vt_high. The other FETs in MB SDFQ 431F have Vt_std. In terms of proportions relative to the total number of transistors, 50.00% of the FETs have Vt_low, ≈21.43% of the FETs have Vt_std, and ≈28.57% of the FETs have Vt_high. Row 4 of Table 4 summarizes the mix of threshold-voltage transistors in MB SDFQ 431F of FIG. 4F.

The use of transistors having a mix of threshold-voltages has been discussed in the context of flip-flop devices. The use of transistors having a mix of threshold-voltages is also applicable to combinational logic (FIGS. 5A(1)-5A(2), 5B(1)-5B(2), 5C(1)-5C(2), 5D(1)-5D(2) and 5E-5F).

FIGS. 5A(1) and 5B(1) are corresponding schematic circuit diagrams of inverters, in accordance with some embodiments.

In FIG. 5A(1), PFET P51 has Vt_low, whereas NFET N52 has Vt_std. In FIG. 5B(1), PFET P51 has Vt_std, whereas NFET N52 has Vt_low.

FIGS. 5A(2) and 5B(2) are corresponding layout diagrams, in accordance with some embodiments.

More particularly, the layout diagram of FIG. 5A(2) is a representation of the inverter of FIG. 5A(1). The layout diagram of FIG. 5B(2) is a representation of the inverter of FIG. 5B(1).

FIGS. 5C(1), 5D(1), 5E and 5F are corresponding schematic circuit diagrams of NAND gates, in accordance with some embodiments.

In FIG. 5C(1), PFET P61 and NFET N61 have Vt_low, whereas PFET P62 and NFET N62 have Vt_std. In FIG. 5D(1), PFET P62 and NFET N62 have Vt_low, whereas PFET P61 and NFET N61 have Vt_std.

Figure 5F:
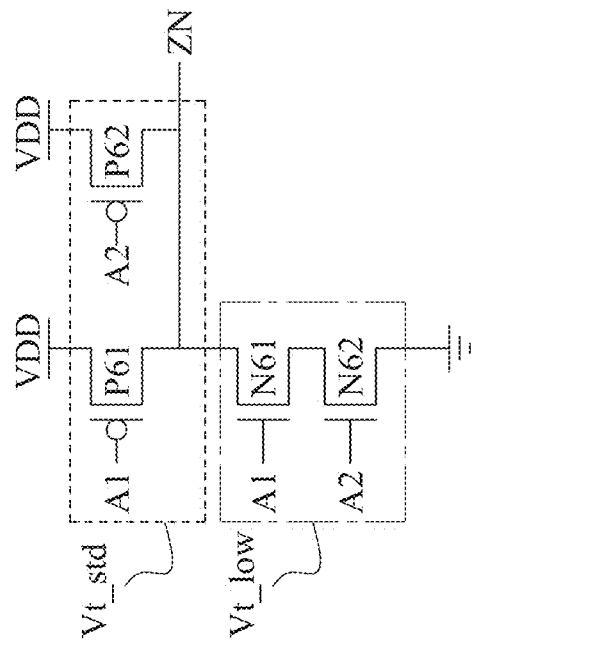
FIGS. 5A(1), 5B(1), 5C(1), 5D(1), 5E and 5F are corresponding schematic circuit diagrams of inverters, in accordance with some embodiments.
Figure 5E:
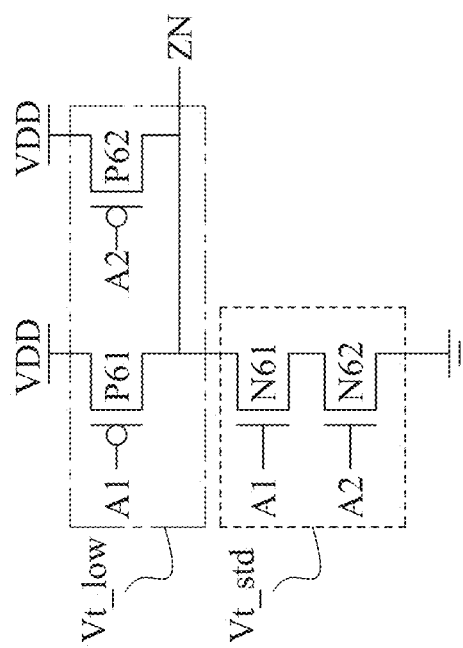

In FIG. 5E, PFETs P61 and P62 have Vt_low, whereas NFETs N61 and N62 have Vt_std. In FIG. 5F, PFETs P61 and P62 have Vt_std, whereas NFETs N61 and N62 have Vt_low.

FIGS. 5C(2) and 5D(2) are corresponding layout diagrams, in accordance with some embodiments.

More particularly, the layout diagram of FIG. 5C(2) is a representation of the inverter of FIG. 5C(1). The layout diagram of FIG. 5D(2) is a representation of the inverter of FIG. 5D(1).

Figure 6A:
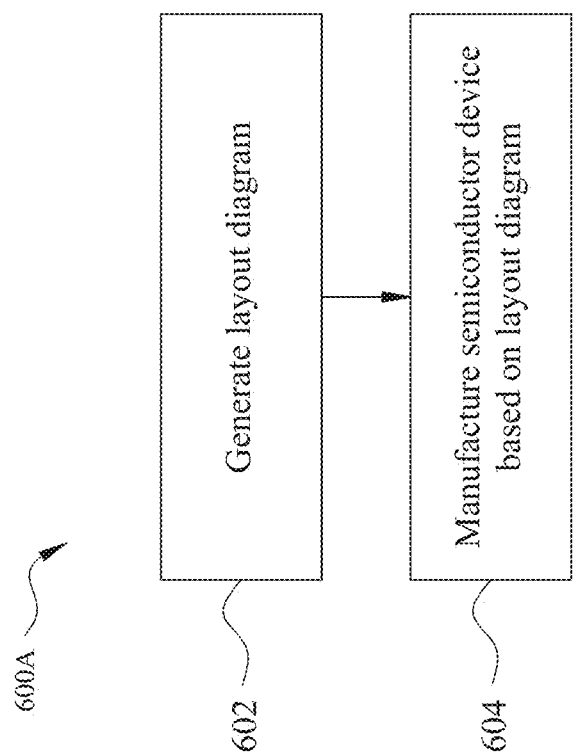
FIG. 6A is a flow diagram of a method of manufacturing a semiconductor device, in accordance with some embodiments.

FIG. 6A is a flow diagram 600A of a method of manufacturing a semiconductor device, in accordance with some embodiments.

The method of flowchart 600A is implementable, for example, using EDA system 700 (FIG. 7, discussed below) and an IC manufacturing system 800 (FIG. 8, discussed below), in accordance with some embodiments. Examples of a semiconductor device which can be manufactured according to the method of flowchart 600A include the semiconductor devices of FIGS. 1A-1B, semiconductor devices that implement the schematic circuit diagrams disclosed herein, semiconductor devices that implement the block diagrams disclosed herein, semiconductor devices based on the layout diagrams disclosed herein, or the like.

In FIG. 6A, the method of flowchart 600A includes blocks 602-604. At block 602, a layout diagram is generated which, among other things, includes one or more of layout diagrams disclosed herein, or the like. Block 602 is implementable, for example, using EDA system 700 (FIG. 7, discussed below), in accordance with some embodiments. From block 602, flow proceeds to block 604.

At block 604, based on the layout diagram, at least one of the following is performed: (A) one or more photolithographic exposures are made or (b) one or more semiconductor masks are fabricated or (C) one or more components in a layer of a semiconductor device are fabricated. See discussion below of IC manufacturing system 800 in FIG. 8 below.

Figure 6B:
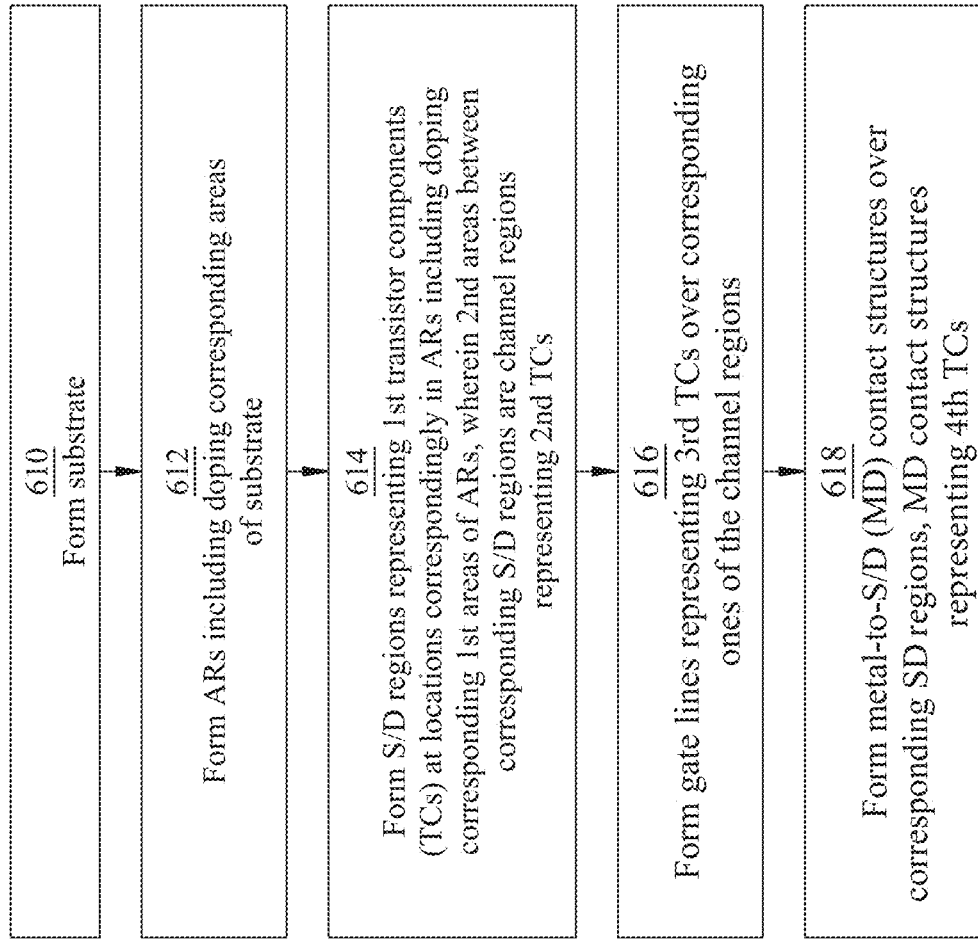
FIG. 6B is a method of fabricating a semiconductor device, in accordance with some embodiments.

FIG. 6B is a method 600B of fabricating a semiconductor device, in accordance with some embodiments.

The method 600B of flowchart is implementable, for example, using IC manufacturing system 800 (FIG. 8, discussed below), in accordance with some embodiments. Examples of a semiconductor device which can be manufactured according to the method 600B of flowchart include the semiconductor device of FIG. 1A or 1B, semiconductor devices which embody the schematic diagrams disclosed herein, semiconductor devices based on the layout diagrams disclosed herein, or the like.

Method 600B includes blocks 610-618. At block 610, a substrate is formed. From block 610, flow proceeds to block 612.

At block 612, active regions (ARs) are formed in the substrate including doping corresponding areas of the substrate. Examples of the active regions include ARs 256P and 256N of FIG. 2C, or the like. From block 612, flow proceeds to block 614.

At block 614, source/drain (S/D) regions representing first transistor components (TCs) are formed in the ARs including doping corresponding first areas of the active regions, wherein second areas of the ARs which are between corresponding S/D regions are channel regions representing 2nd TCs. Examples of S/D regions include S/D regions 224 of FIG. 2C, 225 of FIG. 2D, or the like. Examples of channel regions include channel regions 226 of FIG. 2C, 227 of FIG. 2E, or the like. From block 614, flow proceeds to block 616.

At block 616, gate lines representing third TCs are formed over corresponding ones of the channel regions. Examples of the gate lines include gate line 262(2) of FIG. 2C, 263(2) of FIG. 2E, or the like. From block 616, flow proceeds to block 618.

At block 618, metal-to-S/D (MD) contact structures representing 4th TCs are formed over corresponding S/D regions. Examples of MD contact structures include MD contact structures 264 of FIG. 2C, 265 of FIG. 2D, or the like.

Regarding FIG. 6B, in some embodiments, the forming active regions of block 612, the forming S/D regions and corresponding channel regions of block 614, the forming gate lines of block 616 and the forming MD contact structures of block 618 result in: a first set of the first to fourth transistor-components connected as corresponding transistors that define a primary latch (e.g., 236, 336 or the like); a second set of the first to fourth transistor-components connected as corresponding transistors that define a secondary latch (e.g., 238, 338, or the like); and a third set of the first to fourth transistor-components connected as corresponding transistors that define a clock buffer (e.g., 246, 346, or the like. In such embodiments: the primary latch, the secondary latch and the clock buffer comprise a D flip-flop (DFF) (e.g., 234, 334, or the like); the primary latch includes a first sleepy inverter (e.g., 248(1), 348(2), or the like) and a first non-sleepy (NS) inverter (e.g., 250(1), 350(1), or the like); the secondary latch includes a second sleepy inverter (e.g., 248(2), 348(2), or the like) and a second NS inverter (e.g., 250(2), 350(2), or the like); and the clock buffer includes first NS (248(5), 348(4), or the like) and second (248(6), 348(6), or the like) NS inverters. Also in such embodiments: a first group of some but not all of the transistors has members which are configured with a standard threshold voltage (Vt_std members) and a second group of some but not all of the transistors has members which are configured with a low threshold voltage that is lower than the standard threshold voltage (Vt_low members), e.g., FIGS. 2A, 3A(1), 3B(1), 3C, 3D(1), 3E(1), 3F(1), 3G, 3H(1), 3I(1), 3J, 3K, 3L(1), or the like; and ones of the transistors which comprise at least one of the first NS inverter (e.g., 248(5) or 348(5) of FIGS. 3A(1)-3H(1), 4B-4E, or the like) or the second NS inverter (e.g., 248(6) or 348(6) of FIGS. 3A(1)-3D(1), 3I(1)-3L(1), and 4B-4E, or the like) being Vt_low members of the second group.

Regarding FIG. 6B, in some embodiments, the forming active regions of block 612, the forming S/D regions and corresponding channel regions of block 614, the forming gate lines of block 616 and the forming MD contact structures of block 618 result in: ones of the transistors which comprise the first NS inverter (e.g., 248(5), 348(5), or the like) and the second NS inverter (e.g., 248(6), 348(6), or the like) of the clock buffer (e.g., 246, 346, or the like) being Vt_low members of the second group, e.g., as in FIGS. 2A, 3A(1), 3B(1), 3C, 3D(1), or the like.

Regarding FIG. 6B, in some embodiments, the forming active regions of block 612, the forming S/D regions and corresponding channel regions of block 614, the forming gate lines of block 616 and the forming MD contact structures of block 618 result in: a fourth set of the first to fourth transistor-components connected as corresponding transistors that define an output buffer (e.g., 242, 342, or the like) which is included in the D flip-flop (234, 334, or the like). In such embodiments, ones of the transistors which comprise the output buffer (242, 342, or the like) are Vt_low members of the second group, e.g., as in FIGS. 3E(1), 3F(1), 3G, 3H(2), 3I(1), 3J, 3K, 3L(1), or the like.

Regarding FIG. 6B, in some embodiments, the forming active regions of block 612, the forming S/D regions and corresponding channel regions of block 614, the forming gate lines of block 616 and the forming MD contact structures of block 618 result in: a third group of some but not all of the transistors has members which are configured with a high threshold voltage (Vt_high) that is higher than the standard threshold voltage (Vt_high members). In such embodiments, ones of the transistors which comprise the first sleepy inverter (e.g., 248(1), 348(1), or the like) of the primary latch (e.g., 236, 336, or the like) and the second sleepy inverter (248(2), 348(2), or the like) of the secondary latch (238, 338, or the like) are Vt_high members of the third group, e.g., as in FIGS. 3C, 3D(1), 3G, 3H(1), or the like.

Regarding FIG. 6B, in some embodiments, the forming active regions of block 612, the forming S/D regions and corresponding channel regions of block 614, the forming gate lines of block 616 and the forming MD contact structures of block 618 result in: a fourth set of the first to fourth transistor-components connected as corresponding transistors that define an output buffer (e.g., 242, 342, or the like) which is included in the DFF (e.g., 234, 334, or the like). In such embodiments, ones of the transistors which comprise the output buffer (242, 342, or the like) are Vt_low members of the second group, e.g., as in FIGS. 3E(1), 3F(1), 3G, 3H(1), 3I(1), 3J, 3K, 3L(1), or the like.

Regarding FIG. 6B, in some embodiments, the forming active regions of block 612, the forming S/D regions and corresponding channel regions of block 614, the forming gate lines of block 616 and the forming MD contact structures of block 618 result in: a fourth set of the first to fourth transistor-components connected as corresponding transistors that define a multiplexer (232, 332, or the like). In such embodiments, the D flip-flop (234, 334, or the like) and the multiplexer (232, 332, or the like) comprise a scan-insertion type of DFF (SDFQ); and ones of the transistors which comprise the multiplexer (232, 332, or the like) are Vt_low members of the second group, e.g., as in FIGS. 3B(1), 3D(1), 3F(1), 3H(1), 3J, 3L(1), or the like.

Figure 7:
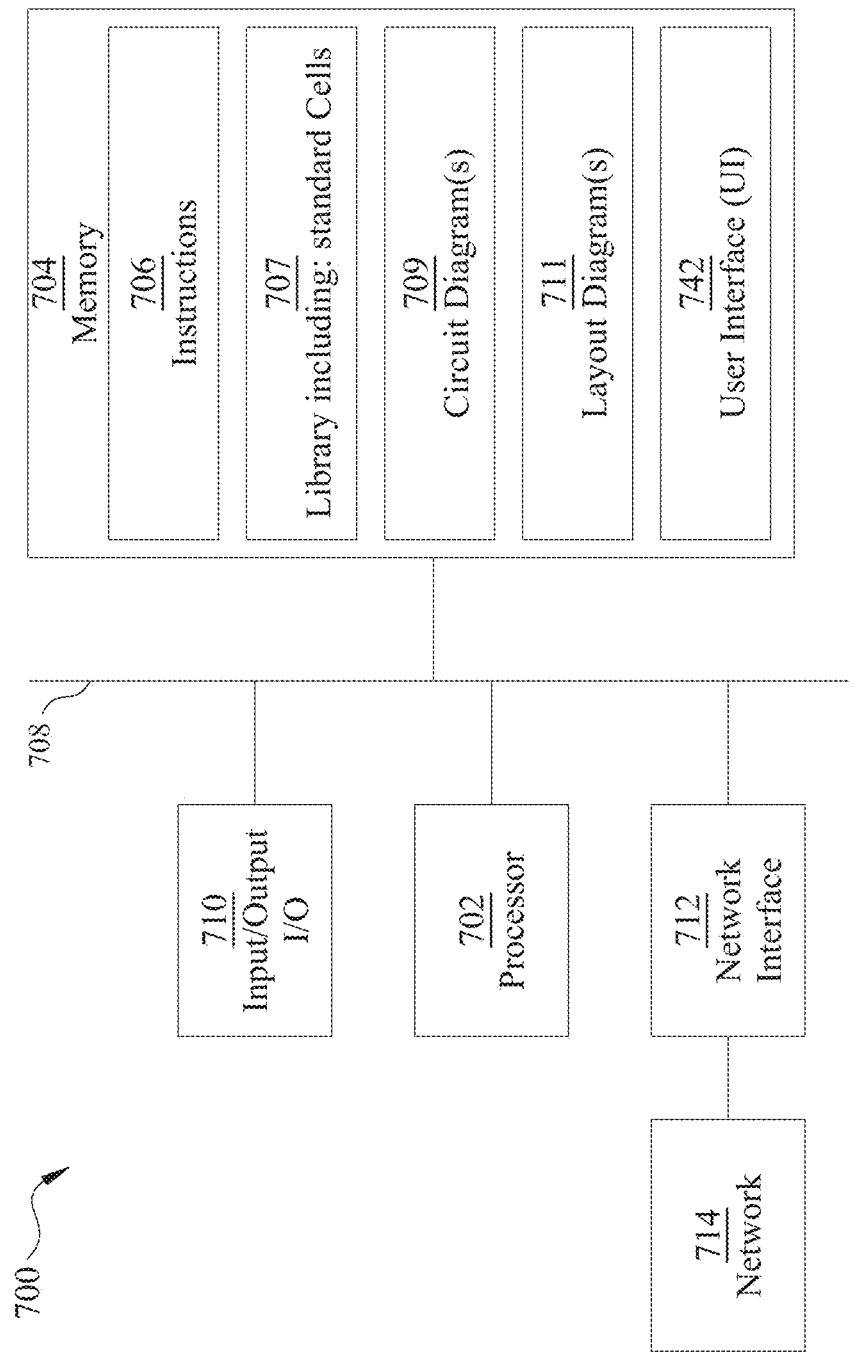
FIG. 7 is a block diagram of an electronic design automation (EDA) system in accordance with some embodiments.

FIG. 7 is a block diagram of an electronic design automation (EDA) system 700 in accordance with some embodiments.

In some embodiments, EDA system 700 includes an APR system. In some embodiments, EDA system 700 is a general purpose computing device including a hardware processor 702 and a non-transitory, computer-readable storage medium 704. Storage medium 704, amongst other things, is encoded with, i.e., stores, computer program code 706, i.e., a set of executable instructions. Execution of instructions of code 706 by hardware processor 702 represents (at least in part) an EDA tool which implements a portion or all of, e.g., the methods of FIGS. 6A, 6B, and 7, in accordance with one or more embodiments (hereinafter, the noted processes and/or methods). Storage medium 704, amongst other things, stores layout diagram of cell region 202 in FIG. 2D-2E, layout diagrams 431D(3) in FIGS. 4B-4F, layout diagrams in FIGS. 5A(2)-5B(2), and other layout diagrams of the like within the scope of the present disclosure.

Processor 702 is electrically coupled to computer-readable storage medium 704 via a bus 708. Processor 702 is further electrically coupled to an I/O interface 710 by bus 708. A network interface 712 is further electrically connected to processor 702 via bus 708. Network interface 712 is connected to a network 714, so that processor 702 and computer-readable storage medium 704 are capable of connecting to external elements via network 714. Processor 702 is configured to execute computer program code 706 encoded in computer-readable storage medium 704 in order to cause system 700 to be usable for performing a portion or all of the noted processes and/or methods. In one or more embodiments, processor 702 is a central processing unit (CPU), a multi-processor, a distributed processing system, an application specific integrated circuit (ASIC), and/or a suitable processing unit.

In one or more embodiments, computer-readable storage medium 704 is an electronic, magnetic, optical, electromagnetic, infrared, and/or a semiconductor system (or apparatus or device). For example, computer-readable storage medium 704 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 704 includes a compact disk-read only memory (CD-ROM), a compact disk-read/write (CD-R/W), and/or a digital video disc (DVD).

In one or more embodiments, storage medium 704 stores computer program code 706 configured to cause system 700 (where such execution represents (at least in part) the EDA tool) to be usable for performing a portion or all of the noted processes and/or methods. In one or more embodiments, storage medium 704 further stores information which facilitates performing a portion or all of the noted processes and/or methods. In one or more embodiments, storage medium 704 stores library 707 of standard cells including such standard cells as disclosed herein or the like, one or more circuit diagrams 709 such as those disclosed herein or the like, and/or one or more layout diagrams 711 such as those disclosed herein or the like.

EDA system 700 includes I/O interface 710. I/O interface 710 is coupled to external circuitry. In one or more embodiments, I/O interface 710 includes a keyboard, keypad, mouse, trackball, trackpad, touchscreen, and/or cursor direction keys for communicating information and commands to processor 702.

EDA system 700 further includes network interface 712 coupled to processor 702. Network interface 712 allows system 700 to communicate with network 714, to which one or more other computer systems are connected. Network interface 712 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 700.

System 700 is configured to receive information through I/O interface 710. The information received through I/O interface 710 includes one or more of instructions, data, design rules, libraries of standard cells, and/or other parameters for processing by processor 702. The information is transferred to processor 702 via bus 708. EDA system 700 is configured to receive information related to a UI through I/O interface 710. The information is stored in computer-readable medium 704 as user interface (UI) 742.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 700. In some embodiments, a layout which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 8:
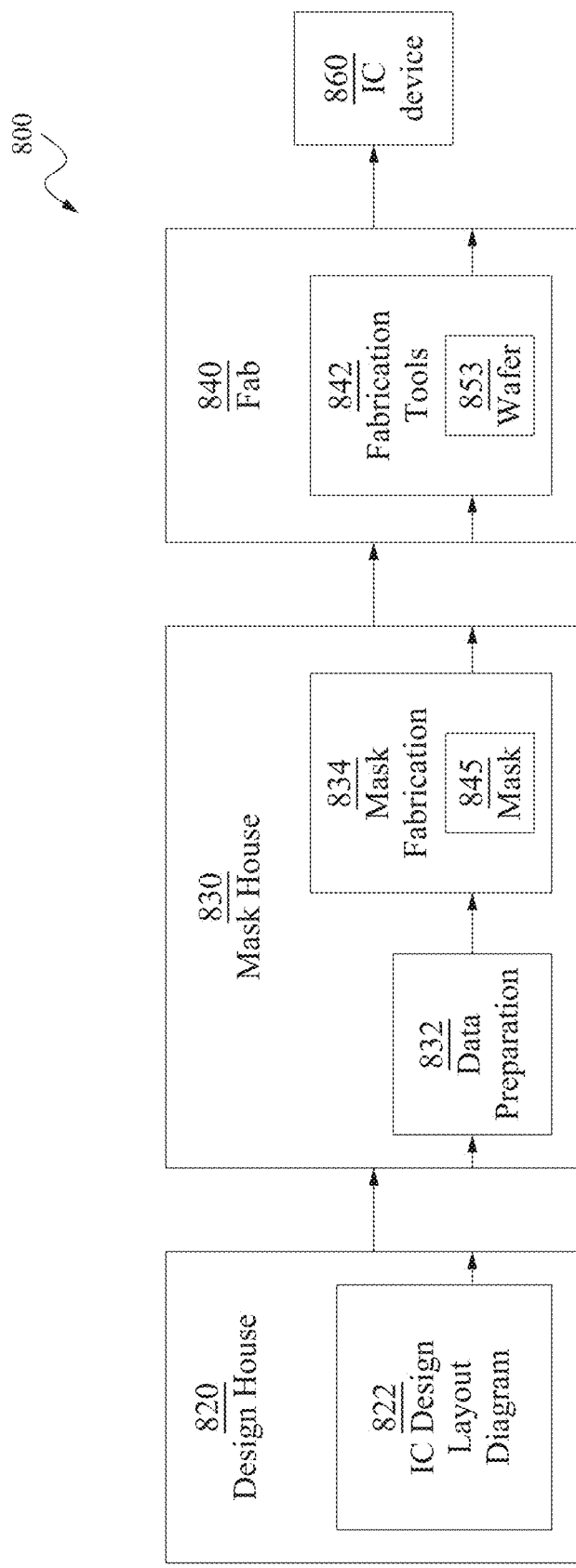
FIG. 8 is a block diagram of an integrated circuit (IC) manufacturing system, and an IC manufacturing flow associated therewith, in accordance with some embodiments.

FIG. 8 is a block diagram of an integrated circuit (IC) manufacturing system 800, and an IC manufacturing flow associated therewith, in accordance with some embodiments.

After block 602 of FIG. 6A, based on the layout, the IC manufacturing system 800 implements block 604 wherein at least one of (A) one or more semiconductor masks or (B) at least one component in a layer of an inchoate semiconductor integrated circuit is fabricated using manufacturing system 800. In some embodiments, blocks 606-614 are implemented by the IC manufacturing system 800 in order to perform block 604.

In FIG. 8, IC manufacturing system 800 includes entities, such as a design house 820, a mask house 830, and an IC manufacturer/fabricator ("fab") 840, that interact with one another in the design, development, and manufacturing cycles and/or services related to manufacturing an IC device 860. The entities in system 800 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and supplies services to and/or receives services from one or more of the other entities. In some embodiments, two or more of design house 820, mask house 830, and IC fab 840 is owned by a single larger company. In some embodiments, two or more of design house 820, mask house 830, and IC fab 840 coexist in a common facility and use common resources.

Design house (or design team) 820 generates an IC design layout 822. IC design layout 822 includes various geometrical patterns designed for an IC device 860. The geometrical patterns correspond to patterns of metal, oxide, or semiconductor layers that make up the various components of IC device 860 to be fabricated. The various layers combine to form various IC features. For example, a portion of IC design layout 822 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 820 implements a proper design procedure to form IC design layout 822. The design procedure includes one or more of logic design, physical design or place and route. IC design layout 822 is presented in one or more data files having information of the geometrical patterns. For example, IC design layout 822 is expressed in a GDSII file format or DFII file format.

Mask house 830 includes data preparation 832 and mask fabrication 834. Mask house 830 uses IC design layout 822 to manufacture one or more masks to be used for fabricating the various layers of IC device 860 according to IC design layout 822. Mask house 830 performs mask data preparation 832, where IC design layout 822 is translated into a representative data file ("RDF"). Mask data preparation 832 supplies the RDF to mask fabrication 834. Mask fabrication 834 includes a mask writer. A mask writer converts the RDF to an image on a substrate, such as a mask (reticle) or a semiconductor wafer. The design layout is manipulated by mask data preparation 832 to comply with particular characteristics of the mask writer and/or requirements of IC fab 840. In FIG. 8, mask data preparation 832, mask fabrication 834, and mask 845 are illustrated as separate elements. In some embodiments, mask data preparation 832 and mask fabrication 834 are collectively referred to as mask data preparation.

In some embodiments, mask data preparation 832 includes optical proximity correction (OPC) which uses lithography enhancement techniques to compensate for image errors, such as those that can arise from diffraction, interference, other process effects and the like. OPC adjusts IC design layout 822. In some embodiments, mask data preparation 832 includes further resolution enhancement techniques (RET), such as off-axis illumination, sub-resolution assist features, phase-shifting masks, other suitable techniques, and the like or combinations thereof. In some embodiments, inverse lithography technology (ILT) is further used, which treats OPC as an inverse imaging problem.

In some embodiments, mask data preparation 832 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during mask fabrication 834, which may undo part of the modifications performed by OPC in order to meet mask creation rules.

In some embodiments, mask data preparation 832 includes lithography process checking (LPC) that simulates processing that will be implemented by IC fab 840 to fabricate IC device 860. LPC simulates this processing based on IC design layout 822 to fabricate a simulated manufactured device, such as IC device 860. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been fabricated by LPC, if the simulated device is not close enough in shape to satisfy design rules, OPC and/or MRC may be repeated to further refine IC design layout 822.

The above description of mask data preparation 832 has been simplified for the purposes of clarity. In some embodiments, data preparation 832 includes additional features such as a logic operation (LOP) to modify the IC design layout according to manufacturing rules. Additionally, the processes applied to IC design layout 822 during data preparation 832 may be executed in a variety of different orders.

After mask data preparation 832 and during mask fabrication 834, a mask 845 or a group of masks are fabricated based on the modified IC design layout. In some embodiments, an electron-beam (e-beam) or a mechanism of multiple e-beams is used to form a pattern on a mask (photomask or reticle) based on the modified IC design layout. The masks are formed in various technologies. In some embodiments, the mask is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask is an attenuated PSM or alternating PSM. The mask(s) generated by mask fabrication 834 is used in a variety of processes. For example, such a mask(s) is used in an ion implantation process to form various doped regions in the semiconductor wafer, in an etching process to form various etching regions in the semiconductor wafer, and/or in other suitable processes.

IC fab 840 is an IC fabrication business that includes one or more manufacturing facilities for the fabrication of a variety of different IC products. In some embodiments, IC fab 840 is a semiconductor foundry. For example, there may be a manufacturing facility for the front end fabrication of a plurality of IC products (front-end-of-line (FEOL) fabrication), while a second manufacturing facility may supply the back end fabrication for the interconnection and packaging of the IC products (back-end-of-line (BEOL) fabrication), and a third manufacturing facility may supply other services for the foundry business.

IC fab 840 uses the mask (or masks) fabricated by mask house 830 to fabricate IC device 860 using fabrication tools 842. Thus, IC fab 840 at least indirectly uses IC design layout 822 to fabricate IC device 860. In some embodiments, a semiconductor wafer 853 is fabricated by IC fab 840 using the mask (or masks) to form IC device 860. Semiconductor wafer 853 includes a silicon substrate or other proper substrate having material layers formed thereon. Semiconductor wafer 853 further includes one or more of various doped regions, dielectric features, multi-level interconnects, and the like (formed at subsequent manufacturing steps).

In some embodiments, a semiconductor device includes: a cell region including active regions that extend in a first direction and have components of transistors formed therein; the transistors of the cell region being arranged to function as a D flip-flop (DFF) that includes a primary latch, a secondary latch and a clock buffer, the primary latch including a first sleepy inverter and a first non-sleepy (NS) inverter; the secondary latch including a second sleepy inverter and a second NS inverter; and the clock buffer including third and fourth NS inverters; a first group of some but not all of the transistors having members which are configured with a standard threshold voltage (Vt_std members); a second group of some but not all of the transistors having members which are configured with a low threshold voltage that is lower than the standard threshold voltage (Vt_low members); and ones of the transistors which comprise at least one of the first NS inverter or the second NS inverter being Vt_low members of the second group.

In some embodiments, ones of the transistors which comprise the third NS inverter and the fourth NS inverter of the clock buffer are Vt_low members of the second group. In some embodiments, the DFF further includes an output buffer, and ones of the transistors which comprise the output buffer are Vt_low members of the second group.

In some embodiments, a third group of some but not all of the transistors has members which are configured with a high threshold voltage that is higher than the standard threshold voltage (Vt_high members); and ones of the transistors which comprise the first sleepy inverter of the primary latch and the second sleepy inverter of the secondary latch are Vt_high members of the third group. In some embodiments, the DFF further includes an output buffer; and ones of the transistors which comprise the output buffer are Vt_low members of the second group. In some embodiments, ones of the transistors which comprise the third NS inverter and the fourth NS inverter of the clock buffer are Vt_low members of the second group. In some embodiments, the transistors of the cell region are further arranged to function as a scan-insertion type of DFF (SDFQ) that includes the DFF and a multiplexer; and ones of the transistors which comprise the multiplexer are Vt_low members of the second group.

In some embodiments, the transistors of the cell region are further arranged to function as a scan-insertion type of DFF (SDFQ) that includes the DFF and a multiplexer, and ones of the transistors which comprise the multiplexer are Vt_low members of the second group. In some embodiments, ones of the transistors which comprise the first NS inverter of the primary latch and the second NS inverter of the secondary latch are Vt_std members of the first group. In some embodiments, the transistors of the cell region being further arranged to function as a scan-insertion type of DFF (SDFQ) that includes the DFF, a multiplexer and a scan buffer, and ones of the transistors which comprise the scan buffer are Vt_std members of the first group.

In some embodiments, a third group of some but not all of the transistors has members which are configured with a high threshold voltage that is higher than the standard threshold voltage (Vt_high members); the DFF further includes an output buffer; the transistors of the cell region are further arranged to function as a scan-insertion type of DFF (SDFQ) that includes the DFF and a multiplexer, at least one of a configuration (A) or a configuration (B) or a configuration (C) is true; for the configuration (A), ones of the transistors which comprise the output buffer are Vt_low members of the second group; for the configuration (B), ones of the transistors which comprise the multiplexer are Vt_low members of the second group; and for the configuration (C), ones of the transistors which comprise the first sleepy inverter of the primary latch and the second sleepy inverter of the secondary latch are Vt_high members of the third group.

In some embodiments, a semiconductor device includes: a cell region including active regions that extend in a first direction and have components of transistors formed therein; the transistors of the cell region being arranged to function as a scan-insertion D flip-flop (SDFQ) that includes a multiplexer and a D flip-flop (DFF), the DFF including a primary latch and a secondary latch; the primary latch including a first sleepy inverter and a first non-sleepy (NS) inverter, the secondary latch including a second sleepy inverter and a second NS inverter; and a first group of some but not all of the transistors having members which are configured with a standard threshold voltage (Vt_std members); a second group of some but not all of the transistors having members which are configured with a low threshold voltage that is lower than the standard threshold voltage (Vt_low members); and ones of the transistors which comprise the multiplexer are Vt_low members of the second group.

In some embodiments, a third group of some but not all of the transistors has members which are configured with a high threshold voltage that is higher than the standard threshold voltage (Vt_high members); and ones of the transistors which comprise the first sleepy inverter of the primary latch and the second sleepy inverter of the secondary latch are Vt_high members of the third group. In some embodiments, the DFF further includes an output buffer; and ones of the transistors which comprise the output buffer are Vt_low members of the second group. In some embodiments, the transistors of the cell region are further arranged to function as a scan-insertion type of DFF (SDFQ) that includes the DFF and a multiplexer, and ones of the transistors which comprise the multiplexer are Vt_low members of the second group. In some embodiments, the DFF further includes a clock buffer, the clock buffer including third and fourth NS inverters; and ones of the transistors which comprise at least one of the first NS inverter or the second NS inverter being Vt_low members of the second group.

In some embodiments, a method (of forming semiconductor device) includes: forming active regions including doping areas of a substrate; forming source/drain (S/D) regions including doping first areas of the active regions, the S/D regions representing first transistor-components, wherein second areas of the active regions which are between corresponding S/D regions are channel regions representing second transistor-components; forming gate lines over corresponding ones of the channel regions, the gate lines representing third transistor-components; and forming metal-to-S/D (MD) contact structures over corresponding ones of the S/D regions, the MD contact structures representing fourth transistor-components. The forming active regions, the forming S/D regions, the forming MD contact structures and the forming gate lines result in the following: a first set of the first to fourth transistor-components connected as corresponding transistors that define a primary latch; a second set of the first to fourth transistor-components connected as corresponding transistors that define a secondary latch; and a third set of the first to fourth transistor-components connected as corresponding transistors that define a clock buffer, the primary latch, the secondary latch and the clock buffer comprise a D flip-flop (DFF); the primary latch including a first sleepy inverter and a first non-sleepy (NS) inverter, the secondary latch including a second sleepy inverter and a second NS inverter; and the clock buffer including third and fourth NS inverters; a first group of some but not all of the transistors having members which are configured with a standard threshold voltage (Vt_std members); a second group of some but not all of the transistors having members which are configured with a low threshold voltage that is lower than the standard threshold voltage (Vt_low members); and ones of the transistors which comprise at least one of the first NS inverter or the second NS inverter being Vt_low members of the second group.

In some embodiments, the forming active regions, the forming S/D regions, the forming gate lines and the forming MD contact structures further result in: ones of the transistors which comprise the third NS inverter and the fourth NS inverter of the clock buffer being Vt_low members of the second group. In some embodiments, the forming active regions, the forming S/D regions, the forming gate lines and the forming MD contact structures further result in: a fourth set of the first to fourth transistor-components connected as corresponding transistors that define an output buffer which is included in the DFF; and ones of the transistors which comprise the output buffer are Vt_low members of the second group.

In some embodiments, the forming active regions, the forming S/D regions, the forming gate lines and the forming MD contact structures further result in: a third group of some but not all of the transistors has members which are configured with a high threshold voltage that is higher than the standard threshold voltage (Vt_high members); and ones of the transistors which comprise the first sleepy inverter of the primary latch and the second sleepy inverter of the secondary latch are Vt_high members of the third group. In some embodiments, the forming active regions, the forming S/D regions, the forming gate lines and the forming MD contact structures further result in: a fourth set of the first to fourth transistor-components connected as corresponding transistors that define an output buffer which is included in the DFF; and ones of the transistors which comprise the output buffer are Vt_low members of the second group. In some embodiments, ones of the transistors which comprise the third NS inverter and the fourth NS inverter of the clock buffer are Vt_low members of the second group. In some embodiments, the forming active regions, the forming S/D regions, the forming gate lines and the forming MD contact structures further result in: a fourth set of the first to fourth transistor-components connected as corresponding transistors that define a multiplexer; the DFF and the multiplexer comprise a scan-insertion type of DFF (SDFQ); and ones of the transistors which comprise the multiplexer are Vt_low members of the second group.

In some embodiments, the forming active regions, the forming S/D regions, the forming gate lines and the forming MD contact structures further result in: a fourth set of the first to fourth transistor-components connected as corresponding transistors that define a multiplexer; the DFF and the multiplexer comprise a scan-insertion type of DFF (SDFQ); and ones of the transistors which comprise the multiplexer are Vt_low members of the second group. In some embodiments, ones of the transistors which comprise the first NS inverter of the primary latch and the second NS inverter of the secondary latch are Vt_std members of the first group.

In some embodiments, a semiconductor device includes: a cell region including active regions that extend in a first direction and have components of transistors formed therein; the transistors of the cell region being arranged to function as a D flip-flop (DFF) that includes a primary latch, a secondary latch, a clock buffer and an output buffer; the primary latch including a first sleepy inverter and a first non-sleepy (NS) inverter; the secondary latch including a second sleepy inverter and a second NS inverter, the clock buffer including third and fourth NS inverters; and the output buffer including a fifth NS inverter; a first group of some but not all of the transistors having members which are configured with a standard threshold voltage (Vt_std members); a second group of some but not all of the transistors having members which are configured with a low threshold voltage that is lower than the standard threshold voltage (Vt_low members); and ones of the transistors which comprise at least two of the first NS inverter or the second NS inverter or the output buffer being Vt_low members of the second group.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A semiconductor device comprising:
a cell region including active regions that extend in a first direction and have components of transistors formed therein;
the transistors of the cell region being arranged to function as a D flip-flop (DFF) that includes a primary latch, a secondary latch and a clock buffer;
the primary latch including a first sleepy inverter and a first non-sleepy (NS) inverter;
the secondary latch including a second sleepy inverter and a second NS inverter; and
the clock buffer including third and fourth NS inverters;
a first group of some but not all of the transistors having members which are configured with a standard threshold voltage (Vt_std members);
a second group of some but not all of the transistors having members which are configured with a low threshold voltage that is lower than the standard threshold voltage (Vt_low members);
ones of the transistors which comprise at least one of the third NS inverter or the fourth NS inverter being Vt_low members of the second group; and
ones of the transistors which comprise the first sleepy inverter having a threshold voltage that is different than a threshold voltage of ones of the transistors that which comprise the first NS inverter or ones of the transistors which comprise the second sleepy inverter having a threshold voltage that is different than a threshold voltage of ones of the transistors that which comprise the second NS inverter.

2. The semiconductor device of claim 1, wherein:
ones of the transistors which comprise the third NS inverter and the fourth NS inverter of the clock buffer are Vt_low members of the second group.

3. The semiconductor device of claim 1, wherein:
the DFF further includes an output buffer; and
ones of the transistors which comprise the output buffer are Vt_low members of the second group.

4. The semiconductor device of claim 1, wherein:
a third group of some but not all of the transistors has members which are configured with a high threshold voltage that is higher than the standard threshold voltage (Vt_high members); and
ones of the transistors which comprise the first sleepy inverter of the primary latch and the second sleepy inverter of the secondary latch are Vt_high members of the third group.

5. The semiconductor device of claim 4, wherein:
the DFF further includes an output buffer; and
ones of the transistors which comprise the output buffer are Vt_low members of the second group.

6. The semiconductor device of claim 1, wherein:
the transistors of the cell region are further arranged to function as a scan-insertion type of DFF (SDFQ) that includes the DFF and a multiplexer; and
ones of the transistors which comprise the multiplexer are Vt_low members of the second group.

7. The semiconductor device of claim 1, wherein:
ones of the transistors which comprise the first NS inverter of the primary latch and the second NS inverter of the secondary latch are Vt_std members of the first group.

8. The semiconductor device of claim 1, wherein:
the transistors of the cell region being further arranged to function as a scan-insertion type of DFF (SDFQ) that includes the DFF, a multiplexer and a scan buffer; and
ones of the transistors which comprise the scan buffer are Vt_std members of the first group.

9. The semiconductor device of claim 1, wherein:
a third group of some but not all of the transistors has members which are configured with a high threshold voltage that is higher than the standard threshold voltage (Vt_high members);
the DFF further includes an output buffer;
the transistors of the cell region are further arranged to function as a scan-insertion type of DFF (SDFQ) that includes the DFF and a multiplexer;
at least one of a configuration (A) or a configuration (B) or a configuration (C) is true;
for the configuration (A), ones of the transistors which comprise the output buffer are Vt_low members of the second group;
for the configuration (B), ones of the transistors which comprise the multiplexer are Vt_low members of the second group; and
for the configuration (C), ones of the transistors which comprise the first sleepy inverter of the primary latch and the second sleepy inverter of the secondary latch are Vt_high members of the third group.

10. A semiconductor device comprising:
a cell region including active regions that extend in a first direction and have components of transistors formed therein;
the transistors of the cell region being arranged to function as a scan-insertion D flip-flop (SDFQ) that includes a multiplexer and a D flip-flop (DFF), the DFF including a clock buffer, a primary latch and a secondary latch;
the primary latch including a first sleepy inverter and a first non-sleepy (NS) inverter;
the secondary latch including a second sleepy inverter and a second NS inverter; and
the clock buffer including third and fourth NS inverters; and
a first group of some but not all of the transistors having members which are configured with a standard threshold voltage (Vt_std members);
a second group of some but not all of the transistors having members which are configured with a low threshold voltage that is lower than the standard threshold voltage (Vt_low members);
ones of the transistors which comprise at least one of the third NS inverter or the fourth NS inverter being Vt_low members of the second group;
ones of the transistors which comprise the first sleepy inverter having a threshold voltage that is different than a threshold voltage of ones of the transistors that which comprise the first NS inverter or ones of the transistors which comprise the second sleepy inverter having a threshold voltage that is different than a threshold voltage of ones of the transistors that which comprise the second NS inverter; and
ones of the transistors which comprise the multiplexer are Vt_std members of the first group or Vt_low members of the second group.

11. The semiconductor device of claim 10, wherein:
a third group of some but not all of the transistors has members which are configured with a high threshold voltage that is higher than the standard threshold voltage (Vt_high members); and
ones of the transistors which comprise the first sleepy inverter of the primary latch and the second sleepy inverter of the secondary latch are Vt_high members of the third group.

12. The semiconductor device of claim 11, wherein:
the DFF further includes an output buffer; and
ones of the transistors which comprise the output buffer are Vt_low members of the second group.

13. The semiconductor device of claim 11, wherein:
the transistors of the cell region are further arranged to function as a scan-insertion type of DFF (SDFQ) that includes the DFF and a multiplexer; and
ones of the transistors which comprise the multiplexer are Vt_low members of the second group.

14. The semiconductor device of claim 10, wherein:
ones of the transistors which comprise at least one of the first NS inverter or the second NS inverter being Vt_low members of the second group.

15. The semiconductor device of claim 1, wherein:
the Vt_low members of the second group are in a first region,
the Vt_std members of the first group are in a second region,
a first type of gate is over channel regions in the first region,
a second type of gate is over channel regions in the second region, and
the first and second types of gates have different first and second work functions.

16. A semiconductor device comprising:
a cell region including active regions that extend in a first direction and have transistors arranged to function as a primary latch that includes a first sleepy inverter and a first non-sleepy (NS) inverter, a secondary latch that includes a second sleepy inverter and a second NS inverter, and a clock buffer that includes third and fourth NS inverters;
the primary latch, the secondary latch, and the clock buffer together functioning as a D flip- flop (DFF);
transistors in at least one of the third NS inverter or the fourth NS inverter are Vt_low transistors having a threshold voltage that is lower than a standard threshold voltage;
at least some transistors of at least one of the primary latch, the secondary latch, or the clock buffer are Vt_std transistors having the standard threshold voltage; and
ones of the transistors which comprise the first sleepy inverter of the primary latch and the second sleepy inverter of the secondary latch are Vt_high transistors having a threshold voltage that is higher than the standard voltage.

17. The semiconductor device of claim 16, further comprising:
an output buffer coupled to the secondary latch and including metal-to-S/D contact structures.

18. The semiconductor device of claim 17, wherein:
the metal-to-S/D contact structures are over corresponding S/D regions.

19. The semiconductor device of claim 16, wherein:
the Vt_low transistors are in a first region having a first dopant concentration, and
the Vt_std transistors are in a second region having a second dopant concentration different from the first dopant concentration.

20. The semiconductor device of claim 16, wherein:
the Vt_low transistors are in a first region,
the Vt_std transistors are in a second region,
a first type of gate is over channel regions in the first region,
a second type of gate is over channel regions in the second region, and
the first and second types of gates have different first and second work functions.

* * * * *